(12) United States Patent
Tang et al.

(10) Patent No.: US 9,601,439 B1
(45) Date of Patent: Mar. 21, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Tzu-Chun Tang, Kaohsiung (TW); Shou Zen Chang, Taipei County (TW); Wei-Ting Chen, Tainan (TW); In-Tsang Lin, Kaohsiung (TW); Vincent Chen, Taipei (TW); Chuei-Tang Wang, Taichung (TW); Kai-Chiang Wu, Hsinchu (TW); Chun-Lin Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/840,808

(22) Filed: Aug. 31, 2015

(51) Int. Cl.
| | | |
|---|---|---|
| H01L 23/552 | (2006.01) | |
| H01L 23/498 | (2006.01) | |
| H01L 23/31 | (2006.01) | |
| H01L 23/58 | (2006.01) | |
| H01L 23/66 | (2006.01) | |
| H01L 21/48 | (2006.01) | |
| H01L 21/56 | (2006.01) | |

(52) U.S. Cl.
CPC ........ *H01L 23/552* (2013.01); *H01L 21/4853* (2013.01); *H01L 21/565* (2013.01); *H01L 23/3114* (2013.01); *H01L 23/49811* (2013.01); *H01L 23/585* (2013.01); *H01L 23/66* (2013.01)

(58) Field of Classification Search
None
See application file for complete search history.

(56) References Cited

U.S. PATENT DOCUMENTS

| | | | | |
|---|---|---|---|---|
| 5,717,245 A | * | 2/1998 | Pedder | H01L 23/49816 257/664 |
| 7,977,783 B1 | * | 7/2011 | Park | H01L 24/11 257/692 |
| 2010/0187671 A1 | * | 7/2010 | Lin | H01L 21/76898 257/686 |
| 2016/0090294 A1 | * | 3/2016 | Wachter | B81B 7/007 257/416 |

* cited by examiner

*Primary Examiner* — Calvin Choi
(74) *Attorney, Agent, or Firm* — WPAT, P.C., Intellectual Property Attorneys; Anthony King

(57) ABSTRACT

A semiconductor structure includes a substrate, a die disposed over the substrate, and including a die pad disposed over the die and a seal ring disposed at a periphery of the die and electrically connected with the die pad, a polymeric layer disposed over the die, a via extending through the polymeric layer and electrically connected with the die pad, and a molding disposed over the substrate and surrounding the die and the polymeric layer, wherein the seal ring is configured for grounding.

20 Claims, 53 Drawing Sheets

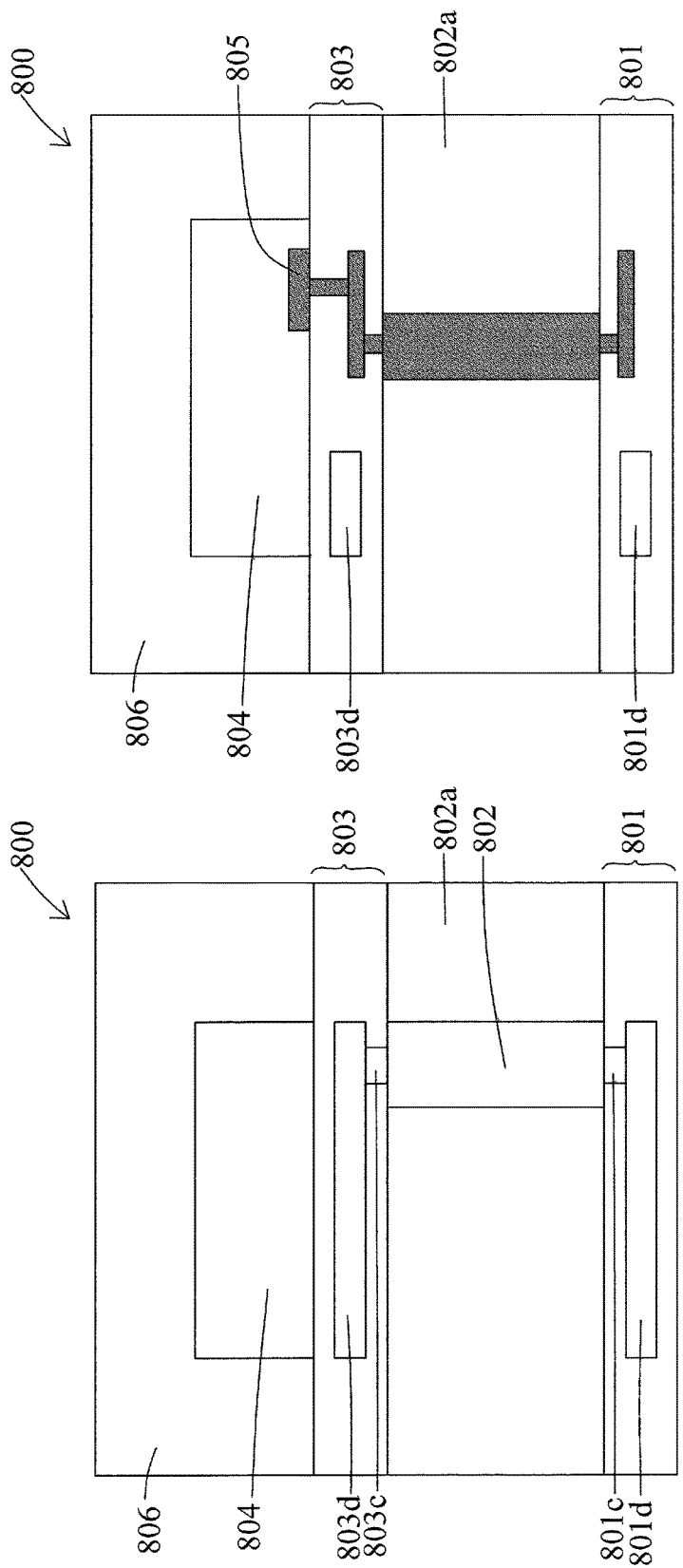

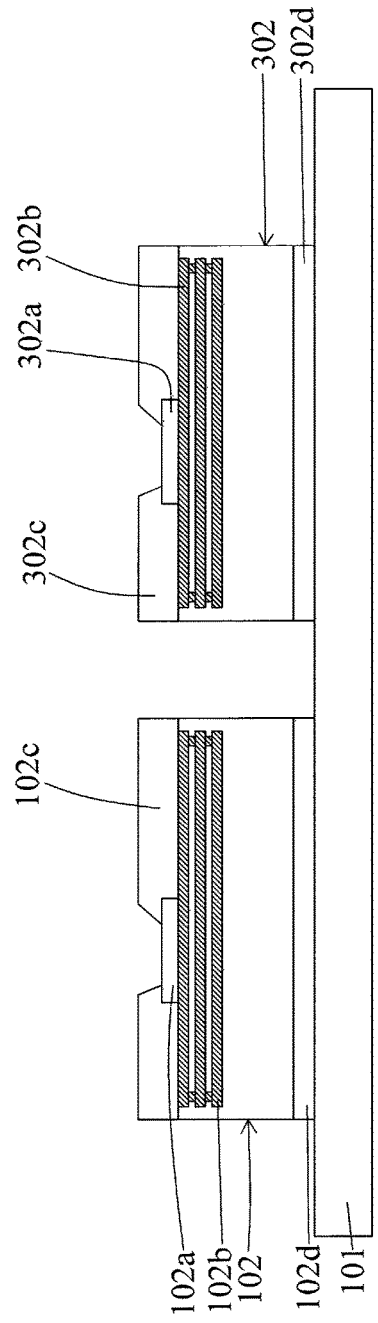
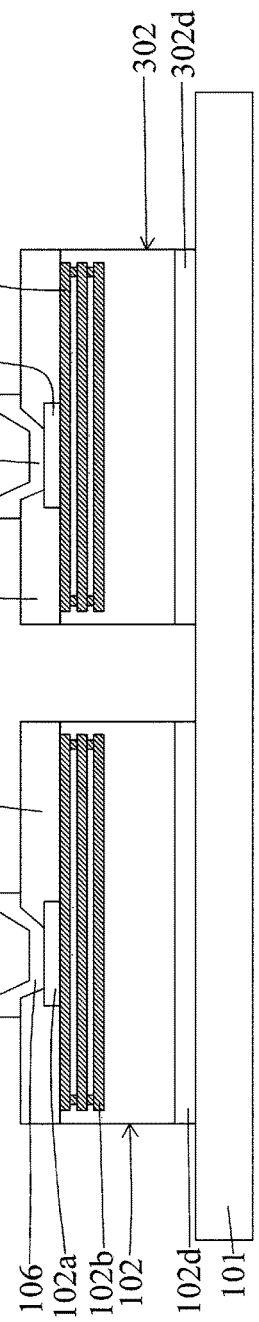
FIG. 30A
FIG. 30B
FIG. 30C

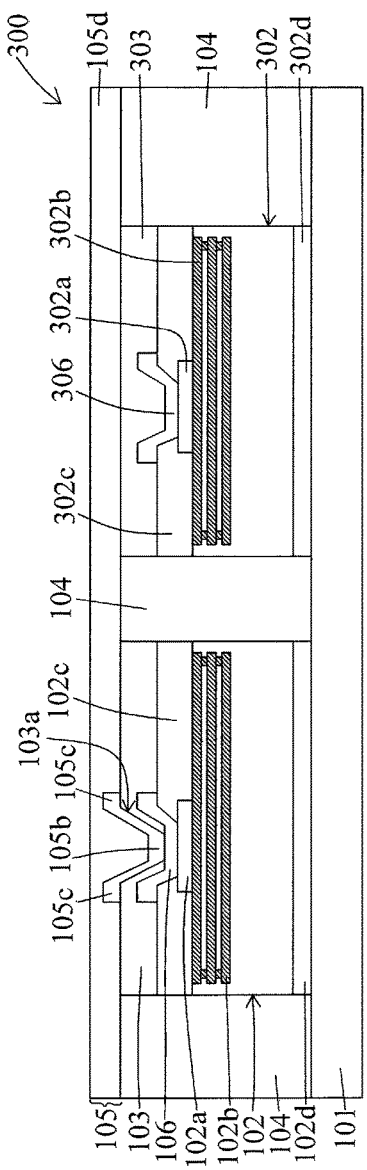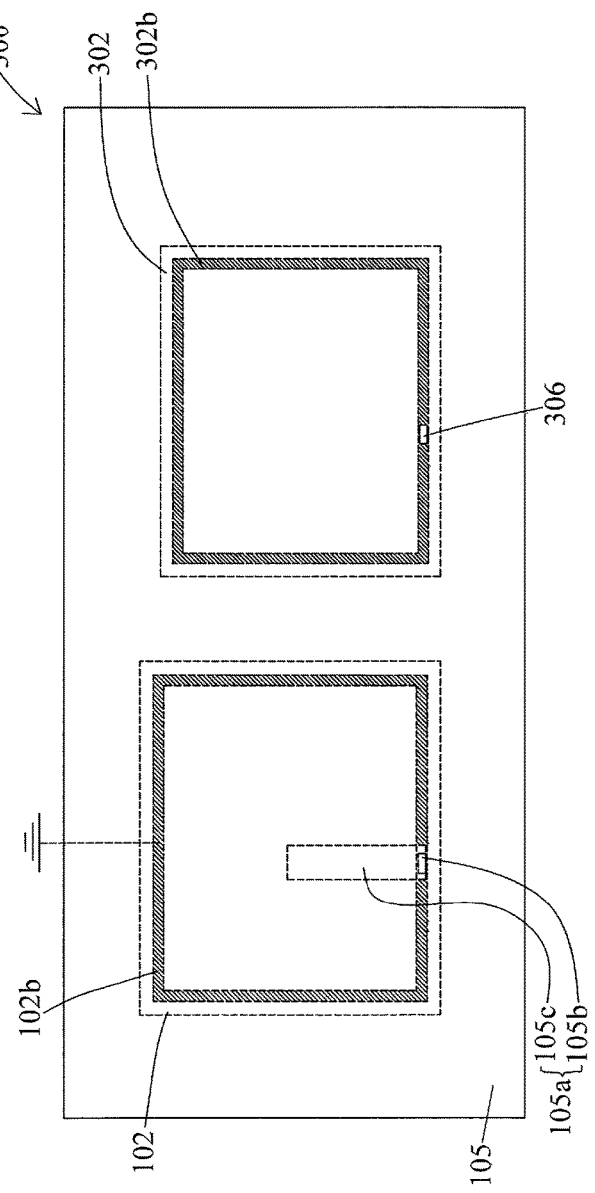
FIG. 30F
FIG. 30G

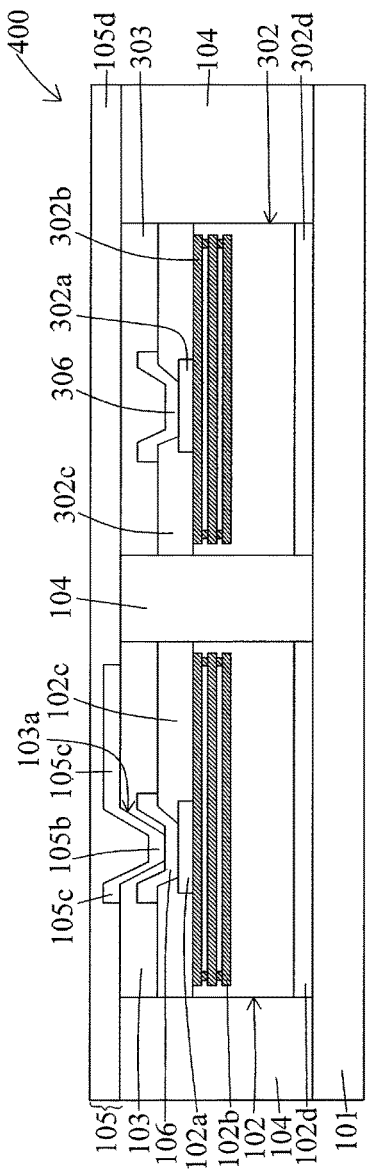
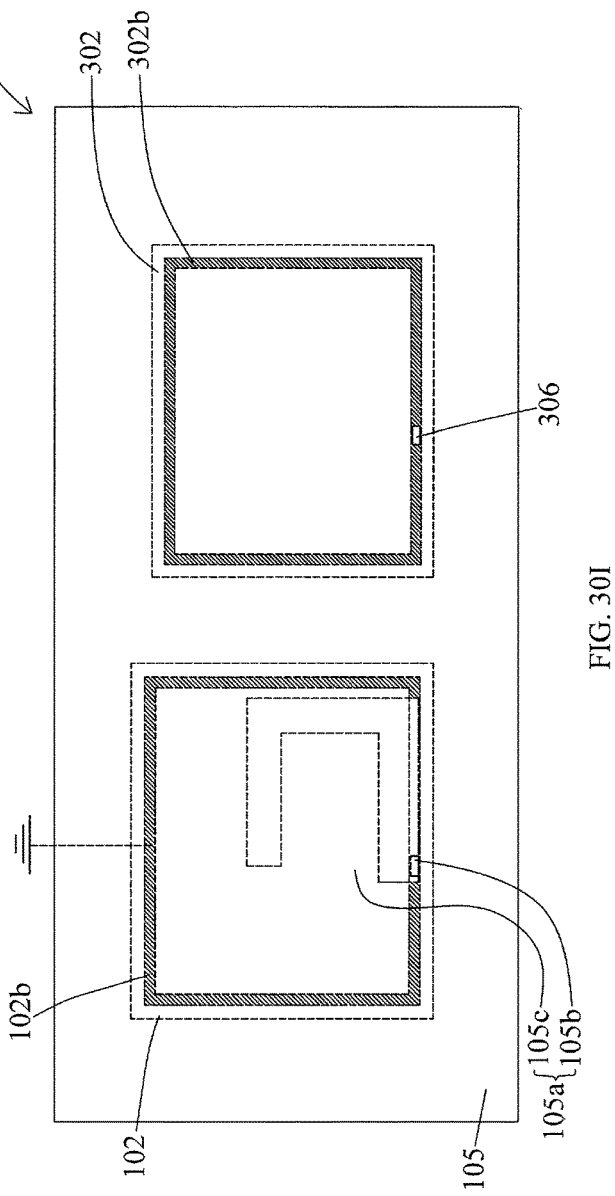
FIG. 30H
FIG. 30I

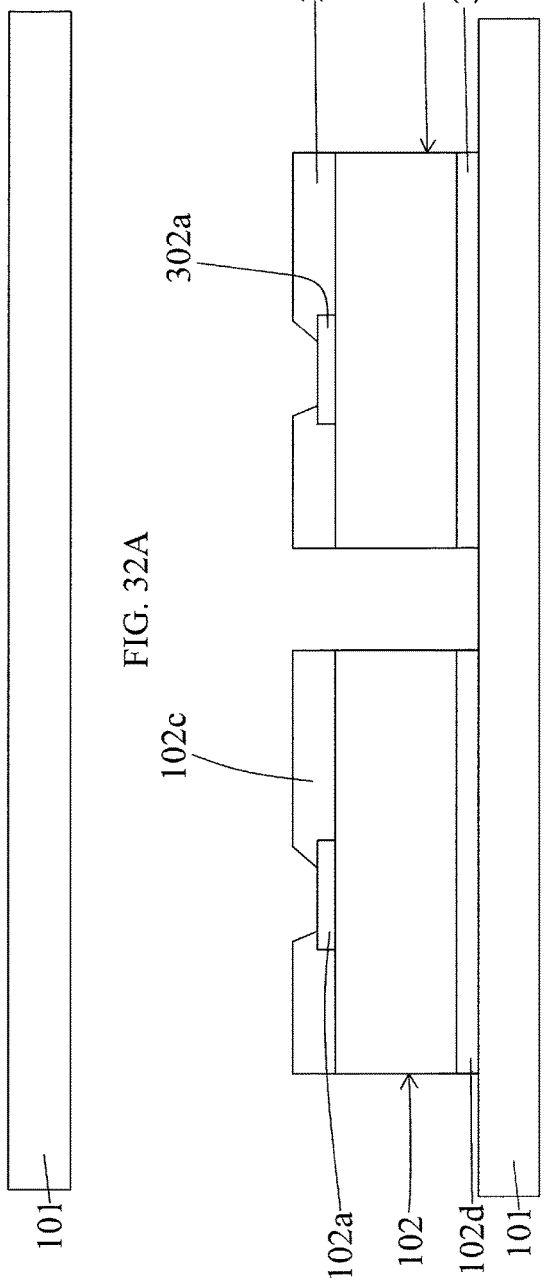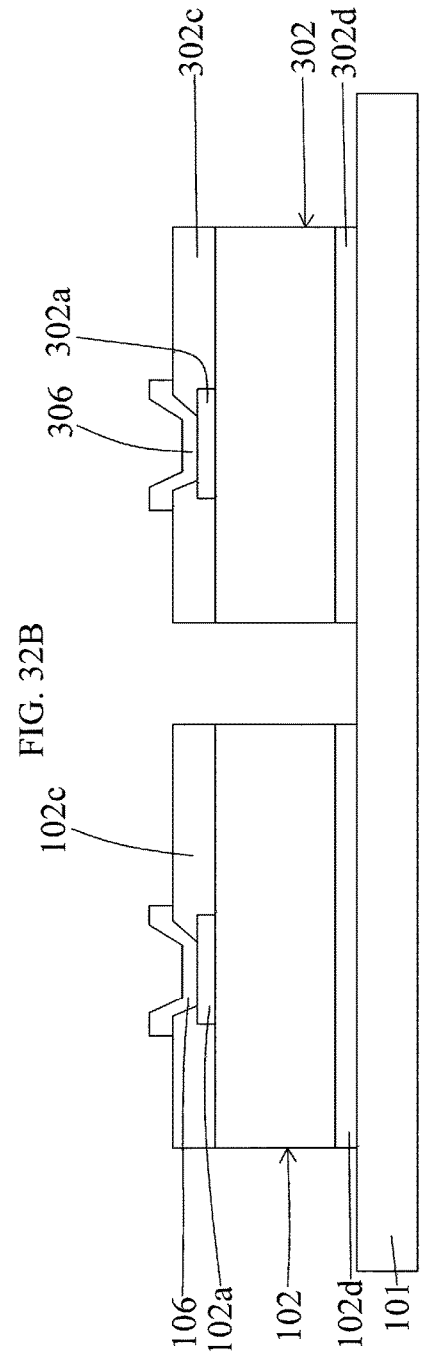

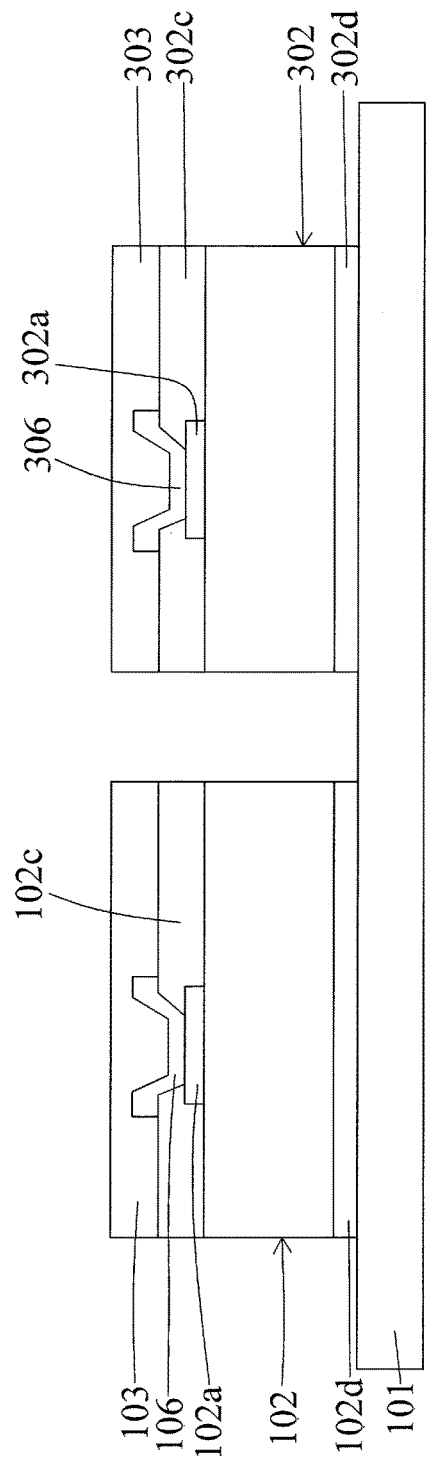
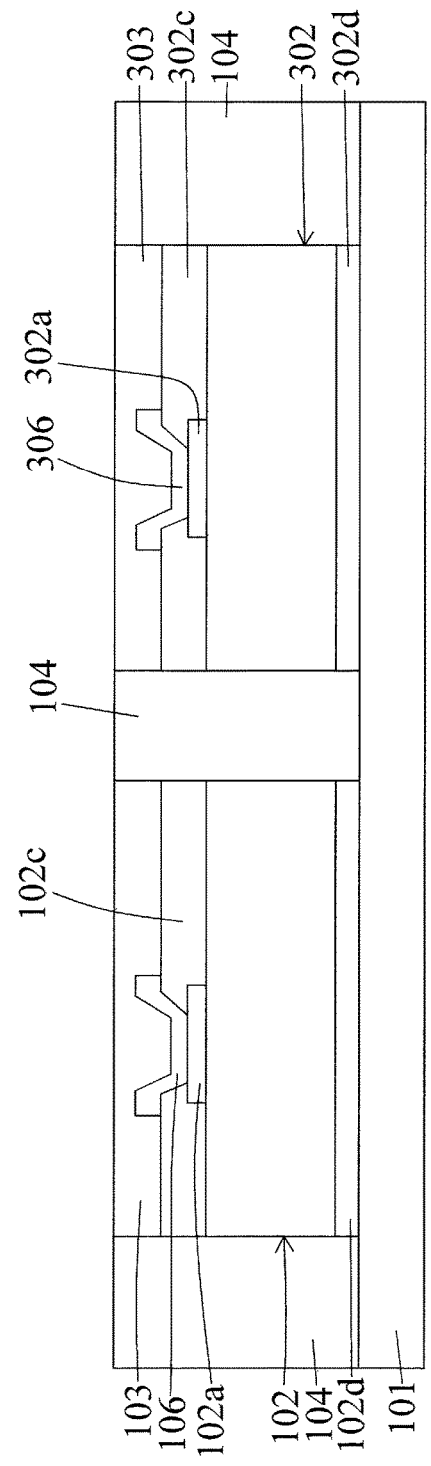
FIG. 32D
FIG. 32E

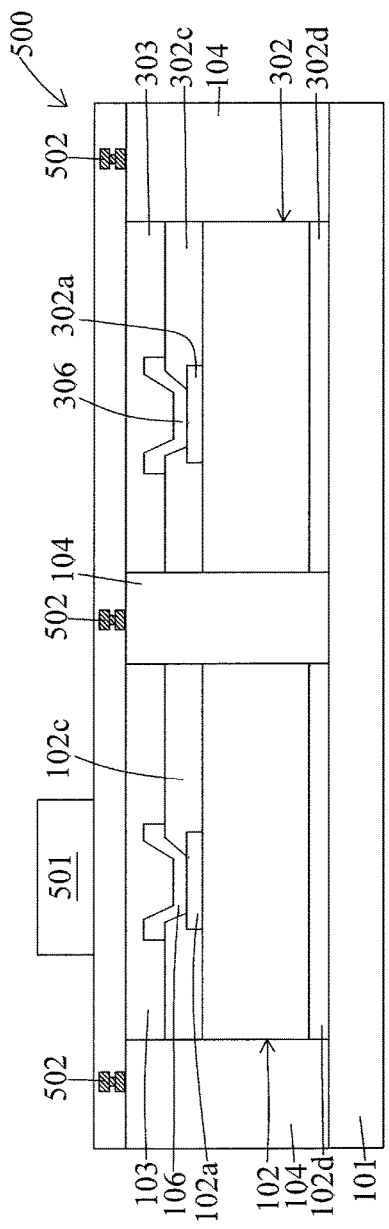
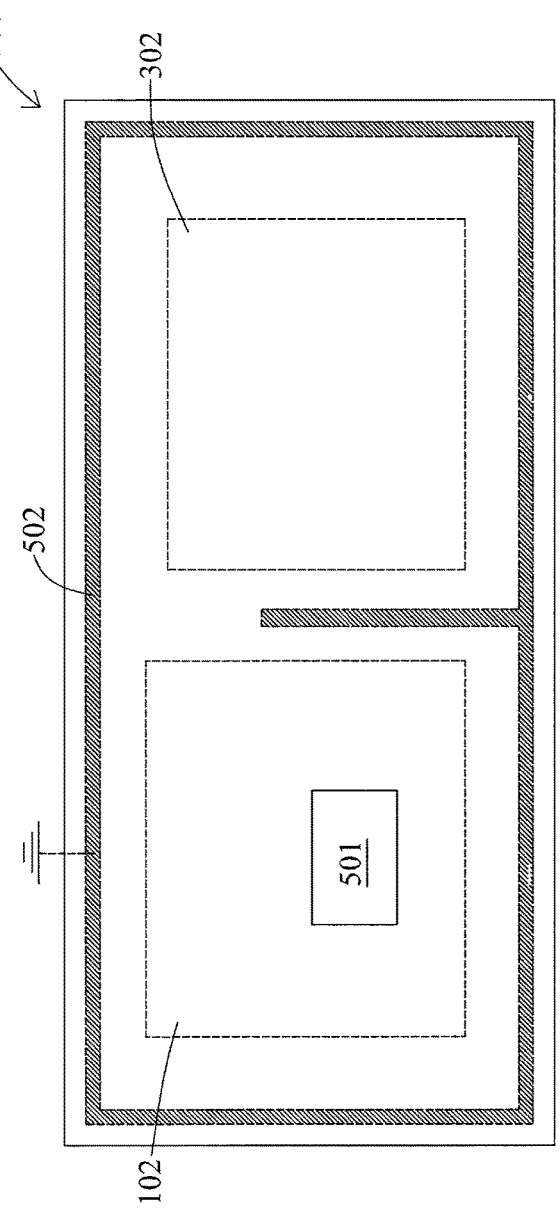
FIG. 32F
FIG. 32G

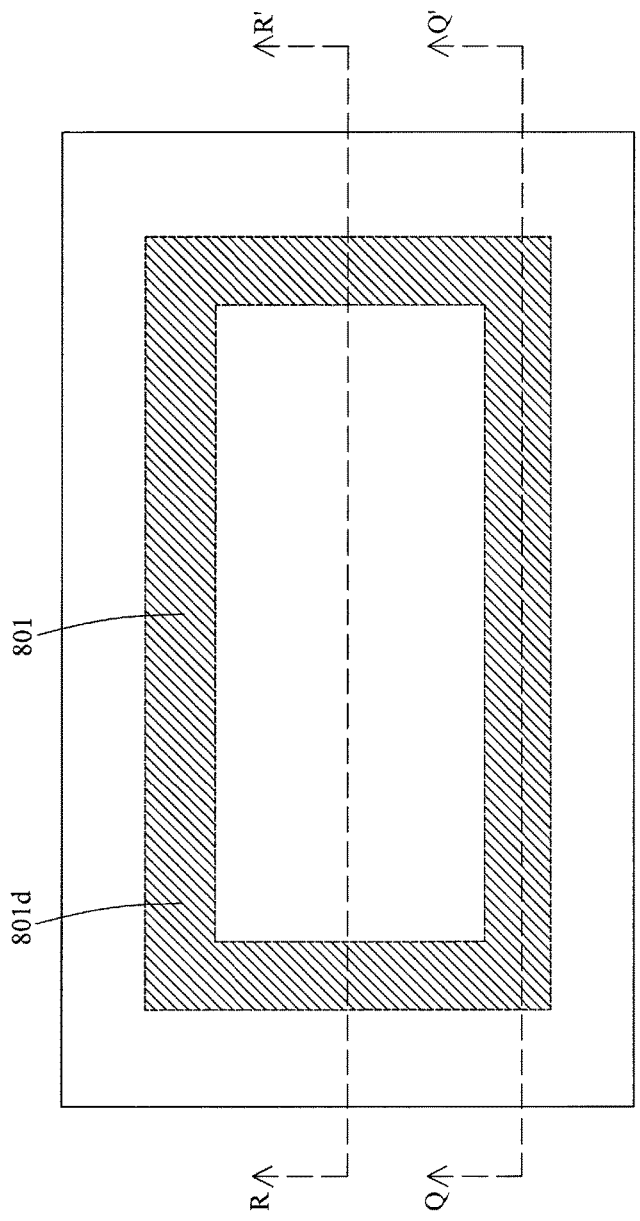
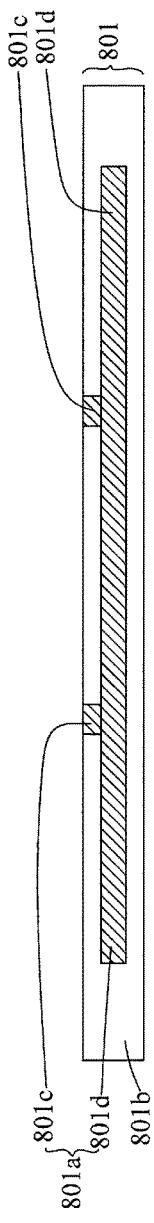
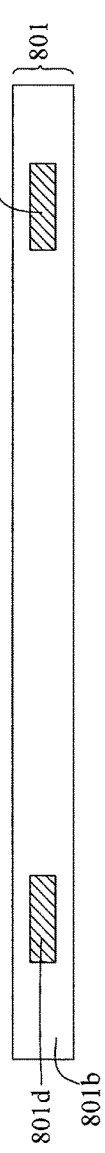
FIG. 38A
FIG. 38B
FIG. 38C

SEMICONDUCTOR STRUCTURE AND MANUFACTURING METHOD THEREOF

BACKGROUND

Electronic equipments using semiconductor devices are essential for many modern applications. The semiconductor devices are applied for a variety of high-density electronics applications. With the advancement of electronic technology, the electronic equipment is getting more complicated with greater functionality and greater amounts of integrated circuitry, while are becoming increasingly smaller in size. Due to the miniaturized scale of the electronic equipment, various types and dimensions of semiconductor devices performing different functionalities are integrated and packaged into a single module. Furthermore, numerous manufacturing operations are implemented for integration of various types of semiconductor devices.

However, the manufacturing and integration of the semiconductor devices involve many complicated steps and operations. The integration of the semiconductor devices in such low profile and high density becomes more complicated. An increase in a complexity of manufacturing and integration of the semiconductor devices may cause deficiencies such as contamination, poor electrical interconnection, noise coupling, delamination of the components or high yield loss.

The semiconductor devices are integrated and produced in an undesired configuration, which would further exacerbate materials wastage and thus increase the manufacturing cost. Since more different components with different materials are involved, complexity of the manufacturing and integration operations of the semiconductor devices is increased. There are more challenges to modify a structure of the semiconductor device and improve the manufacturing operations. As such, there is a continuous need to improve the manufacturing the semiconductor devices and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 23 is a schematic cross sectional view of a semiconductor structure along OO' of FIG. 22 in accordance with some embodiments of the present disclosure.

FIG. 24 is a schematic cross sectional view of a semiconductor structure along PP' of FIG. 22 in accordance with some embodiments of the present disclosure.

FIGS. 30A-30I are schematic views of manufacturing a semiconductor structure by a method of FIG. 29 in accordance with some embodiments of the present disclosure.

FIGS. 32A-32G are schematic views of manufacturing a semiconductor structure by a method of FIG. 31 in accordance with some embodiments of the present disclosure.

DETAILED DESCRIPTION OF THE DISCLOSURE

Figure 1:
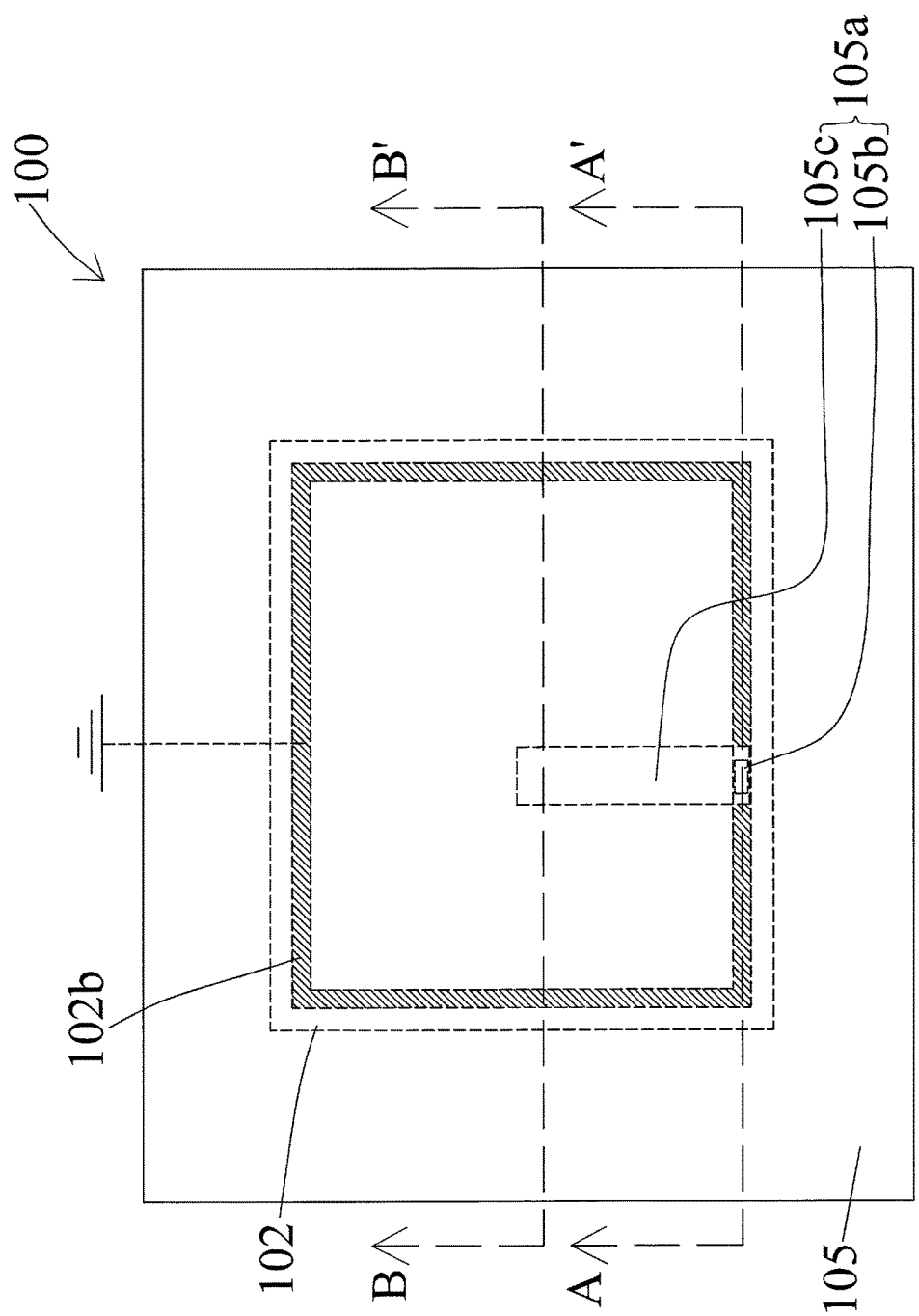
FIG. 1 is a schematic top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An electronic equipment including various semiconductor devices is manufactured by a number of operations. During the manufacturing, the semiconductor devices with different functionalities and dimensions are integrated into a single system. Circuitries of the semiconductor devices are integrated and connected through conductive traces and a substrate. After integration of the semiconductor devices, the semiconductor devices are encapsulated by a mold in order to protect the semiconductor devices from damages of the circuitries and environmental contamination. Also, a through silicon vias (TSV) is formed along a periphery of the semiconductor device to isolate the semiconductor devices from each other. However, the formation of the TSV would occupy large area and thus reduce space for electrical routing and lower a design freedom. The isolation by the TSV is unsatisfactory.

Further, the semiconductor device may include a source emitting a radio wave in a radio frequency (RF). Such source requires isolation from external electromagnetic interference to prevent noise coupling. For example, the source has to be isolated from another source in order to prevent interference of the radio waves from the sources and noise affecting each other. Also, a leakage of radio wave out of the semiconductor device shall be prevented. The TSV is provided around the source for absorbing the radio wave and reducing interference of the radio waves between the source and another source. However, absorption of the radio wave in a particular frequency by the TSV could not be performed. Lack of selectivity of the frequency being absorbed would limit functionality and application of the semiconductor device.

In the present disclosure, an improved semiconductor structure is disclosed. The semiconductor structure includes a die at least partially enclosed by a seal ring or a redistribution layer (RDL). The seal ring or the RDL is configured for grounding or is connectable to ground in order to isolate the die from other components. Since the seal ring and the RDL occupy less space and thus more space can be used for electrical routing. The grounding of the seal ring or the RDL could reduce or prevent noise coupling. Further, the semiconductor structure includes a source emitting an electromagnetic radiation such as radio wave in a radio frequency (RF), and a RDL configured to absorb the electromagnetic radiation from the source. The RDL can be configured to selectively absorb the electromagnetic radiation in a predetermined radio frequency. The RDL could isolate the source from other components and reduce electromagnetic interference between the electromagnetic radiation from the source and electromagnetic radiation from other components, such that noise can be minimized or prevented. An overall performance and reliability of the semiconductor structure could be improved.

Figure 2:
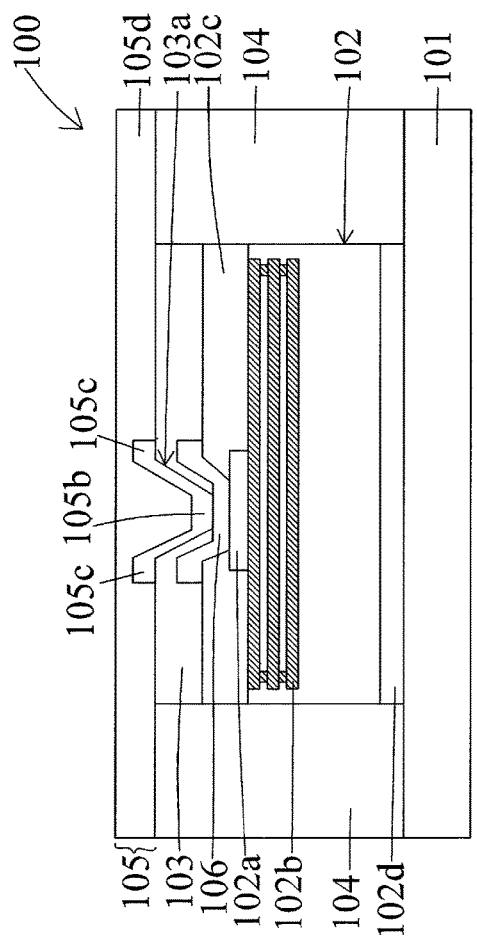
FIG. 2 is a schematic cross sectional view of a semiconductor structure along AA' of FIG. 1 in accordance with some embodiments of the present disclosure.
Figure 3:
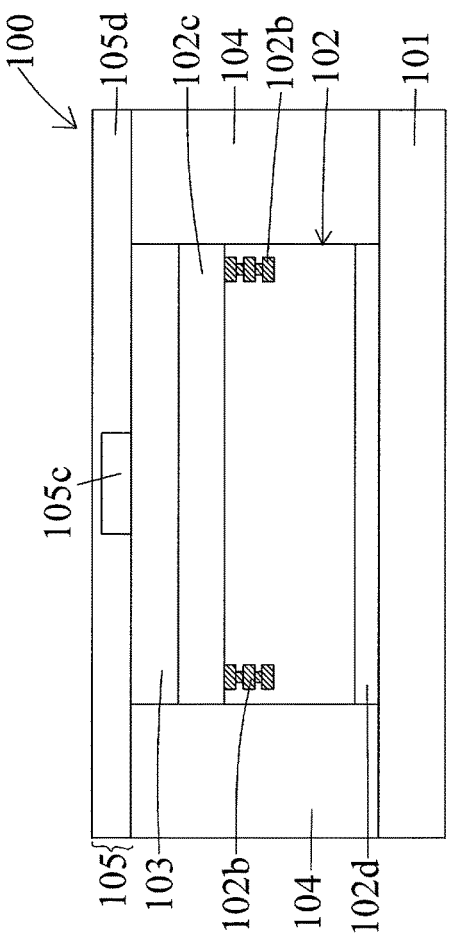
FIG. 3 is a schematic cross sectional view of a semiconductor structure along BB' of FIG. 1 in accordance with some embodiments of the present disclosure.

FIGS. 1-3 are an embodiment of a semiconductor structure 100. FIG. 1 is a schematic top view of the semiconductor structure 100. FIG. 2 is a schematic cross sectional view of the semiconductor structure 100 along AA' of FIG. 1. FIG. 3 is a schematic cross sectional view of the semiconductor structure 100 along BB' of FIG. 1.

In some embodiments, the semiconductor structure 100 includes a substrate 101, a die 102, a polymeric layer 103, a molding 104 and a redistribution layer (RDL) 105. In some embodiments, the semiconductor structure 100 is a fan out wafer level package, that input/output (I/O) terminals of a die are routed out and not limited to be disposed over a surface area of the die. The I/O terminals can be disposed outside the surface area of the die.

In some embodiments, the substrate 101 includes semiconductive material such as silicon, germanium, gallium, arsenic, and combinations thereof. In some embodiments, the substrate 101 is a silicon substrate. In some embodiments, the substrate 101 includes a variety of electrical components formed over or within the substrate 101 by several fabrication operations. The electrical components can be various n-type metal-oxide semiconductor (NMOS) and/or p-type metal-oxide semiconductor (PMOS) devices such as transistors, diodes or the like. The electrical components may be interconnected to perform one or more functions.

In some embodiments, the die 102 is disposed over the substrate 101. In some embodiments, the die 102 is disposed over a front side of the substrate 101. In some embodiments, the die 102 is disposed and attached to the substrate 101 by an adhesive 102d such as a die attach film (DAF), a tape or the like. In some embodiments, the die 102 is a small piece including semiconductive material such as silicon and is fabricated with a predetermined functional circuit within the die 102 produced by photolithography operations. In some embodiments, the die 102 is singulated from a silicon wafer by a mechanical or laser blade and then is placed over the substrate 101 for subsequent manufacturing operations. In some embodiments, the die 102 is in a quadrilateral, a rectangular or a square shape.

In some embodiments, the die 102 includes a die pad 102a, a seal ring 102b and a passivation 102c. In some embodiments, the die pad 102a is disposed over the die 102. In some embodiments, the die pad 102a is disposed over an active surface or a top surface of the die 102. In some embodiments, the die pad 102a is configured to electrically connect with a circuitry external to the die 102, so that a circuitry internal to the die 102 electrically connects with the circuitry external to the die 102 through the die pad 102a. In some embodiments, the die pad 102a includes aluminum, copper, nickel, tungsten, gold, silver, palladium and/or alloys thereof.

In some embodiments, the die pad 102a is partially covered by the passivation 102c. In some embodiments, the die pad 102a is surrounded by the passivation 102c, and a portion of the die pad 102a is exposed from the passivation 102c. In some embodiments, the portion of the die pad 102a exposed from the passivation 102c is configured to subsequently receive a conductive structure such as a conductive trace. As such, the die pad 102a can electrically connect with a circuitry external to the die 102. In some embodiments, the passivation 102c is configured to provide an electrical insulation and a moisture protection for the die 102, so that the die 102 is isolated from ambient environment. In some embodiments, the passivation 102c includes dielectric material such as silicon oxide, silicon oxynitride, silicon nitride, spin-on glass (SOG), or the like.

In some embodiments, the seal ring 102b is disposed over or within the die 102. As the die 102 may be potentially damaged upon fabrication and singulation operations, the seal ring 102b is configured to protect the die 102. In some embodiments, the seal ring 102b is served as a barrier for preventing contaminants such as moisture, chemicals, corrosive material or etc. from penetrating into the die 102 and preventing cracks from propagating into the die 102 upon singulation operations. In some embodiments, the seal ring 102b includes conductive material (such as aluminum, copper, silver, etc.) disposed within a dielectric material (such as silicon oxide, silicon oxynitride, silicon nitride, etc.) of the die 102. In some embodiments, the seal ring 102b includes several stacked conductive layers interconnected by several of via layers. In some embodiments, the stacked conductive layers and the via layers are disposed alternatively. In some embodiments, the seal ring 102b is electrically connected with the die pad 102a. In some embodiments, a portion of the conductive layers of the seal ring 102b is coupled and electrically connected with the die pad 102a.

In some embodiments, the seal ring 102b is disposed at a periphery of the die 102. In some embodiments, the seal ring 102b extends along the periphery of the die 102 to at least partially enclose a central portion of the die 102. In some embodiments as illustrated in FIG. 1, the seal ring 102b encloses the central portion of the die 120. In some embodiments, the conductive layers of the seal ring 102b extend within the dielectric material of the die 102 along the periphery of the die 102. In some embodiments, the seal ring 102b is in rectangular, quadrilateral or other suitable shapes. In some embodiments, the seal ring 102b surrounds components and interconnections disposed over or within the die 102, such that contamination and damage of the die 102 would be prevented.

In some embodiments, the seal ring 102b is configured for grounding or is connectable to ground. In some embodiments as illustrated in FIG. 1, the seal ring 102b is electrically grounded or connected to ground. As such, the die pad 102a is also electrically grounded when the seal ring 102b is electrically grounded or connected to ground. The grounding of the seal ring 102b can provide isolation of the die 102 from other dies, circuitries or electrical components. In some embodiments, the die 102 would be isolated and thus would not electrically or electromagnetically interfere with other dies, circuitries or electrical components upon an operation of the die 102.

In some embodiments, a via 106 is disposed over the die pad 102a and the passivation 102c. In some embodiments, the via 106 is electrically connected with the die pad 102a. In some embodiments, the via 106 is extended through the passivation 102c to the die pad 102a. In some embodiments, the portion of the die pad 102a exposed from the passivation 102c is coupled with the via 106. In some embodiments, the via 106 includes conductive material such as copper, aluminum, silver or etc. In some embodiments, the via 106 is electrically connected with the die pad 102a and the seal ring 102b.

In some embodiments, the polymeric layer 103 is disposed over the die 102. In some embodiments, the polymeric layer 103 is disposed over the passivation 102c. In some embodiments, the polymeric layer 103 surrounds the via 106. In some embodiments, the via 106 is at least partially covered by the polymeric layer 103. In some embodiments, the polymeric layer 103 includes polymeric material such as epoxy, polyimide, polybenzoxazole (PBO), solder resist (SR), ABF film, or the like. In some embodiments, the polymeric layer 103 is patterned to provide a path for a conductive structure passing through and electrically connecting with the via 106 and the die pad 102a. In some embodiments, the polymeric layer 103 includes a recess 103a disposed over the via 106 and the die pad 102a. In some embodiments, the recess 103a exposes a portion of the via 106, so that the via 106 can electrically connect with a conductive structure.

In some embodiments, the molding 104 is disposed over the substrate 101 and surrounds the die 102 and the polymeric layer 103. In some embodiments, the molding 104 encapsulates the die 102, the passivation 102c and the polymeric layer 103. In some embodiments, the molding 104 includes a molding compound. The molding compound can be a single layer film or a composite stack. The molding compound includes various materials, for example, one or more of epoxy resins, phenolic hardeners, silicas, catalysts, pigments, mold release agents, and the like. Each of the materials for forming a molding compound has a high thermal conductivity, a low moisture absorption rate, a high flexural strength at board-mounting temperatures, or a combination of these.

In some embodiments, the RDL 105 is disposed over the die 102 and the molding 104. In some embodiments, the RDL 105 is a layer for routing the I/O terminals out from the die 102. In some embodiments, the RDL 105 includes an interconnect structure 105a and a dielectric layer 105d surrounding the interconnect structure 105a. In some embodiments, the interconnect structure 105a includes conductive material such as copper, aluminum, silver, gold or etc. In some embodiments, the dielectric layer 105d includes dielectric material such as silicon oxide, silicon oxynitride, silicon nitride, etc.

In some embodiments, the interconnect structure 105a electrically connects with the via 106, the die pad 102a and the seal ring 102b. In some embodiments, the interconnect structure 105a is disposed over the polymeric layer 103 and conformal to the recess 103a to couple with the via 106. In some embodiments, the interconnect structure 105a includes a via portion 105b and a land portion 105c coupled with the via portion 105b. In some embodiments, the via portion 105b extends through the polymeric layer 103 and couples with the via 106. In some embodiments, the land portion 105c is disposed over the polymeric layer 103. In some embodiments, the land portion 105c extends along the dielectric layer 105d and over the central portion of the die 102. In some embodiments, the interconnect structure 105a of the RDL 105 is electrically grounded, as the interconnect structure 105a is electrically connected with the seal ring 102b through the die pad 102a and the via 106. In some embodiments, the interconnect structure 105a of the RDL 105 is configured for grounding or is connectable to ground.

In some embodiments, the seal ring 102b, the die pad 102a, the via 106 and the interconnect structure 105a of the RDL 105 are cooperatively configured, so that the die 102 is electrically isolated from other electrical components or circuitries, and thus electrical or electromagnetic interference between the die 102 and other electrical components or circuitries could be minimized or prevented.

Figure 4:
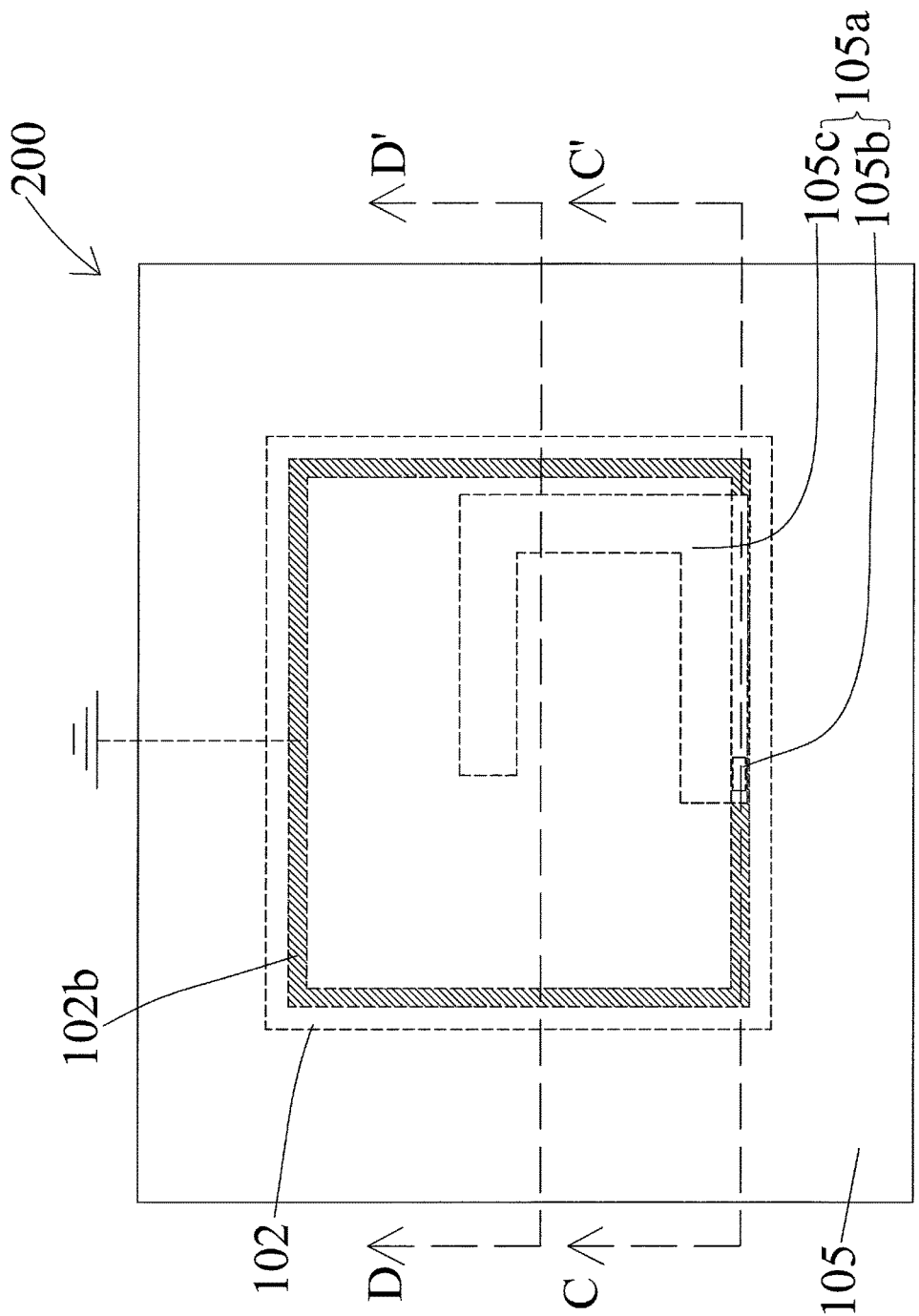
FIG. 4 is a schematic top view of a semiconductor structure in accordance with some embodiments of the present disclosure.
Figure 5:
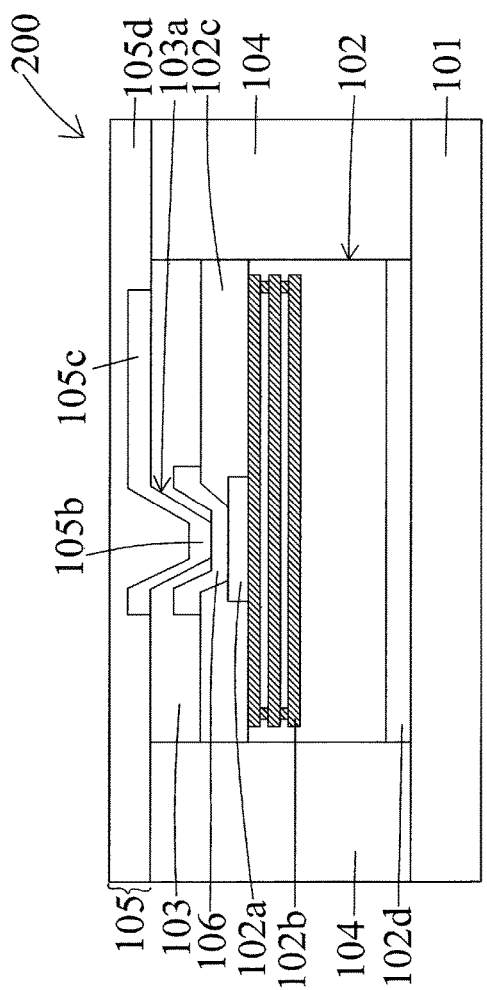
FIG. 5 is a schematic cross sectional view of a semiconductor structure along CC' of FIG. 4 in accordance with some embodiments of the present disclosure.
Figure 6:
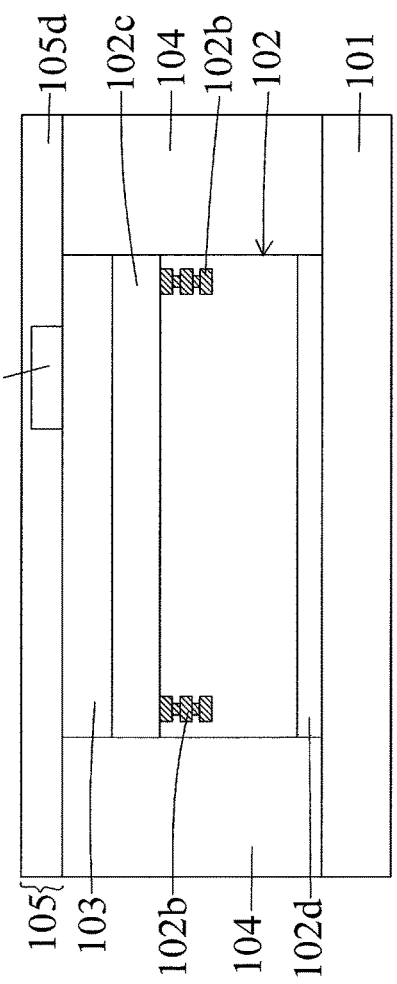
FIG. 6 is a schematic cross sectional view of a semiconductor structure along DD' of FIG. 4 in accordance with some embodiments of the present disclosure.

FIGS. 4-6 are an embodiment of a semiconductor structure 200. FIG. 4 is a schematic top view of the semiconductor structure 200. FIG. 5 is a schematic cross sectional view of the semiconductor structure 200 along CC' of FIG. 4. FIG. 6 is a schematic cross sectional view of the semiconductor structure 100 along DD' of FIG. 4.

In some embodiments, the semiconductor structure 200 includes a substrate 101, a die 102, a polymeric layer 103 and a molding 104, which have similar configuration as described above or illustrated in FIGS. 1-3. In some embodiments, the semiconductor structure 200 includes a RDL 105 disposed over the molding 104 and the polymeric layer 103. In some embodiments, the RDL 105 includes an interconnect structure 105a and a dielectric layer 105d surrounding the interconnect structure 105a. In some embodiments, the interconnect structure 105a of the RDL 105 is electrically grounded, as the interconnect structure 105a is electrically connected with the seal ring 102b through the die pad 102a and the via 106. In some embodiments, the interconnect structure 105a of the RDL 105 is configured for grounding or is connectable to ground.

The RDL 105 can be in various configurations. In some embodiments, the interconnect structure 105a includes a via portion 105b and a land portion 105c coupled with the via portion 105b. In some embodiments, the land portion 105c extends over the polymeric layer 103. In some embodiments the land portion 105c extends over periphery of the die 102, a central portion of the die 102 or a portion of the seal ring 102b. In some embodiments, the land portion 105c partially encloses the central portion of the die 102. In some embodiments, the land portion 105c is in a strip, a frame, a C shape or any other suitable shapes.

Figure 7:
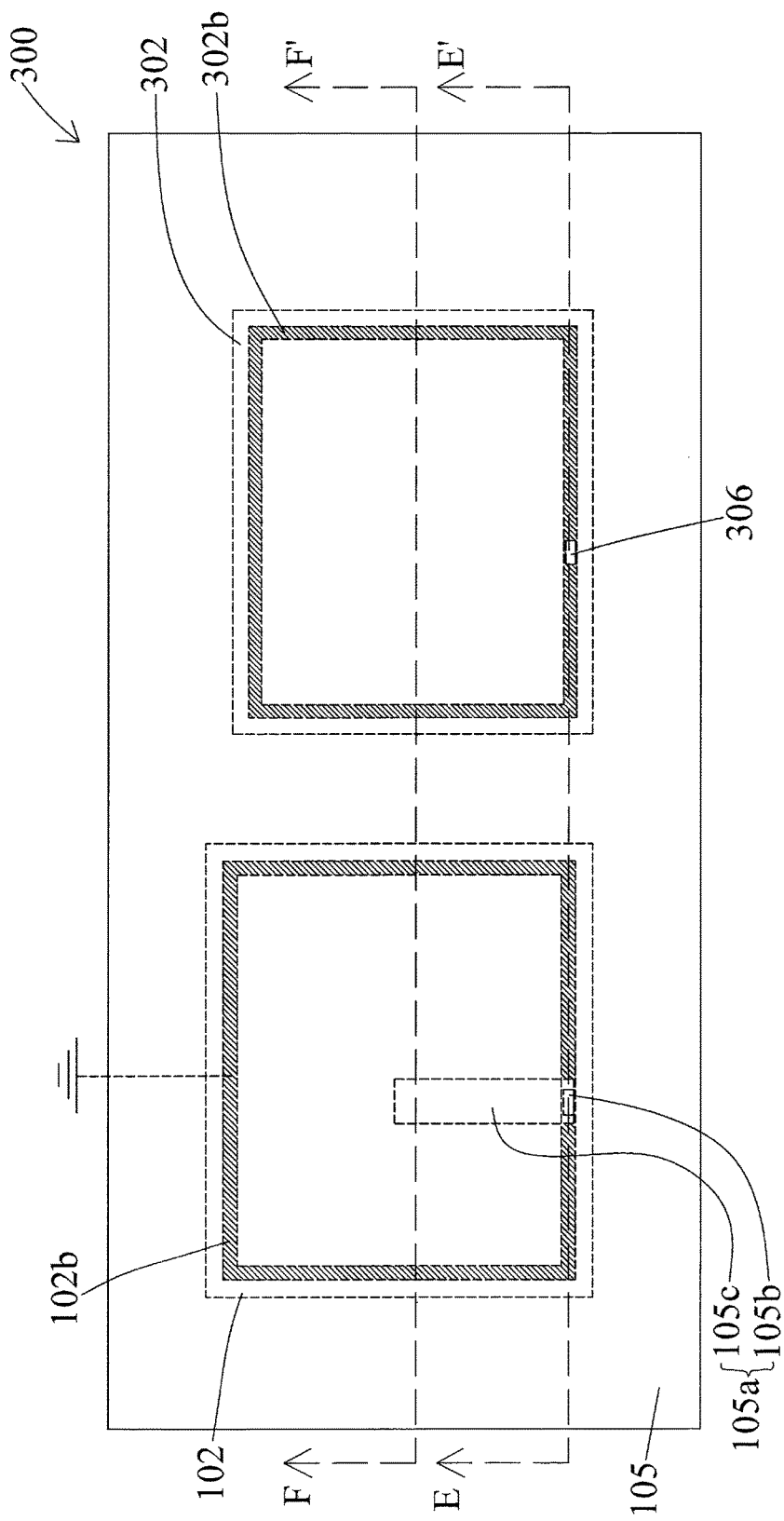
FIG. 7 is a schematic top view of a semiconductor structure in accordance with some embodiments of the present disclosure.
Figure 8:
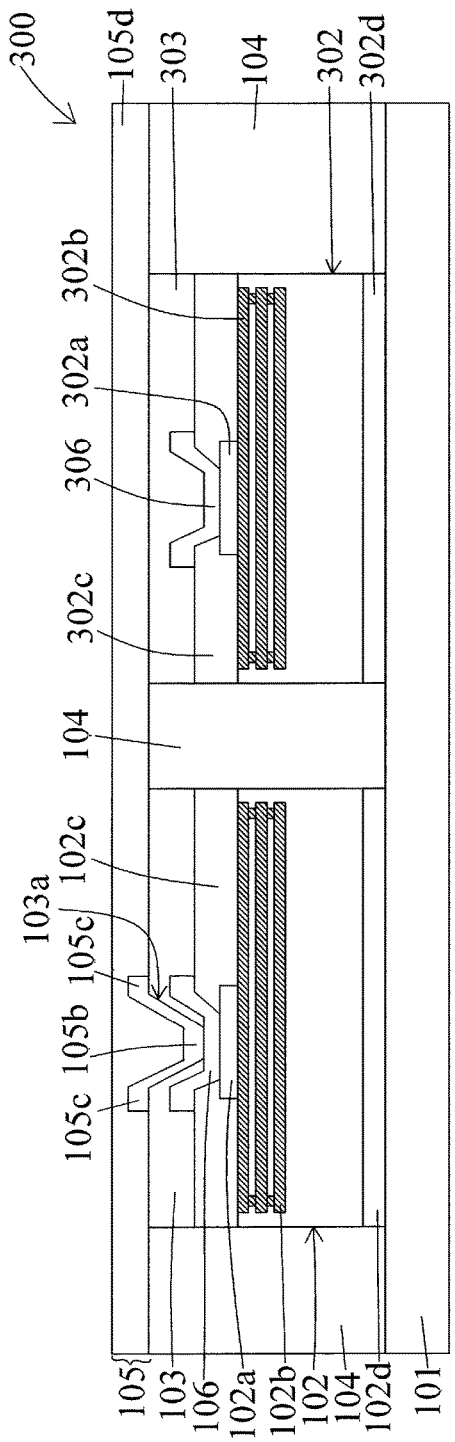
FIG. 8 is a schematic cross sectional view of a semiconductor structure along EE' of FIG. 7 in accordance with some embodiments of the present disclosure.
Figure 9:
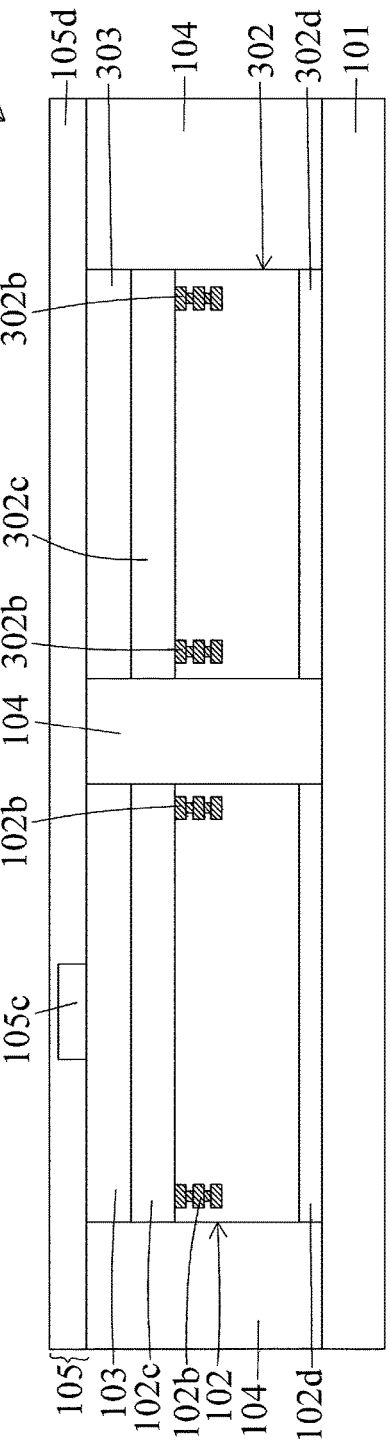
FIG. 9 is a schematic cross sectional view of a semiconductor structure along FF' of FIG. 7 in accordance with some embodiments of the present disclosure.

FIGS. 7-9 are an embodiment of a semiconductor structure 300. FIG. 7 is a schematic top view of the semiconductor structure 300. FIG. 8 is a schematic cross sectional view of the semiconductor structure 300 along EE' of FIG. 7. FIG. 9 is a schematic cross sectional view of the semiconductor structure 300 along FF' of FIG. 7.

In some embodiments, the semiconductor structure 300 includes a substrate 101, a first die 102, a second die 302, a first polymeric layer 103, a second polymeric layer 303, a molding 104 and a redistribution layer (RDL) 105. In some embodiments, the first die 102 and the second die 302 are integrated and packaged to become a semiconductor package. In some embodiments, the semiconductor structure 300 is a fan out wafer level package. Although only two dies (102 and 302) are described below, the semiconductor structure 300 can include one or more dies. It is not intended to limit to two dies. Any number of dies in the semiconductor structure is also fallen into our intended scope, without departing from the spirit and scope of the present disclosure.

In some embodiments, the first die 102 and the second die 302 are disposed over the substrate 101. In some embodiments, the substrate 101 is a silicon substrate. In some embodiments, the substrate 101 has similar configuration as described above or illustrated in any one of FIGS. 1-6. In some embodiments, the first die 102 or the second die 302 includes semiconductive material such as silicon. In some embodiments, the first die 102 and the second die 302 have similar configuration as the die 102 described above or illustrated in any one of FIGS. 1-6. In some embodiments, the first die 102 is substantially same as or different from the second die 302. In some embodiments, the first die 102 and the second die 302 are different in applications, functions, structures, sizes, dimensions, shapes or etc. For example, the first die 102 and the second die 302 perform different functions, or the first die 102 has a size same as or larger than the second die 302, or a thickness of the first die 102 is same as or greater than a thickness of the second die 302.

In some embodiments, the first die 102 is disposed adjacent to the second die 302. In some embodiments, the first die 102 is attached over a surface of the substrate 101 by a first adhesive 102d, and the second die 302 is attached over the surface of the substrate 101 by a second adhesive 302d. In some embodiments, the first adhesive 102d or the second adhesive 302 has similar configuration as the adhesive 102d described above or illustrated in any one of FIGS. 1-6.

In some embodiments, the first die 102 includes a first die pad 102a disposed over the first die 102 and a first seal ring 102b disposed within the first die 102. In some embodiments, a first passivation 102c is disposed over the first die 102 and covers a portion of the first die pad 102a. In some embodiments, a first via 106 is disposed over and electrically connected with the first die pad 102a. In some embodiments, a first polymeric layer 103 is disposed over the first die 102 and surrounds the first via 106. In some embodiments, the first seal ring 102b is configured for grounding or is connectable to ground. In some embodiments, the first die pad 102a, the first seal ring 102b, the first passivation 102c, the first via 106 and the first polymeric layer 103 have similar configuration as the die pad 102a, the seal ring 102b, the passivation 102c, the via 106 and the polymeric layer 103 respectively described above or illustrated in any one of FIGS. 1-6.

In some embodiments, the second die 302 includes a second die pad 302a disposed over the second die 302 and a second seal ring 302b disposed within the second die 302. In some embodiments, a second passivation 302c is disposed over the second die 302 and covers a portion of the second die pad 302a. In some embodiments, the second die pad 302a is electrically connected with the second seal ring 302b. In some embodiments, the second seal ring 302b extends along a periphery of the second die 302 and at least partially encloses a central portion of the second die 302. In some embodiments, a second via 306 is disposed over and electrically connected with the second die pad 302a. In some embodiments, a second polymeric layer 303 is disposed over the second die 302 and surrounds the second via 306. In some embodiments, the second die pad 302a, the second seal ring 302b, the second passivation 302c, the second via 306 and the second polymeric layer 303 are in similar configuration as the first die pad 102a, the first seal ring 102b, the first passivation 102c, the first via 106 and the first polymeric layer 103 respectively. In some embodiments, the first passivation 102c and the first polymeric layer 103 are substantially same as the second passivation 302c and the second polymeric layer 303.

In some embodiments, the molding 104 is disposed over the substrate 101 and surrounds the first die 102, the first passivation 102c, the first polymeric layer 103, the second die 302, the second passivation 302c and the second polymeric layer 303. In some embodiments, a portion of the molding 104 is disposed between the first die 102 and the second die 302. In some embodiments, the molding 104 has similar configuration as described above or illustrated in any one of FIGS. 1-6.

In some embodiments, the RDL 105 is disposed over the molding 104, the first die 102 and the second die 302. In embodiments, the RDL 105 is disposed over the molding 104, the first polymeric layer 103 and the second polymeric layer 303. In some embodiments, the RDL 105 includes an interconnect structure 105a and a dielectric layer 105d surrounding the interconnect structure 105a. In some embodiments, the interconnect structure 105a includes a via portion 105b coupled with the first via 106 and a land portion 105c extending over the first die 102. In some embodiments, the RDL 105 has similar configuration as described above or illustrated in any one of FIGS. 1-6.

In some embodiments, the interconnect structure 105a of the RDL 105, the first via 106, the first die pad 102a and the first seal ring 102b are electrically connected and thus are electrically grounded when the first seal ring 102b is electrically grounded. The first seal ring 102b, the first die pad 102a, the first via 106 and the interconnect structure 105a are cooperatively configured, so that the first die 102 is electrically isolated from the second die 302, and thus electrical and electromagnetic interference between the first die 102 and the second die 302 could be minimized or prevented.

Figure 10:
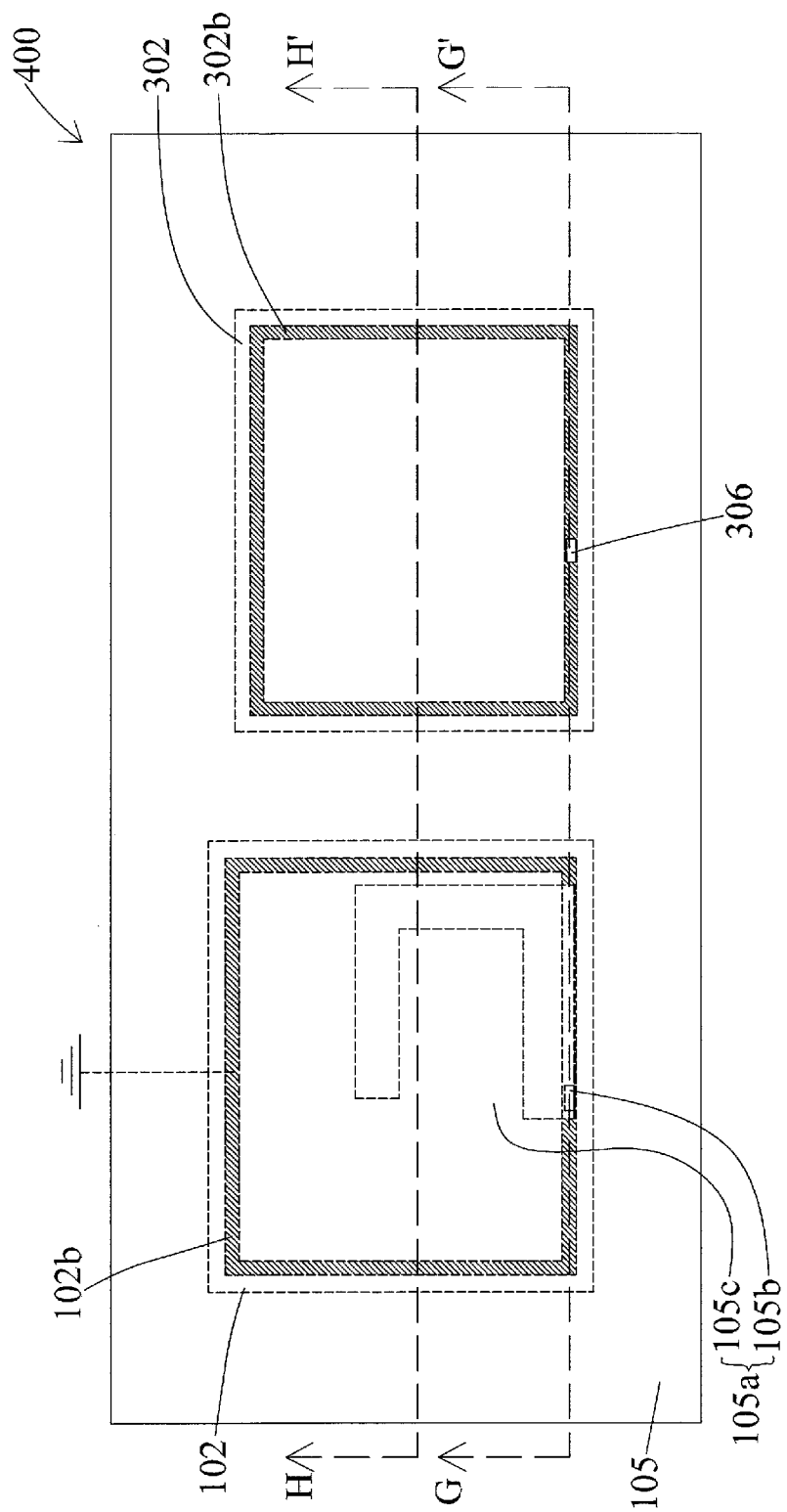
FIG. 10 is a schematic top view of a semiconductor structure in accordance with some embodiments of the present disclosure.
Figure 11:
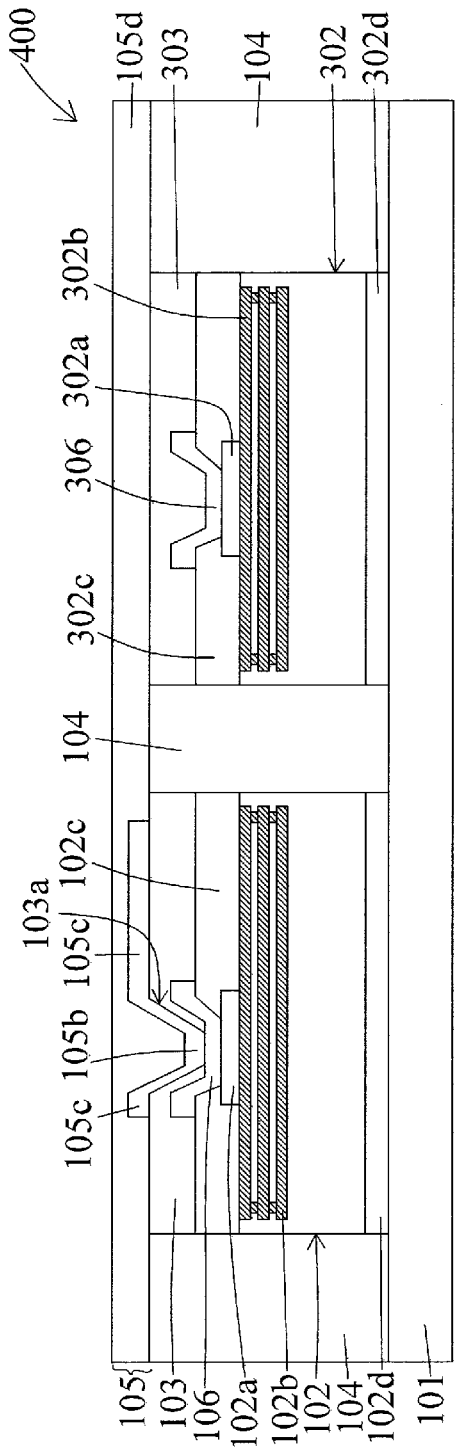
FIG. 11 is a schematic cross sectional view of a semiconductor structure along GG' of FIG. 10 in accordance with some embodiments of the present disclosure.
Figure 12:
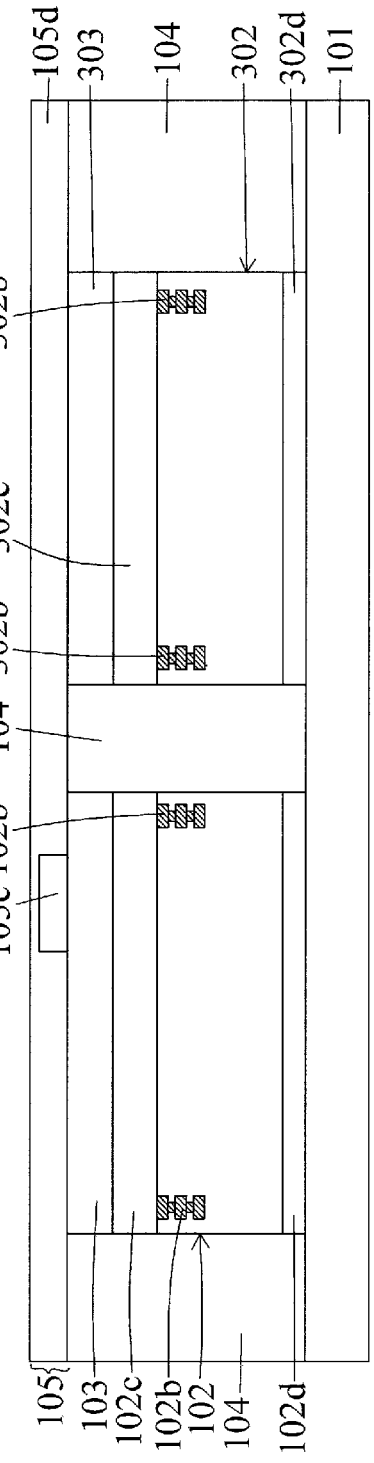
FIG. 12 is a schematic cross sectional view of a semiconductor structure along HH' of FIG. 10 in accordance with some embodiments of the present disclosure.

FIGS. 10-12 are an embodiment of a semiconductor structure 400. FIG. 10 is a schematic top view of the semiconductor structure 400. FIG. 11 is a schematic cross sectional view of the semiconductor structure 400 along GG' of FIG. 10. FIG. 12 is a schematic cross sectional view of the semiconductor structure 400 along HIT of FIG. 10. In some embodiments, the semiconductor structure 400 is in similar configuration as the semiconductor structure 300 illustrated in any one of FIGS. 7-9.

In some embodiments, the RDL 105 can be in various configurations. In some embodiments, the interconnect structure 105a includes a via portion 105b and a land portion 105c coupled with the via portion 105b. In some embodiments, the land portion 105c extends over the first polymeric layer 103. In some embodiments the land portion 105c extends over a periphery of the first die 102, a central portion of the first die 102 or a portion of the first seal ring 102b. In some embodiments, the land portion 105c partially encloses the central portion of the first die 102. In some embodiments, the land portion 105c is in a strip, a frame, a C shape or any other suitable shapes. In some embodiments, the RDL 105 of the semiconductor structure 400 has similar configuration as the RDL 105 of the semiconductor structure 300 described above or illustrated in any one of FIGS. 7-9.

Figure 13:
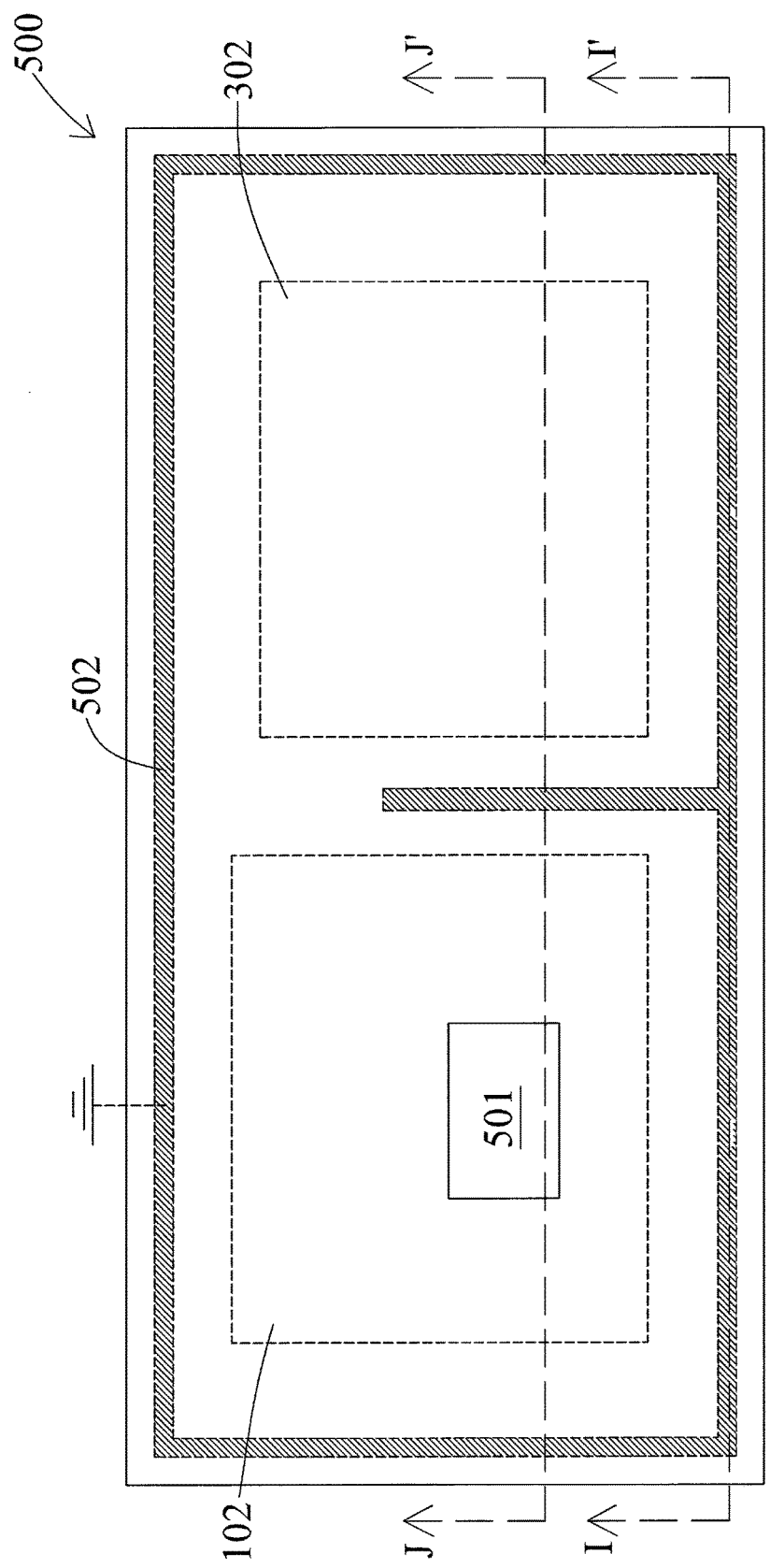
FIG. 13 is a schematic top view of a semiconductor structure in accordance with some embodiments of the present disclosure.
Figure 14:
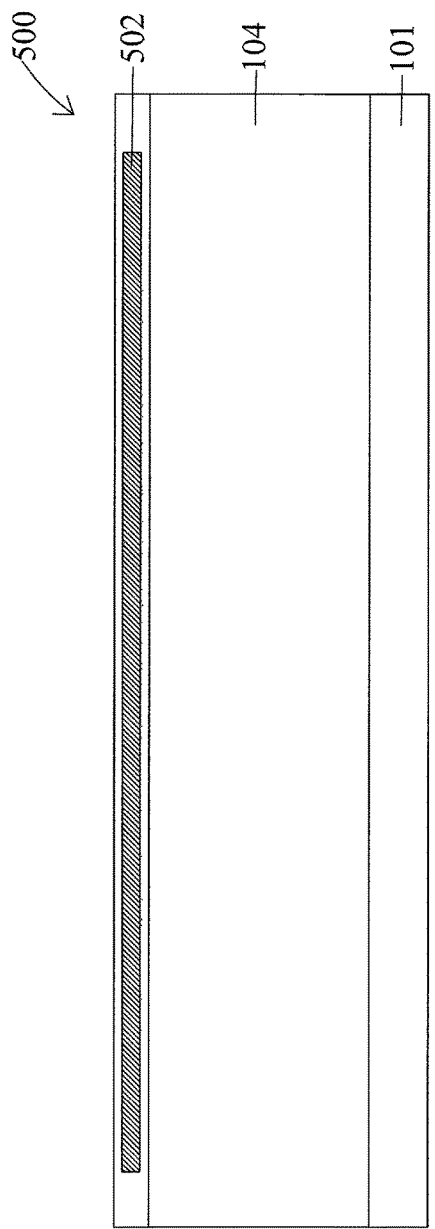
FIG. 14 is a schematic cross sectional view of a semiconductor structure along II' of FIG. 13 in accordance with some embodiments of the present disclosure.
Figure 15:
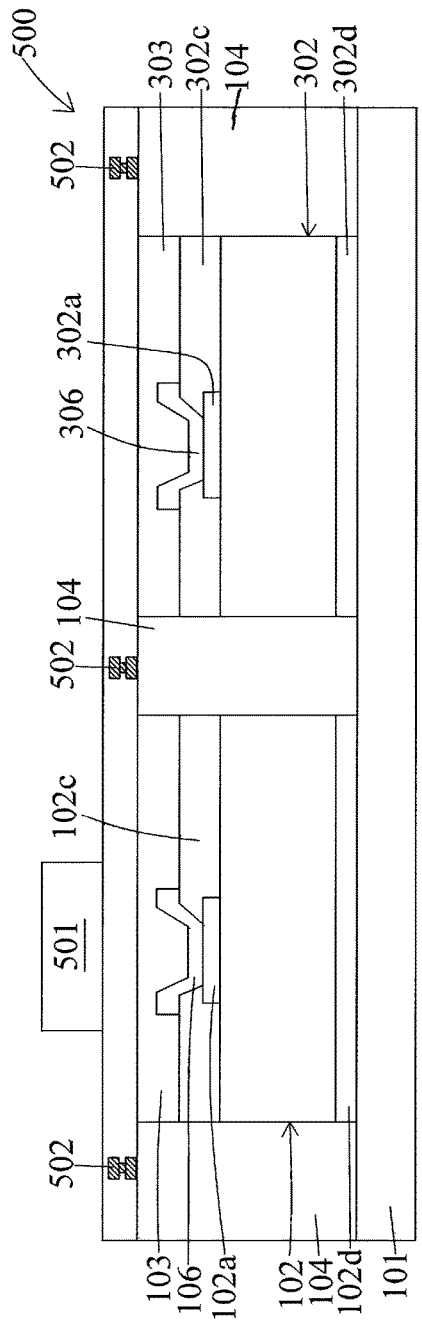
FIG. 15 is a schematic cross sectional view of a semiconductor structure along JJ' of FIG. 13 in accordance with some embodiments of the present disclosure.

FIGS. 13-15 are an embodiment of a semiconductor structure 500. FIG. 13 is a schematic top view of the semiconductor structure 500. FIG. 14 is a schematic cross sectional view of the semiconductor structure 500 along I I' of FIG. 13. FIG. 15 is a schematic cross sectional view of the semiconductor structure 500 along JJ' of FIG. 13.

In some embodiments, the semiconductor structure 500 includes a substrate 101, a first die 102, a first polymeric layer 103, a second die 302, a second polymeric layer 303, a molding 104 and a package seal ring 502. In some embodiments, the first die 102 and the second die 302 are disposed over the substrate 101, and the molding 104 surrounds the first die 102 and the second die 302.

In some embodiments, the first die 102 includes a first die pad 102a disposed over the first die 102. In some embodiments, a first passivation 102c is disposed over the first die 102 and covers a portion of the first die pad 102a. In some embodiments, the first polymeric layer 103 is disposed over the first die 102. In some embodiments, a first via 106 is disposed over and electrically connects the first die pad 102a. In some embodiments, the first polymeric layer 103 surrounds the first via 106. In some embodiments, the first die pad 102a, the first passivation 102c, the first via 106 and the first polymeric layer 103 have similar configuration as the die pad 102a, the passivation 102c, the via 106 and the polymeric layer 103 respectively described above or illustrated in any one of FIGS. 1-6. In some embodiments, the first die pad 102a, the first passivation 102c, the first via 106 and the first polymeric layer 103 have similar configuration as described above or illustrated in any one of FIGS. 7-12. In some embodiments, an electrical component 501 is disposed over the first die 102.

In some embodiments, the second die 302 includes a second die pad 302a disposed over the second die 302. In some embodiments, a second passivation 302c is disposed over the second die 302 and covers a portion of the second die pad 302a. In some embodiments, the second polymeric layer 303 is disposed over the second die 302. In some embodiments, a second via 306 is disposed over and electrically connects the second die pad 302a. In some embodiments, the second t polymeric layer 303 surrounds the second via 306. In some embodiments, the second die pad 302a, the second passivation 302c, the second via 306 and the second polymeric layer 303 have similar configuration as the first die pad 102a, the first passivation 102c, the first via 106 and the first polymeric layer 103 respectively described above or illustrated in any one of FIGS. 1-12. In some embodiments, the second die pad 302a, the second passivation 302c, the second via 306 and the second polymeric layer 303 have similar configuration as described above or illustrated in any one of FIGS. 7-12.

In some embodiments, the package seal ring 502 is disposed over the molding 104. In some embodiments, the package seal ring 502 is disposed within a dielectric layer and is extended along a periphery of the semiconductor structure 500. In some embodiments, the package seal ring 502 is at least partially around the first die 102 and the second die 302. In some embodiments, the package seal ring 502 is disposed between the first die 102 and the second die 302. In some embodiments, the package seal ring 502 includes conductive material such as copper, aluminum, silver, etc. In some embodiments, the package seal ring 502 is configured for grounding or is connectable to ground. Thus, the package seal ring 502 can electrically isolate the first die 102 from the second die 302. An electrical or electromagnetic interference between the first die 102 and the second die 302 could be minimized or prevented.

Figure 16:
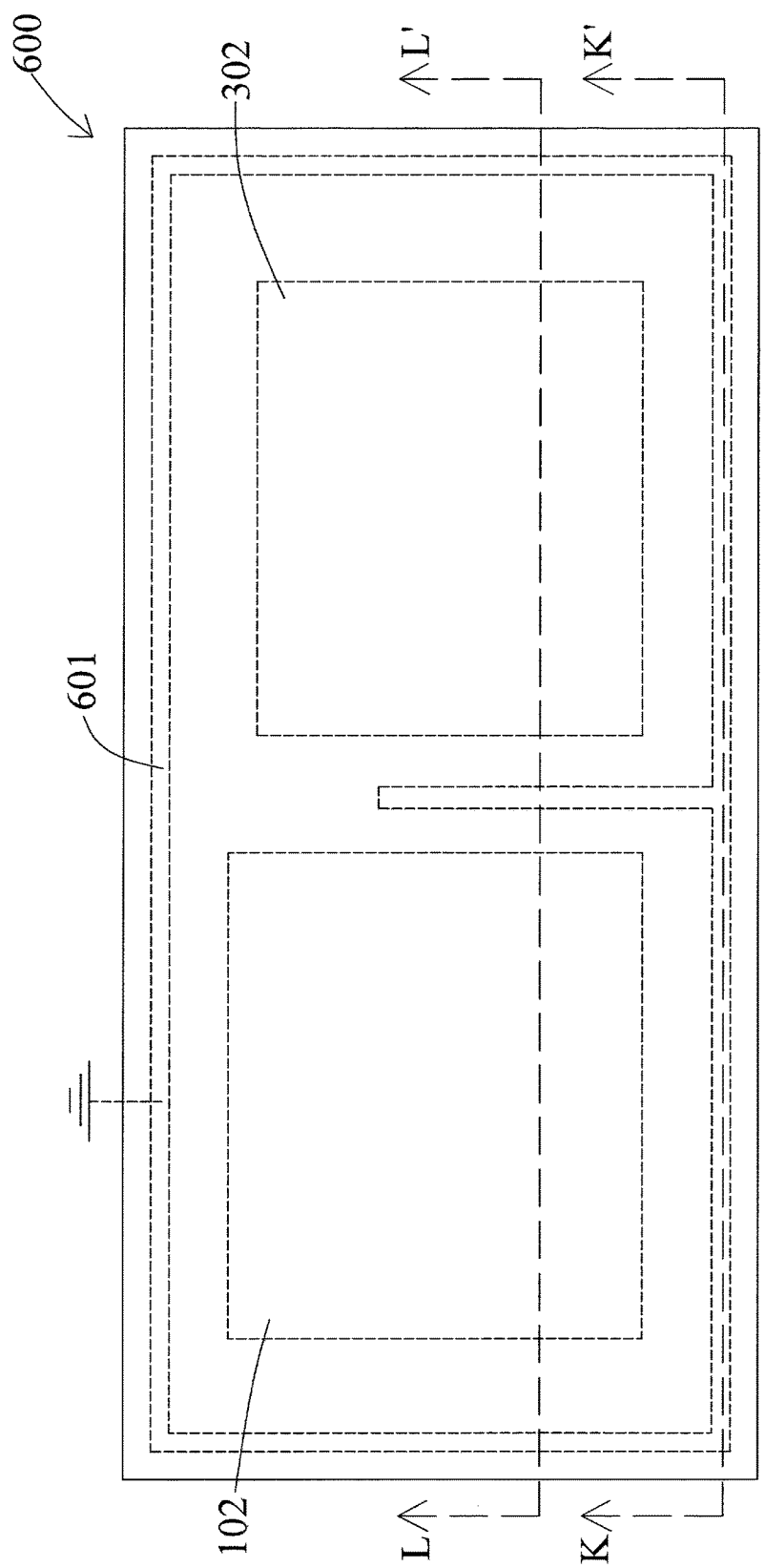
FIG. 16 is a schematic top view of a semiconductor structure in accordance with some embodiments of the present disclosure.
Figure 17:
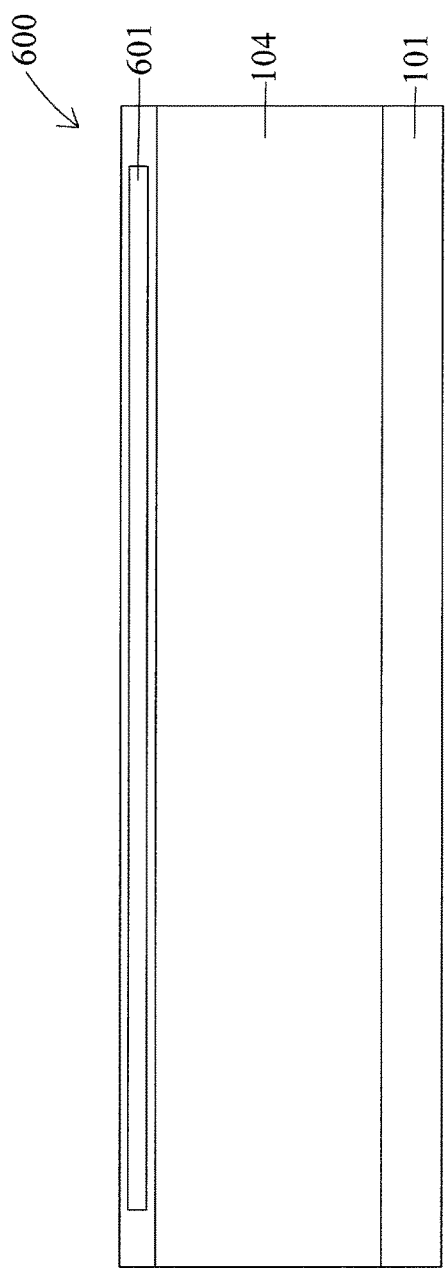
FIG. 17 is a schematic cross sectional view of a semiconductor structure along KK' of FIG. 16 in accordance with some embodiments of the present disclosure.
Figure 18:
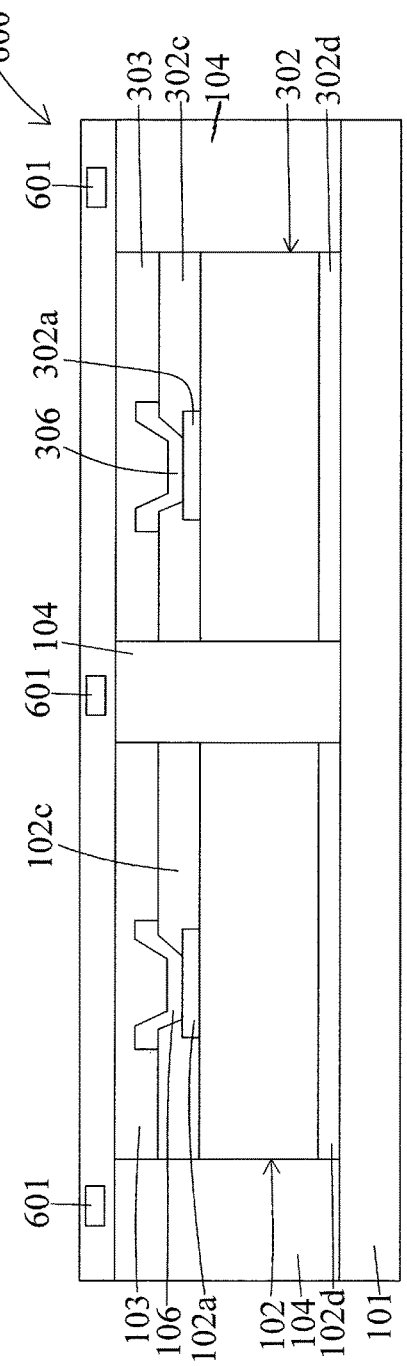
FIG. 18 is a schematic cross sectional view of a semiconductor structure along LL' of FIG. 16 in accordance with some embodiments of the present disclosure.

FIGS. 16-18 are an embodiment of a semiconductor structure 600. FIG. 16 is a schematic top view of the semiconductor structure 600. FIG. 17 is a schematic cross sectional view of the semiconductor structure 600 along KK' of FIG. 16. FIG. 18 is a schematic cross sectional view of the semiconductor structure 600 along LL' of FIG. 16.

In some embodiments, the semiconductor structure 600 includes a substrate 101, a first die 102, a first die pad 102a, a first polymeric layer 103, a first via 106, a second die 302, a second die pad 302a, a second polymeric layer 303, a second via 306 and a molding 104, which have similar configuration as described above or illustrated in any one of FIGS. 13-15.

In some embodiments, the semiconductor structure 600 includes a package redistribution layer (RDL) 601 disposed over the molding 104. In some embodiments, the package RDL 601 is disposed within a dielectric layer and is extended along a periphery of the semiconductor structure 600. In some embodiments, the package RDL 601 is at least partially around the first die 102 and the second die 302. In some embodiments, the package RDL 601 is disposed between the first die 102 and the second die 302. In some embodiments, the package RDL 601 includes conductive material such as copper, aluminum, silver, etc. In some embodiments, the package RDL 601 is configured for grounding or is connectable to ground. Thus, the package RDL 601 can electrically isolate the first die 102 from the second die 302. An electrical or electromagnetic interference between the first die 102 and the second die 302 could be minimized or prevented.

Figure 19:
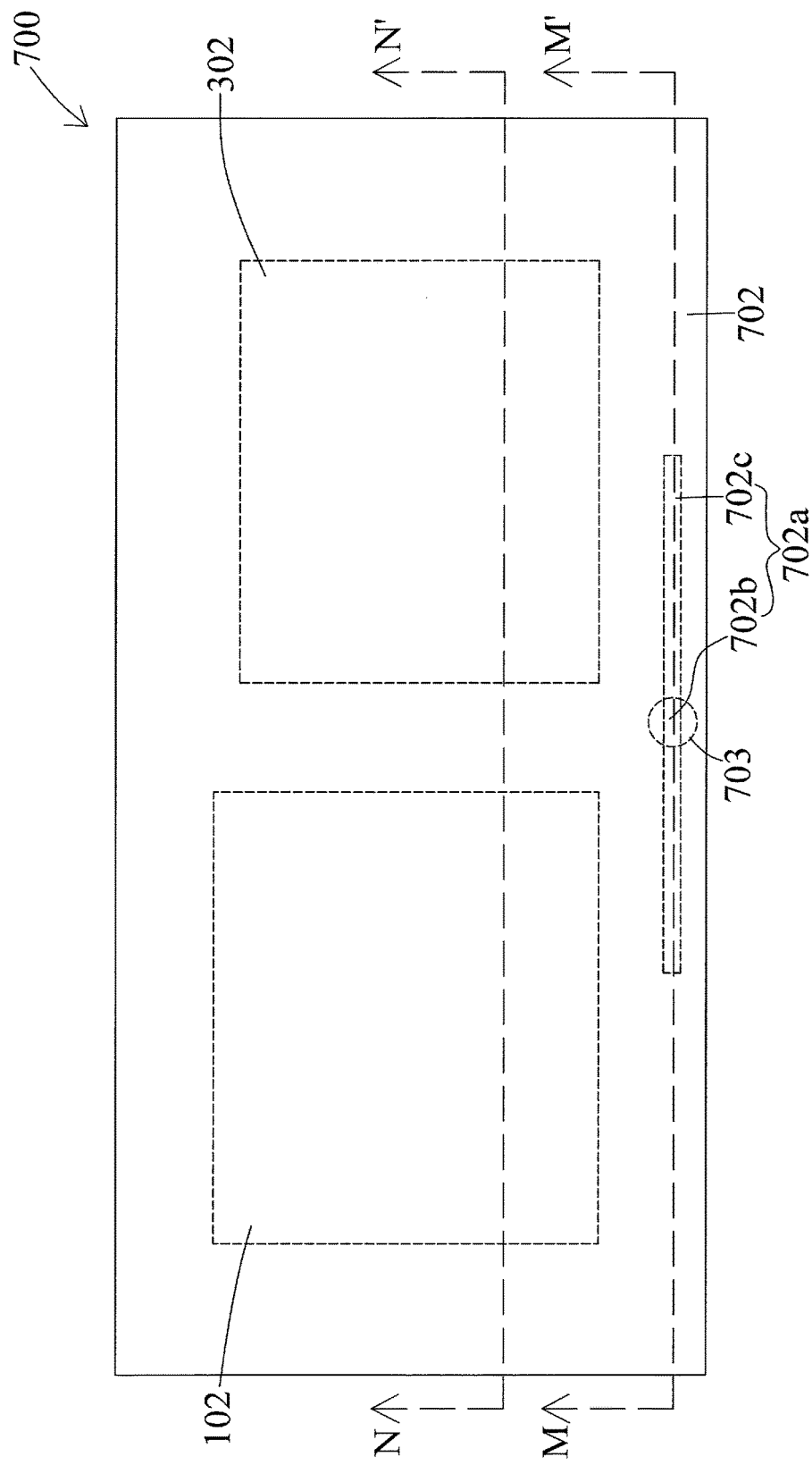
FIG. 19 is a schematic top view of a semiconductor structure in accordance with some embodiments of the present disclosure.
Figure 20:
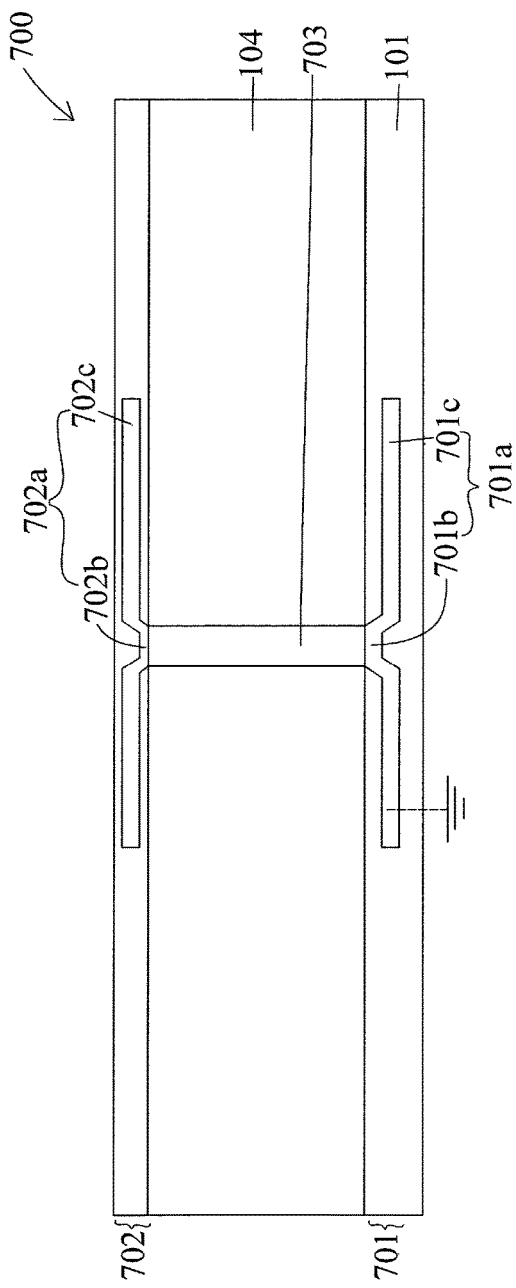
FIG. 20 is a schematic cross sectional view of a semiconductor structure along MM' of FIG. 19 in accordance with some embodiments of the present disclosure.
Figure 21:
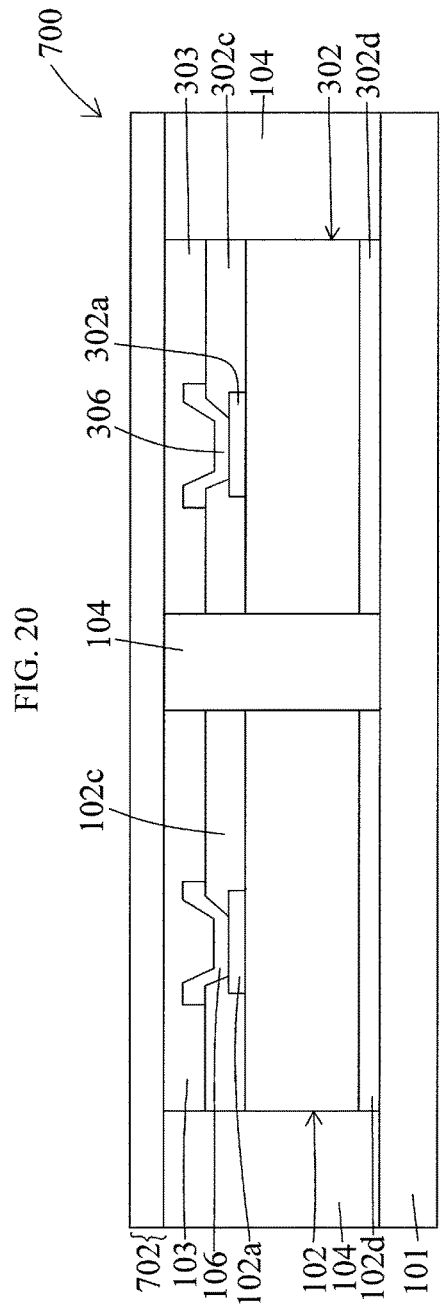
FIG. 21 is a schematic cross sectional view of a semiconductor structure along NN' of FIG. 19 in accordance with some embodiments of the present disclosure.

FIGS. 19-21 are an embodiment of a semiconductor structure 700. FIG. 19 is a schematic top view of the semiconductor structure 700. FIG. 20 is a schematic cross sectional view of the semiconductor structure 700 along MM' of FIG. 19. FIG. 21 is a schematic cross sectional view of the semiconductor structure 700 along NN' of FIG. 19.

In some embodiments, the semiconductor structure 700 includes a substrate 101. In some embodiments, the first die 102 and the second die 302 are disposed over the substrate 101. In some embodiments, the substrate 101 includes a first RDL 701. In some embodiments, the first RDL 701 includes a first interconnect structure 701a and a dielectric layer surrounding the first interconnect structure 701a. In some embodiments, the first interconnect structure 701a includes conductive material such as copper, aluminum, silver, etc. In some embodiments, the first interconnect structure 701a includes a via portion 701b and a land portion 701c coupled with the via portion 701b. In some embodiments, the land portion 701c is extended along a periphery of the semiconductor structure 700. In some embodiments, the via portion 701b is extended through the dielectric layer of the first RDL 701. In some embodiments, the first interconnect structure 701a is configured for grounding or is connectable to ground.

In some embodiments, the semiconductor structure 700 includes a first die 102, a first die pad 102a, a first polymeric layer 103, a first via 106, a second die 302, a second die pad 302a, a second polymeric layer 303, a second via 306 and a molding 104, which have similar configuration as described above or illustrated in any one of FIGS. 13-18.

In some embodiments, the semiconductor structure 700 includes a through via 703 extending within the molding 104. In some embodiments, the through via 703 extends from and electrically connected with the first interconnect structure 701a of the first RDL 701. In some embodiments, the through via 703 is disposed over and electrically connected with the via portion 701b of the first interconnect structure 701a of the first RDL 701. In some embodiments, the through via is a through integrated fan out via (TIV). In some embodiments, the through via 703 includes conductive material such as copper, aluminum, silver, etc. In some embodiments, the through via 703 is disposed adjacent to the periphery of the semiconductor structure 700.

In some embodiments, the through via 703 extends from the first RDL 701 to a second RDL 702 disposed over the molding 104, the first die 102 and the second die 302. In some embodiments, the second RDL 702 includes a second interconnect structure 702a and a dielectric layer surrounding the second interconnect structure 702a. In some embodiments, the second interconnect structure 702a includes conductive material such as copper, aluminum, silver, etc. In some embodiments, the second interconnect structure 702a includes a via portion 702b and a land portion 702c coupled with the via portion 702b. In some embodiments, the land portion 702c is extended along the periphery of the semiconductor structure 700. In some embodiments, the via portion 702b is extended through the dielectric layer of the second RDL 702.

In some embodiments, the via portion 701b of the second RDL 702 is disposed over the through via 703. In some embodiments, the through via 703 extends from the via portion 701b of the first RDL 701 to the via portion 702b of the second RDL 702, such that the first interconnect structure 701a is electrically connected with the second interconnect structure 702a through the through via 703. In some embodiments, the second interconnect structure 702a is electrically grounded when the first interconnect structure 701a is electrically grounded or connected to ground, as the second interconnect structure 702a is electrically connected with the first interconnect structure 701a. Therefore, the first interconnect structure 701a of the first RDL 701 and the second interconnect structure 702b of the second RDL 702 are in cooperation to electrically isolate the first die 102 from the second die 302. An electrical or electromagnetic interference between the first die 102 and the second die 302 could be minimized or prevented.

Figure 22:
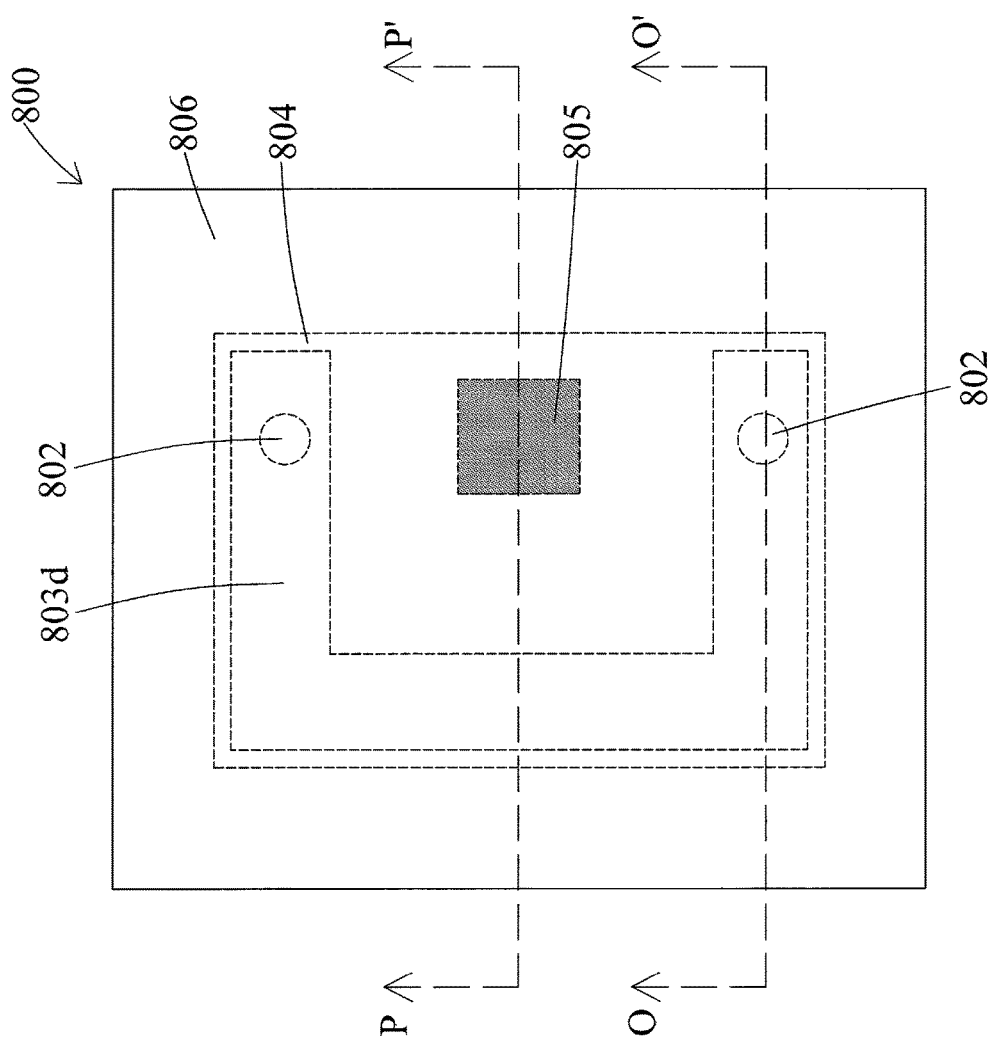
FIG. 22 is a schematic top view of a semiconductor structure in accordance with some embodiments of the present disclosure.

FIGS. 22-24 are an embodiment of a semiconductor structure 800. FIG. 22 is a schematic top view of the semiconductor structure 800. FIG. 23 is a schematic cross sectional view of the semiconductor structure 800 along OO' of FIG. 22. FIG. 21 is a schematic cross sectional view of the semiconductor structure 800 along PP' of FIG. 22. In some embodiments, the semiconductor structure 800 includes a first RDL 801, a via 802, a second RDL 803, a die 804, a source 805 and a molding 806.

In some embodiments, the first RDL 801 includes a first interconnect structure 801*a* and a first dielectric layer 801*b*. In some embodiments, the first interconnect structure 801*a* is surrounded by the first dielectric layer 801*b*. In some embodiments, the first interconnect structure 801*a* includes conductive material such as copper, aluminum or etc. In some embodiments, the first interconnect structure 801 includes a via portion 801*c* and a land portion 801*d* coupled with the via portion 801*c*. In some embodiments, the via portion 801*c* extends from the land portion 801*d* through the first dielectric layer 801*b*. In some embodiments, the land portion 801*d* extends within the first dielectric layer 801*b*. In some embodiments, the land portion 801*d* is extended in various shapes such as a strip, a frame, an annular shape, C shape, etc.

In some embodiments, the via 802 is disposed over, extended from and electrically connected with the via portion 801*c* of the first RDL 801. In some embodiments, the via 802 extends through a third dielectric layer 802*a* disposed over the first RDL 801. In some embodiments, the via 802 electrically connects with the first interconnect structure 801*a* of the first RDL 801 and extends through the third dielectric layer 802*a*. In some embodiments, the via 802 includes conductive material such as copper, etc. In some embodiments, the via 802 is a through integrated fan out via. In some embodiments, the via 802 has a height of about 500 um or a diameter of about 100 um.

In some embodiments, the second RDL 803 includes a second interconnect structure 803*a* and a second dielectric layer 803*b*. In some embodiments, the second interconnect structure 803*a* is surrounded by the second dielectric layer 803*b*. In some embodiments, the second dielectric layer 803*b* is disposed over the third dielectric layer 802*a* and the via 802. In some embodiments, the second interconnect structure 803*a* includes conductive material such as copper, aluminum or etc. In some embodiments, the second interconnect structure 803 includes a via portion 803*c* and a land portion 803*d* coupled with the via portion 803*c*. In some embodiments, the via portion 803*c* extends from the land portion 803*d* through the second dielectric layer 803*b*. In some embodiments, the land portion 803*d* extends within the second dielectric layer 803*b*. In some embodiments, the land portion 803*d* is extended in various shapes such as a strip, a frame, an annular shape, C shape, etc. In some embodiments, the first interconnect structure 801*a* is substantially same or different from the second interconnect structure 803*a*. In some embodiments, the first dielectric layer 801*b* is substantially same or different from the second dielectric layer 803*b* or the third dielectric layer 802*a*.

In some embodiments, the second interconnect structure 803*a* electrically connects with the first conductive structure 801*a* by the via 802. In some embodiments, the via 802 extends between the first RDL 801 and the second RDL 803. In some embodiments, the via 802 electrically connects the first interconnect structure 801*a* with the second interconnect structure 803*a*. In some embodiments, the first interconnect structure 801*a* and the second interconnect structure 803*a* are aligned and disposed opposite to each other. In some embodiments, the first interconnect structure 801*a* and the second interconnect structure 803*a* are configured in substantially same dimension and shape.

In some embodiments, the die 804 is disposed over the second RDL 803, the via 802 or the first RDL 801. In some embodiments, the die 804 includes semiconductive material such as silicon and is fabricated with a predetermined functional circuit within the die 804 produced by photolithography operations. In some embodiments, the die 804 is singulated from a silicon wafer by a mechanical or laser blade and then is disposed over the second dielectric layer 803*b*. In some embodiments, the die 804 is in a quadrilateral, a rectangular or a square shape. In some embodiments, the molding 806 is disposed over the second RDL 803 and covers the die 804.

In some embodiments, the source 805 is disposed within the die 804 and the second RDL 803 or is disposed within the first RDL 801, the second RDL 803 and the third dielectric layer 802*a* and the die 804. In some embodiments, the source 805 is electrically connected with the die 804. In some embodiments, the source 805 extends from the die 804 to the first RDL 801 or the second RDL 803. In some embodiments, the source 805 extends from the die 804 to the first RDL 801 through the second RDL 803 and the third dielectric layer 802*a*. In some embodiments, a first portion of the source 805 is partially or wholly surrounded by the first interconnect structure 801*a* of the first RDL 801. In some embodiments, a second portion of the source 805 is partially or wholly surrounded by the second interconnect structure 803*a* of the second RDL 803. In some embodiments, the source 805 is configured to emit an electromagnetic radiation such as radio wave. In some embodiments, the source 805 emits the electromagnetic radiation in a radio frequency (RF) such as lower than about 300 GHz, a range of about 3 kHz to about 300 GHz, etc. for wireless communication. In some embodiments, the source 805 is in a patch shape, spiral shape or other suitable shapes.

In some embodiments, the first interconnect structure 801*a* of the first RDL 801 and the second interconnect structure 803*a* of the second RDL 803 are configured to absorb an electromagnetic radiation. In some embodiments, the first interconnect structure 801*a* and the second interconnect structure 803*a* are in cooperation to absorb the electromagnetic radiation in a predetermined frequency. In some embodiments, the electromagnetic radiation emitted from the source 805 can be absorbed by the first interconnect structure 801*a* and the second interconnect structure 803*a*. In some embodiments, the first interconnect structure 801*a* and the second interconnect structure 803*a* can absorb the electromagnetic radiation in the radio frequency emitted from the source 805. In some embodiments, the first interconnect structure 801*a* and the second interconnect structure 803*a* can absorb the electromagnetic radiation in the frequency of about 5 GHz to about 15 GHz emitted from the source 805. In some embodiments, the first interconnect structure 801*a* and the second interconnect structure 803*a* are configured to optimize an absorption of the electromagnetic radiation in the predetermined frequency, such that an electrical interference between the source 805 and other electrical component or source is in a minimal, and therefore a noise is reduced or prevented and a performance of the semiconductor structure 800 is improved.

Figure 25:
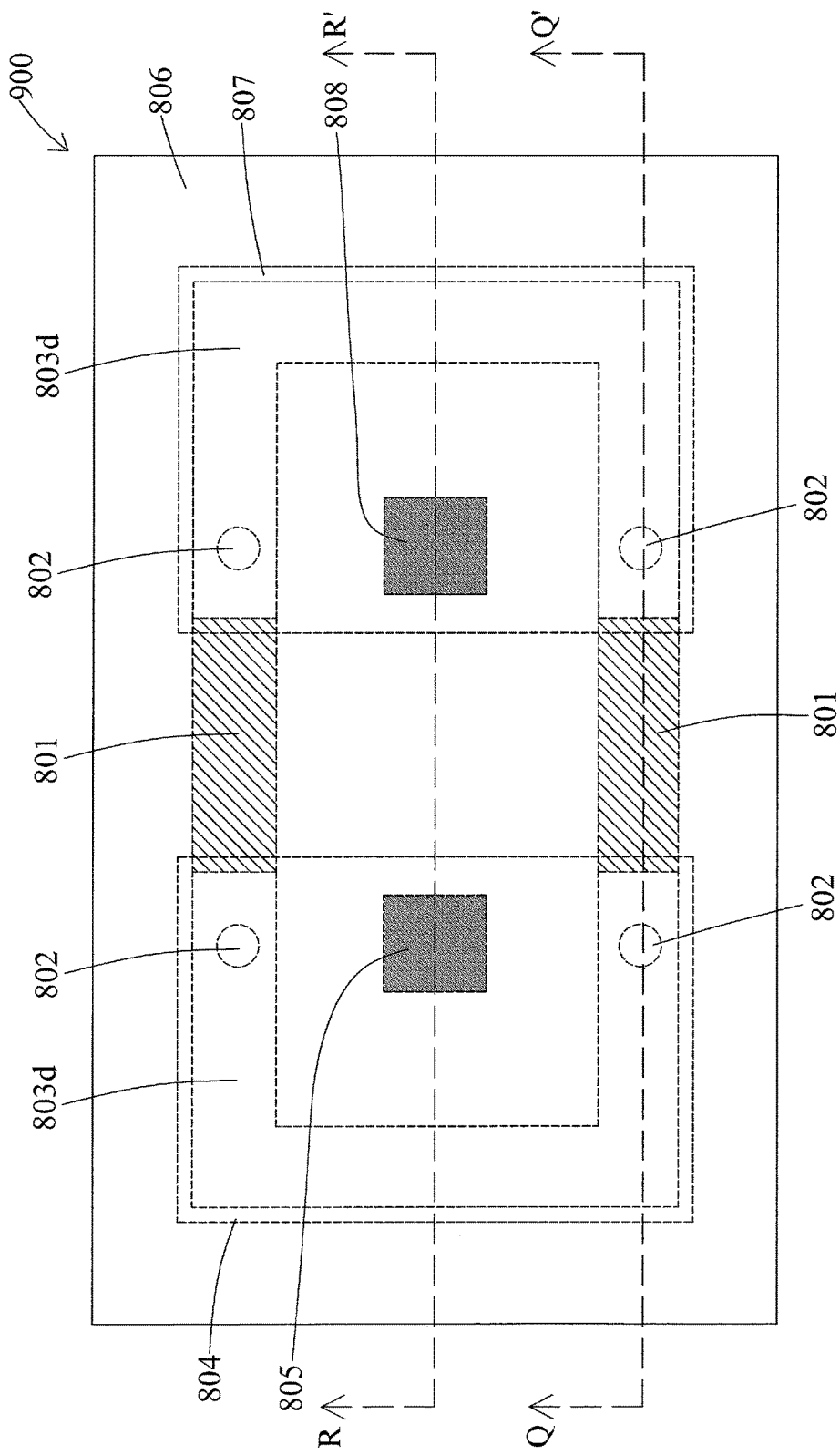
FIG. 25 is a schematic top view of a semiconductor structure in accordance with some embodiments of the present disclosure.
Figure 26:
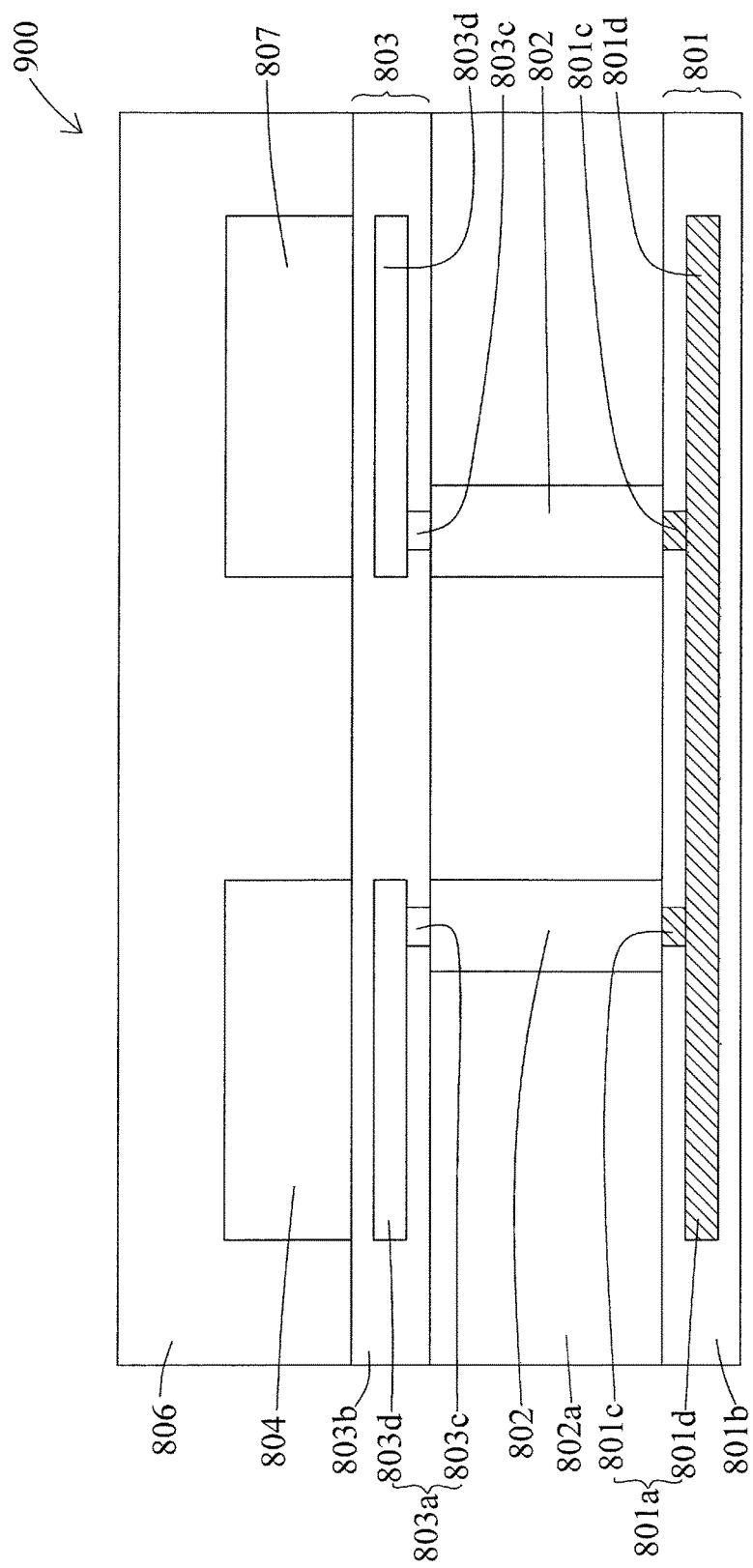
FIG. 26 is a schematic cross sectional view of a semiconductor structure along QQ' of FIG. 25 in accordance with some embodiments of the present disclosure.
Figure 27:
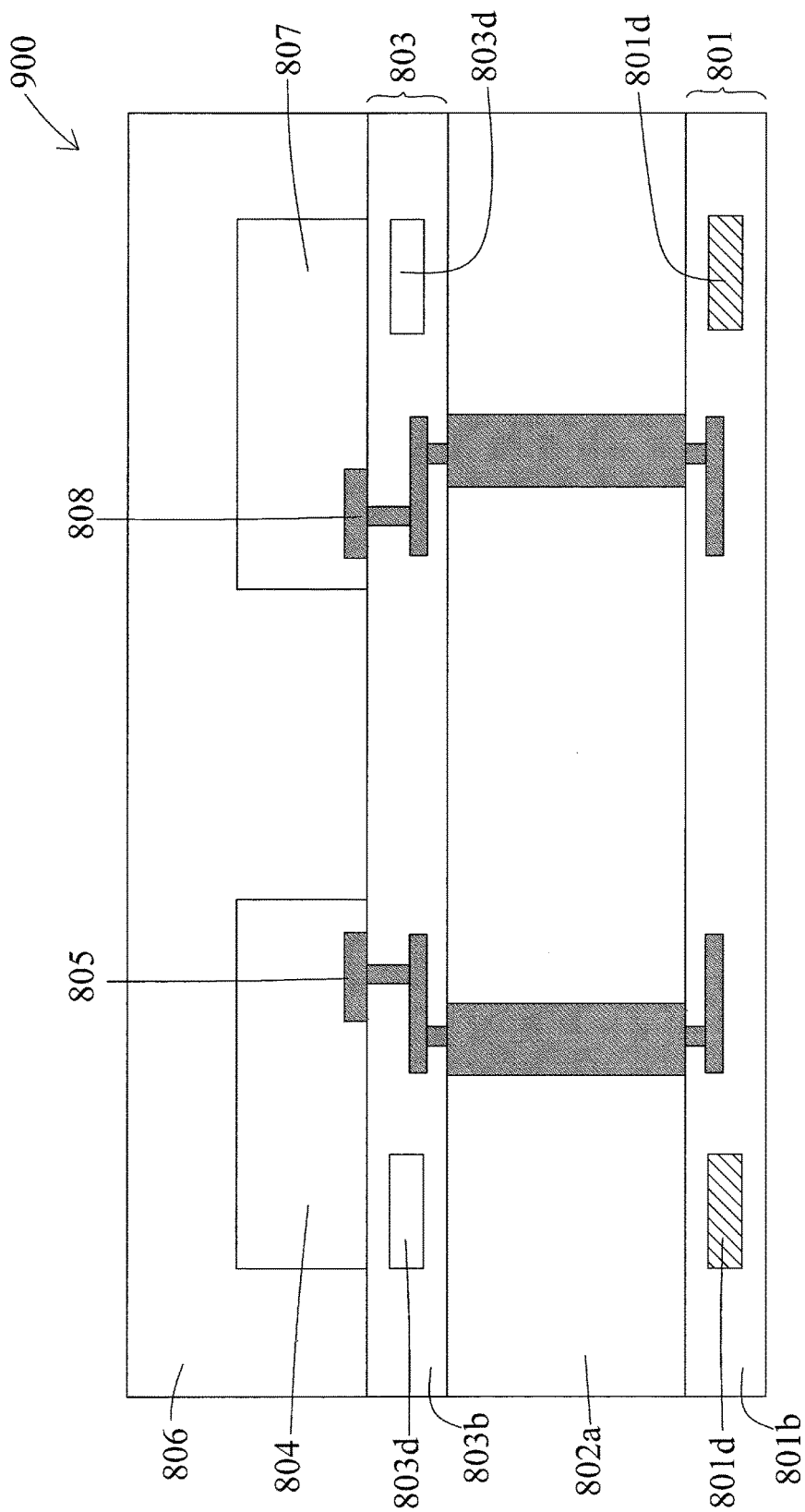
FIG. 27 is a schematic cross sectional view of a semiconductor structure along RR' of FIG. 25 in accordance with some embodiments of the present disclosure.
Figure 28:
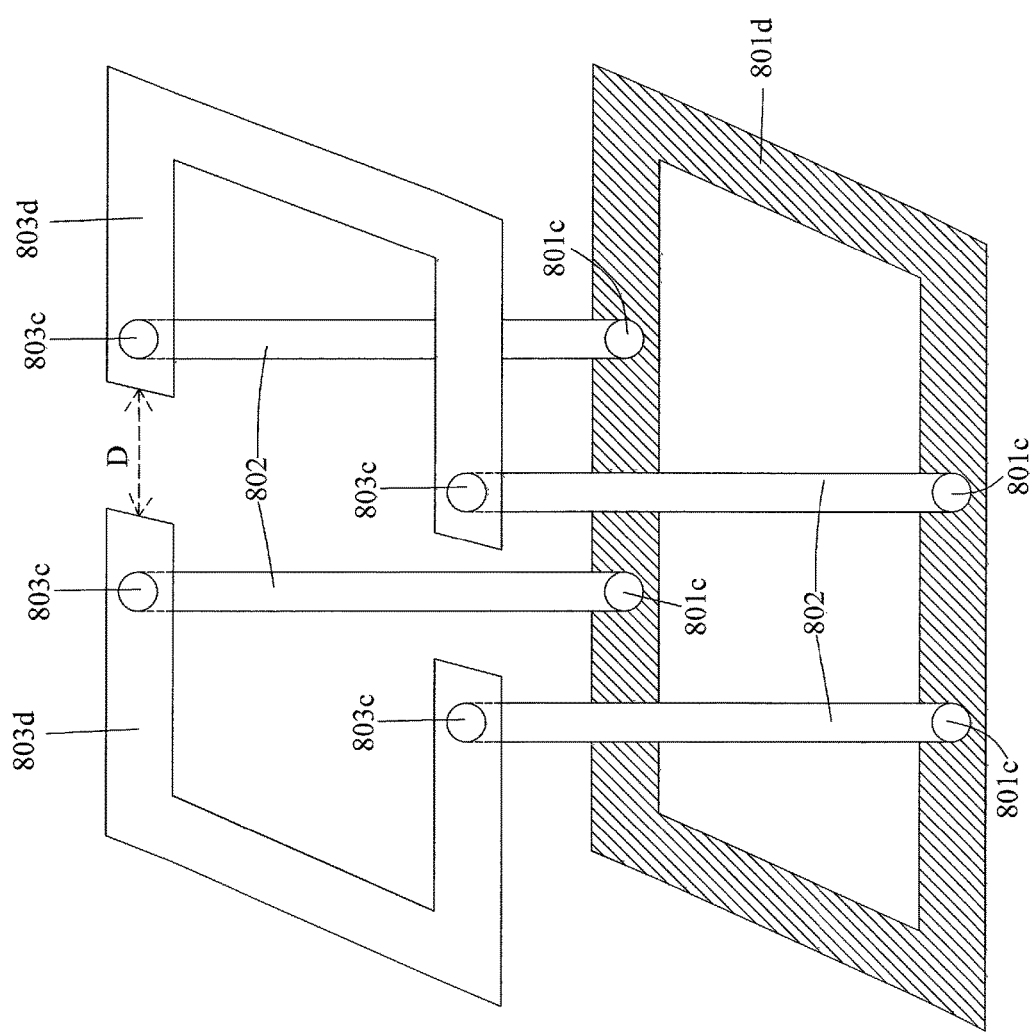
FIG. 28 is a schematic exploded view of a semiconductor structure of FIGS. 25-27 in accordance with some embodiments of the present disclosure.

FIGS. 25-27 are an embodiment of a semiconductor structure 900. FIG. 25 is a schematic top view of the semiconductor structure 900. FIG. 26 is a schematic cross sectional view of the semiconductor structure 900 along QQ' of FIG. 25. FIG. 27 is a schematic cross sectional view of the semiconductor structure 900 along RR' of FIG. 25. In some embodiments, the semiconductor structure 900 includes a first RDL 801, a via 802, a second RDL 803, a first die 804, a second die 807, a source 805, a component 808 and a molding 806. FIG. 28 is a schematic exploded view of the semiconductor structure 900 including the first interconnect structure 801*a*, the second interconnect structure 803*a* and the via 802 coupling the first interconnect structure 801*a* with the second interconnect structure 803*a*.

In some embodiments, the first RDL 801 includes a first interconnect structure 801*a* and a first dielectric layer 801*b*. In some embodiments, the first interconnect structure 801*a* is surrounded by the first dielectric layer 801*b*. In some embodiments, the first interconnect structure 801*a* includes conductive material such as copper, aluminum or etc. In some embodiments, the first interconnect structure 801 includes several via portions 801*c* and a land portion 801*d* coupled with the via portions 801*c*. In some embodiments, each of the via portions 801*c* extends from the land portion 801*d* through the first dielectric layer 801*b*. In some embodiments, the land portion 801*d* extends within the first dielectric layer 801*b*. In some embodiments, the land portion 801*d* is extended in various shapes such as a strip, a frame, an annular shape, C shape, closed loop shape, etc.

In some embodiments, several vias 802 are disposed over, extended from and electrically connected with the via portions 801*c* of the first RDL 801 respectively. In some embodiments, the vias 802 extend through a third dielectric layer 802*a* disposed over the first RDL 801. In some embodiments, the vias 802 electrically connects with the first interconnect structure 801*a* of the first RDL 801. In some embodiments, the via 802 includes conductive material such as copper, etc. In some embodiments, the via 802 is a through integrated fan out via. In some embodiments, the via 802 has a height of about 500 um or a diameter of about 100 um.

In some embodiments, the second RDL 803 includes a second interconnect structure 803*a* and a second dielectric layer 803*b*. In some embodiments, the second interconnect structure 803*a* is surrounded by the second dielectric layer 803*b*. In some embodiments, the second dielectric layer 803*b* is disposed over the third dielectric layer 802*a* and the via 802. In some embodiments, the second interconnect structure 803*a* includes conductive material such as copper, aluminum or etc. In some embodiments, the second interconnect structure 803 includes several via portions 803*c* and more than one land portions 803*d* coupled with the via portions 803*c*. In some embodiments, the via portion 803*c* extends from the land portion 803*d* through the second dielectric layer 803*b*. In some embodiments, the land portion 803*d* extends within the second dielectric layer 803*b*. In some embodiments, the land portion 803*d* is extended in various shapes such as a strip, a frame, an annular shape, C shape, etc. In some embodiments, the land portion 803*d* includes two portions distanced from each other in a distance D of about 75 um to about 300 um. In some embodiments, the distance between the two portions of the land portion 803*d* is about 175 um. In some embodiments, the land portions 803*d* are in two half C shapes. In some embodiments, the first interconnect structure 801*a* is substantially same or different from the second interconnect structure 803*a*. In some embodiments, the first dielectric layer 801*b* is substantially same or different from the second dielectric layer 803*b* or the third dielectric layer 802*a*.

In some embodiments, the second interconnect structure 803*a* electrically connects with the first conductive structure 801*a* by the vias 802. In some embodiments, the vias 802 extend between the first RDL 801 and the second RDL 803. In some embodiments, the vias 802 electrically connects the first interconnect structure 801*a* with the second interconnect structure 803*a*. In some embodiments, the first interconnect structure 801*a* and the second interconnect structure 803*a* are aligned and disposed opposite to each other.

In some embodiments, the first die 804 and the second die 807 are disposed over the second RDL 803. In some embodiments, the first die 804 and the second die 807 include semiconductive material such as silicon and are fabricated with predetermined functional circuits. In some embodiments, the first die 804 or the second die 807 is singulated from a silicon wafer by a mechanical or laser blade and then is disposed over the second dielectric layer 803*b*. In some embodiments, the first die 804 or the second die 807 is in a quadrilateral, a rectangular or a square shape. In some embodiments, the molding 806 is disposed over the second RDL 803 and covers the first die 804 and the second die 807.

In some embodiments, the source 805 is disposed within the first die 804 and the second RDL 803 or is disposed within the first RDL 801, the second RDL 803 and the third dielectric layer 802*a* and the first die 804. In some embodiments, the component 808 is disposed within the second die 807 and the second RDL 803 or is disposed within the first RDL 801, the second RDL 803 and the third dielectric layer 802*a* and the second die 807. In some embodiments, the source 805 and the component 808 are electrically connected with the first die 804 and the second die 807 respectively. In some embodiments, a first portion of the source 805 and a first portion of the component 807 are surrounded by the first interconnect structure 801*a* of the first RDL 801. In some embodiments, a second portion of the source 805 and a second portion of the component 808 are partially surrounded by the second interconnect structure 803*a* of the second RDL 803.

In some embodiments, the source 805 is configured to emit an electromagnetic radiation such as radio wave. In some embodiments, the source 805 emit the electromagnetic radiation in a radio frequency (RF) such as lower than about 300 GHz, a range of about 3 kHz to about 300 GHz, etc. for wireless communication. In some embodiments, the source 805 is in a patch shape, spiral shape or other suitable shapes. In some embodiments, the first interconnect structure 801*a* of the first RDL 801 and the second interconnect structure 803*a* of the second RDL 803 are configured to absorb the electromagnetic radiation emitted from the source 805. In some embodiments, the first interconnect structure 801*a* and the second interconnect structure 803*a* are in cooperation to absorb the electromagnetic radiation emitted from the source 805 in a predetermined frequency. In some embodiments, the first interconnect structure 801*a* and the second interconnect structure 803*a* can absorb the electromagnetic radiation in the predetermined frequency of about 5 GHz to about 15 GHz emitted from the source 805. In some embodiments, the first interconnect structure 801*a* and the second interconnect structure 803*a* are configured to optimize an absorption of the electromagnetic radiation emitted from the source 805 in the predetermined frequency, such that an electrical interference between the source 805 and the component 808 is in a minimal, and therefore a noise is reduced or prevented and a performance of the semiconductor structure 900 is improved.

In some embodiments, the source 805 and the component 808 are configured to emit an electromagnetic radiation such as radio wave respectively. In some embodiments, the source 805 and the component 808 emit the electromagnetic radiation in a radio frequency (RF) such as lower than about 300 GHz, a range of about 3 kHz to about 300 GHz, etc. for wireless communication. In some embodiments, the source 805 emits the electromagnetic radiation in the frequency substantially same or different from the frequency of the electromagnetic radiation emitted by the component 808. In some embodiments, the first interconnect structure 801*a* and the second interconnect structure 803*a* are configured to absorb the electromagnetic radiation emitted from the source

805 and the component 808, such that the electromagnetic radiation emitted from the source 805 would not electrically interfere with the electromagnetic radiation emitted from the components 808. In some embodiments, the first interconnect structure 801a and the second interconnect structure 803a are configured to absorb the electromagnetic radiation of the predetermined frequency emitted from the source 805 or the component 808. Thus, the electromagnetic radiation of the predetermined frequency emitted from the source 805 or the component 808 would not electromagnetically interfere or affect the source 805 or the component 808.

Figure 29:
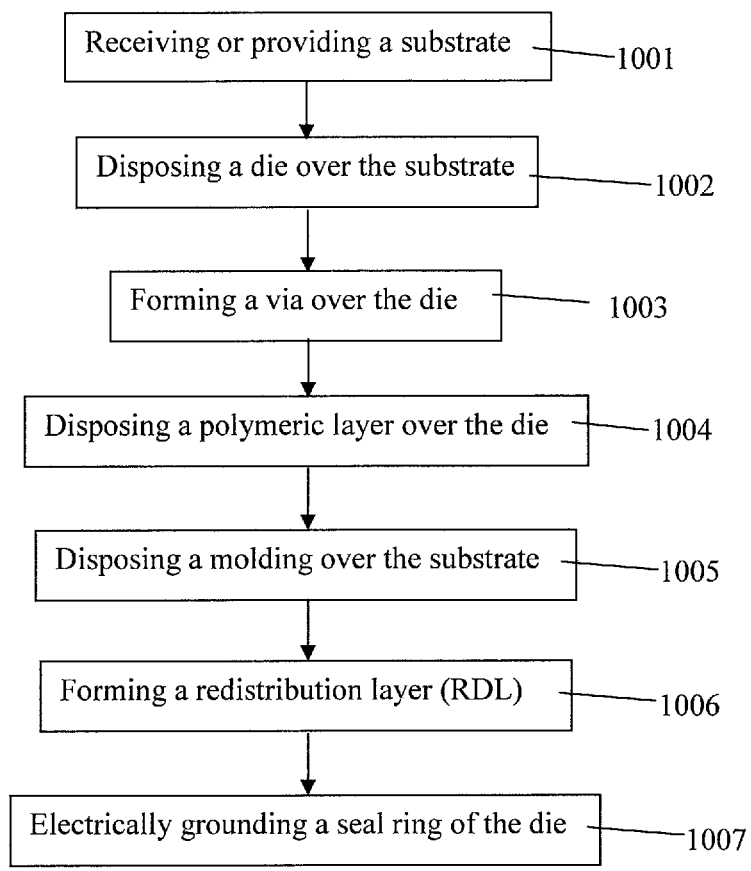
FIG. 29 is a flow diagram of a method of manufacturing a semiconductor structure in accordance with some embodiments of the present disclosure.

In the present disclosure, a method of manufacturing a semiconductor structure (100, 200, 300 or 400) is also disclosed. In some embodiments, a semiconductor structure (100, 200, 300 or 400) is formed by a method 1000. FIG. 29 is an embodiment of the method 1000 of manufacturing the semiconductor structure (100, 200, 300 or 400). The method 1000 includes a number of operations (1001, 1002, 1003, 1004, 1005, 1006 and 1007). The method 1000 includes a number of operations and the description and illustration are not deemed as a limitation as the sequence of the operations.

In operation 1001, a substrate 101 is received or provided as shown in FIG. 30A. In some embodiments, the substrate 101 includes semiconductive material such as silicon, germanium, gallium, arsenic, and combinations thereof. In some embodiments, the substrate 101 is a silicon substrate. In some embodiments, the substrate 101 includes a variety of electrical components formed over or within the substrate 101 by several fabrication operations. In some embodiments, the substrate 101 has similar configuration as described above or illustrated in any one of FIGS. 1-12.

In operation 1002, a die (a first die 102 or a second die 302) is disposed over the substrate 101 as shown in FIG. 30B. In some embodiments, the first die 102 is disposed over the substrate 101 by a first adhesive 102d, or the second die 302 is disposed over the substrate 101 by a second adhesive 302d. In some embodiments, the first die 102 and the second die 302 are disposed simultaneously, or the second die 302 is disposed after disposing the first die 102 or vice versa. In some embodiments, the first die 102 and the second die 302 include semiconductive material such as silicon. In some embodiments, the first die 102 and the second die 302 are same or different from each other in various aspects such as size, dimension, shapes, functions, circuitries, etc. In some embodiments, the first die 102 and the second die 302 are fabricated to include same or different electrical components and structures to perform same or different functions.

In some embodiments, the first die 102 includes a first die pad 102a disposed over the substrate 101 and a first seal ring 102b formed at a periphery of the first die 102 and electrically connected with the first die pad 102a. In some embodiments, a first passivation 102c is disposed over the first die 102 and covers a portion of the first die pad 102a. In some embodiments, the second die 302 includes a second die pad 302a disposed over the substrate 101 and a second seal ring 302b formed at a periphery of the second die 302 and electrically connected with the second die pad 302a. In some embodiments, a second passivation 302c is disposed over the second die 302 and covers a portion of the second t die pad 302a. In some embodiments, the die (the first die 102 or the second die 302) has similar configuration as described above or illustrated in any one of FIGS. 1-12.

In operation 1003, a via (a first via 106 or a second via 306) is formed over the die (the first die 102 or the second die 302) as shown in FIG. 30C. In some embodiments, the first via 106 is disposed over the first die pad 102a of the first die 102. In some embodiments, the second via 306 is disposed over the second die pad 302a of the second die 302.

In some embodiments, the via (the first via 106 or the second via 306) is formed by any suitable operations such as sputtering, electroplating, etc. In some embodiments, the via (a first via 106 or a second via 306) is formed by disposing a conductive material over the first die pad 102a. In some embodiments, the first via 106 is substantially same or different from the second via 306. In some embodiments, the first via 106 and the second via 306 are formed simultaneously or one by one. In some embodiments, the first via 106 is electrically connected with the first die pad 102a and the first seal ring 102b. In some embodiments, the second via 306 is electrically connected with the second die pad 302a and the second seal ring 102b. In some embodiments, the via (the first via 106 or the second via 306) has similar configuration as described above or illustrated in any one of FIGS. 1-12.

Figure 30D:
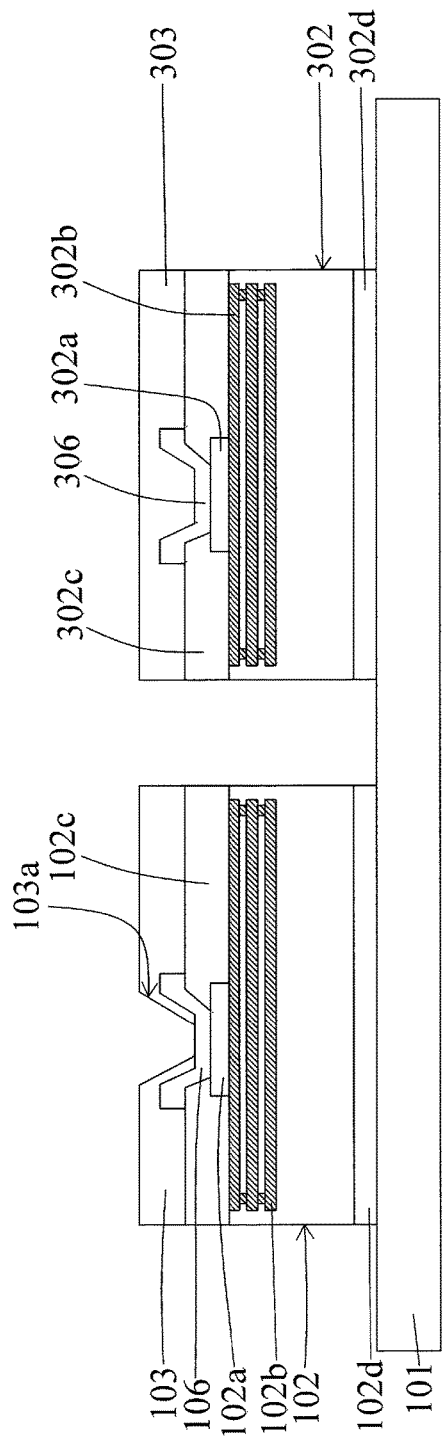

In operation 1004, a polymeric layer (a first polymeric layer 103 or a second polymeric layer 303) is disposed over the die (the first die 102 or the second die 302) as shown in FIG. 30D. In some embodiments, the first polymeric layer 103 is disposed over the first die 102 and covers the first via 106. In some embodiments, the second polymeric layer 303 is disposed over the second die 302 and covers the second via 306. In some embodiments, the first polymeric layer 103 and the second polymeric layer 303 are same or different from each other in various aspects such as materials. In some embodiments, the first polymeric layer 103 and the second polymeric layer 303 are disposed simultaneously or one by one. In some embodiments, the first polymeric layer 103 is patterned to form a recess 103a. The recess 103a exposes a portion of the first via 106 for receiving a conductive structure in subsequent operations. In some embodiments, the recess 103a is formed by photolithography and etching operations. In some embodiments, the polymeric layer (the first polymeric layer 103 or the second polymeric layer 303) has similar configuration as described above or illustrated in any one of FIGS. 1-12.

Figure 30E:
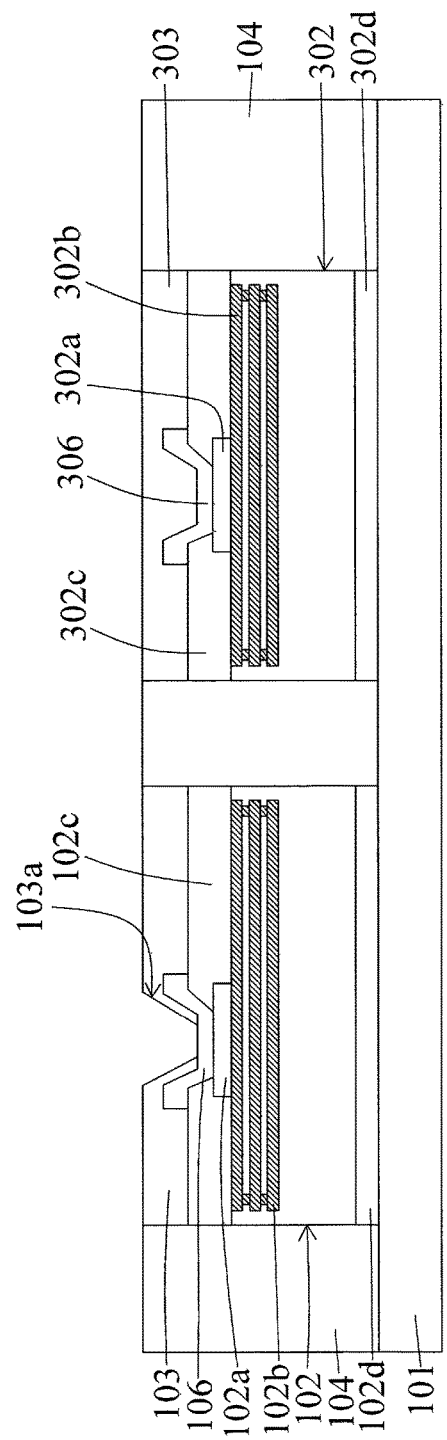

In operation 1005, a molding 104 is disposed over the substrate 101 as shown in FIG. 30E. In some embodiments, the molding 104 is disposed over the substrate and surrounds the die (the first die 102 or the second die 302). In some embodiments, the molding 104 has similar configuration as described above or illustrated in any one of FIGS. 1-12.

In operation 1006, a redistribution layer (RDL) 105 is formed as shown in FIGS. 30F and 30G or 30H and 30I. In some embodiments, the RDL 105 is disposed over the die (the first die 102 or the second die 302). In some embodiments, the RDL 105 includes an interconnect structure 105a and a dielectric layer 105d surrounding the interconnect structure 105a. In some embodiments, the dielectric layer 105d covers the molding 104, the polymeric layer (the first polymeric layer 103 or the second polymeric layer 303) and the interconnect structure 105a. In some embodiments, the interconnect structure 105a is formed over and electrically connected with the first via 106 so that the interconnect structure 105a, the first via 106, the first die pad 102 and the first seal ring 102b are electrically connected. In some embodiments, the interconnect structure 105a includes a via portion 105b and a land portion 105c coupled with the via portion 105b. In some embodiments, the via portion 105b contacts with the portion of the first via 106 exposed from the first polymeric layer 103. In some embodiments, the land portion 105c extends within the dielectric layer 105d and over a central portion of the first die 102 as shown in FIG. 30G (a top view of FIG. 30F) or along a periphery of the first die 102 as shown in FIG. 30I (a top view of FIG. 30H). In some embodiments, the RDL 105 has similar configuration as described above or illustrated in any one of FIGS. 1-12.

In operation 1007, the first seal ring 102b is configured for grounding or is connectable to ground as shown in FIGS. 30F and 30G or 30H and 30I. In some embodiments, the first seal ring 102b is connected to ground. In some embodiments, the interconnect structure 105a of the RDL 105 is connected to ground. In some embodiments, the interconnect structure 105a, the first via 106, the first die pad 102a are electrically grounded when the first seal ring 102b is electrically grounded or connected to ground.

Figure 31:
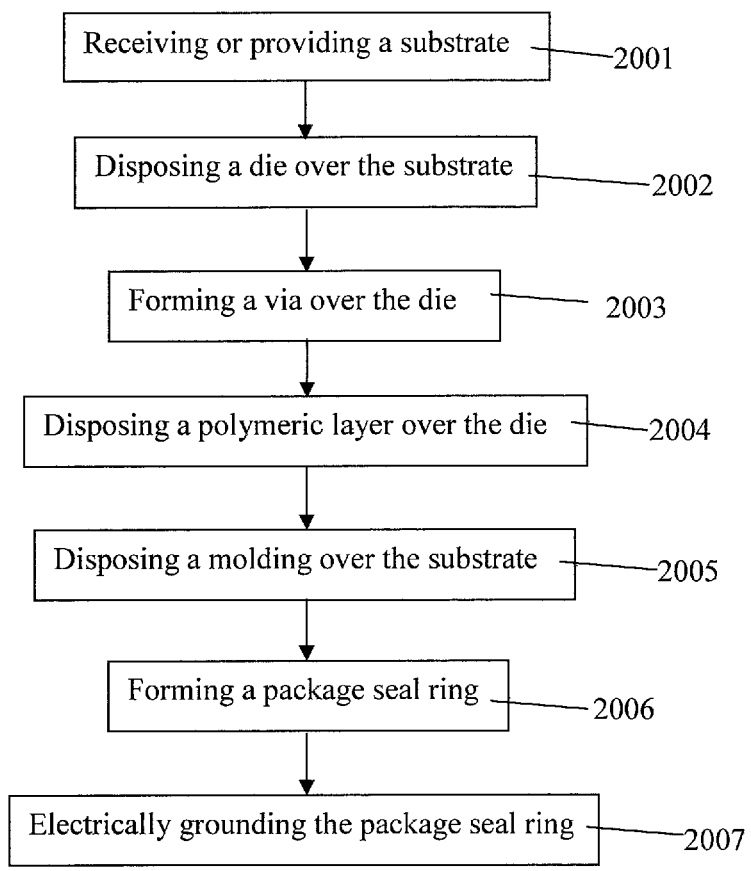
FIG. 31 is a flow diagram of a method of manufacturing a semiconductor structure in accordance with some embodiments of the present disclosure.

In the present disclosure, a method of manufacturing a semiconductor structure 500 is also disclosed. In some embodiments, a semiconductor structure 500 is formed by a method 2000. FIG. 31 is an embodiment of the method 2000 of manufacturing the semiconductor structure 500. The method 2000 includes a number of operations (2001, 2002, 2003, 2004, 2005, 2006 and 2007). The method 2000 includes a number of operations and the description and illustration are not deemed as a limitation as the sequence of the operations.

In operation 2001, a substrate 101 is received or provided as shown in FIG. 32A. In some embodiments, the operation 2001 is similar to the operation 1001. In operation 2002, a die (a first die 102 or a second die 302) is disposed over the substrate 101 as shown in FIG. 32B. In some embodiments, the operation 2002 is similar to the operation 1002. In operation 2003, a via (a first via 106 or a second via 306) is formed over the die (the first die 102 or the second die 302) as shown in FIG. 32C. In some embodiments, the operation 2003 is similar to the operation 1003. In operation 2004, a polymeric layer (a first polymeric layer 103 or a second polymeric layer 303) is disposed over the die (the first die 102 or the second die 302) as shown in FIG. 32D. In some embodiments, the operation 2004 is similar to the operation 1004. In operation 2005, a molding 104 is disposed over the substrate 101 as shown in FIG. 32E. In some embodiments, the operation 2005 is similar to the operation 1005.

In operation 2006, a package seal ring is formed as shown in FIGS. 32F and 32G. In some embodiments, the package seal ring 502 is formed over the molding 104. In some embodiments, the package seal ring 502 is disposed within a dielectric layer and is extended along a periphery of a semiconductor structure 500. In some embodiments, the package seal ring 502 at least partially surrounds the first die 102 and the second die 302. In some embodiments, the package seal ring 502 is disposed between the first die 102 and the second die 302. In some embodiments, the package seal ring 502 includes conductive material such as copper, aluminum, silver, etc. In some embodiments, the package seal ring 502 is configured for grounding or is connectable to ground. In some embodiments, the package seal ring 502 is connected to ground (as illustrated in FIG. 32G which is a top view of FIG. 32F). Thus, the package seal ring 502 can electrically isolate the first die 102 from the second die 302. An electrical or electromagnetic interference between the first die 102 and the second die 302 could be minimized or prevented. In some embodiments, an electrical component 501 is disposed over the first die 102.

Figure 33:
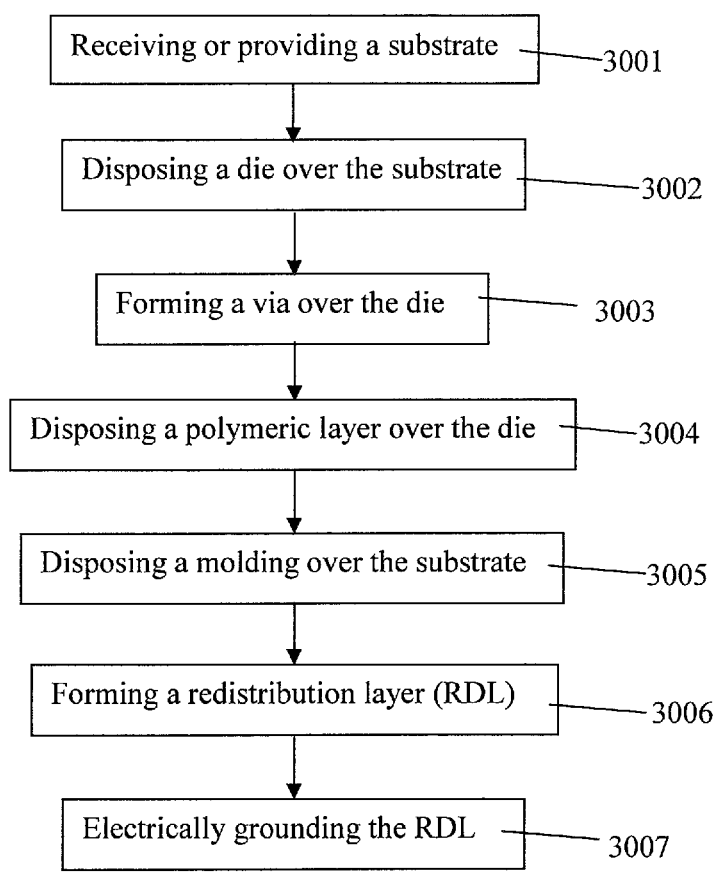
FIG. 33 is a flow diagram of a method of manufacturing a semiconductor structure in accordance with some embodiments of the present disclosure.

In the present disclosure, a method of manufacturing a semiconductor structure 600 is also disclosed. In some embodiments, a semiconductor structure 600 is formed by a method 3000. FIG. 33 is an embodiment of the method 3000 of manufacturing the semiconductor structure 600. The method 3000 includes a number of operations (3001, 3002, 3003, 3004, 3005, 3006 and 3007). The method 3000 includes a number of operations and the description and illustration are not deemed as a limitation as the sequence of the operations.

Figure 34A:
FIGS. 34A-34G are schematic views of manufacturing a semiconductor structure by a method of FIG. 33 in accordance with some embodiments of the present disclosure.
Figure 34B:
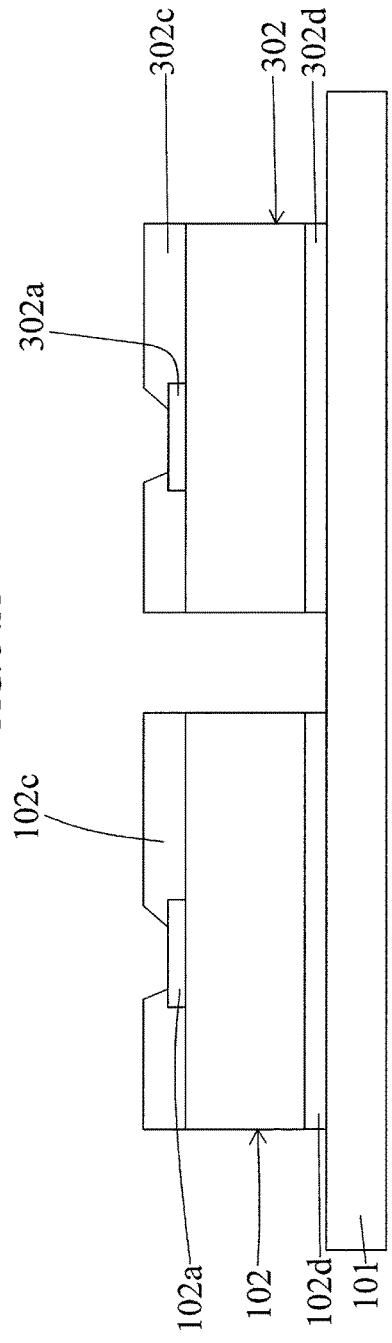
Figure 34C:
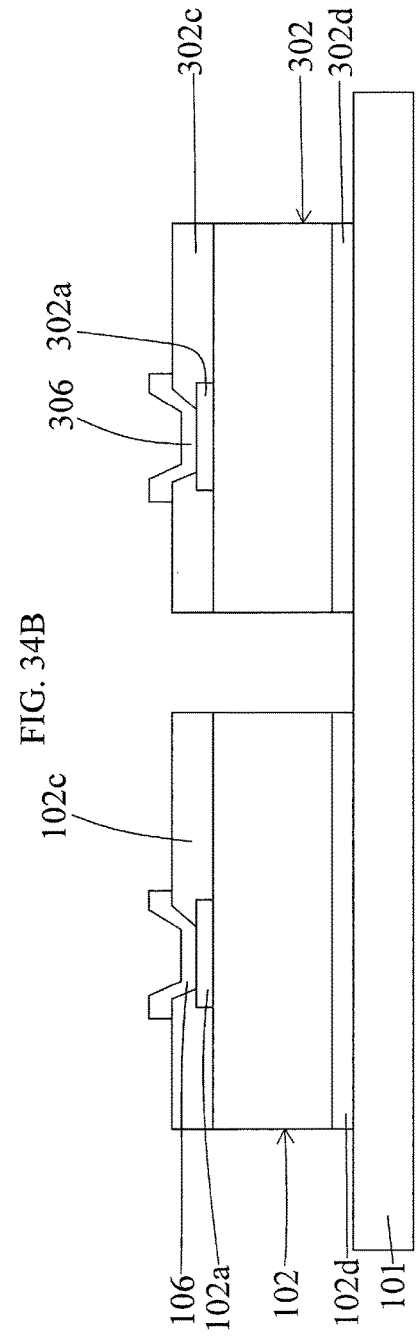
Figure 34D:
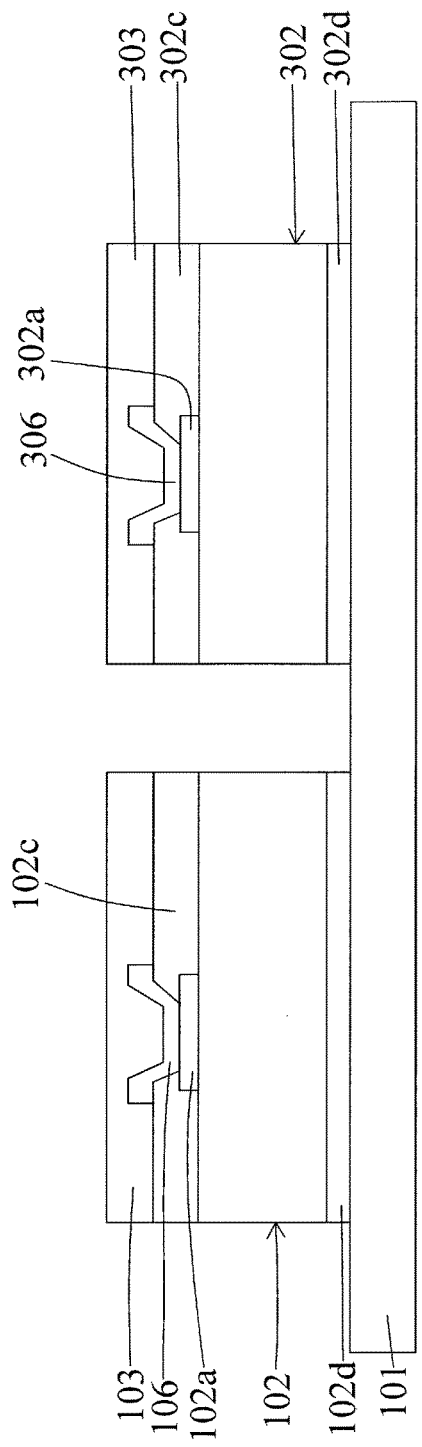
Figure 34E:
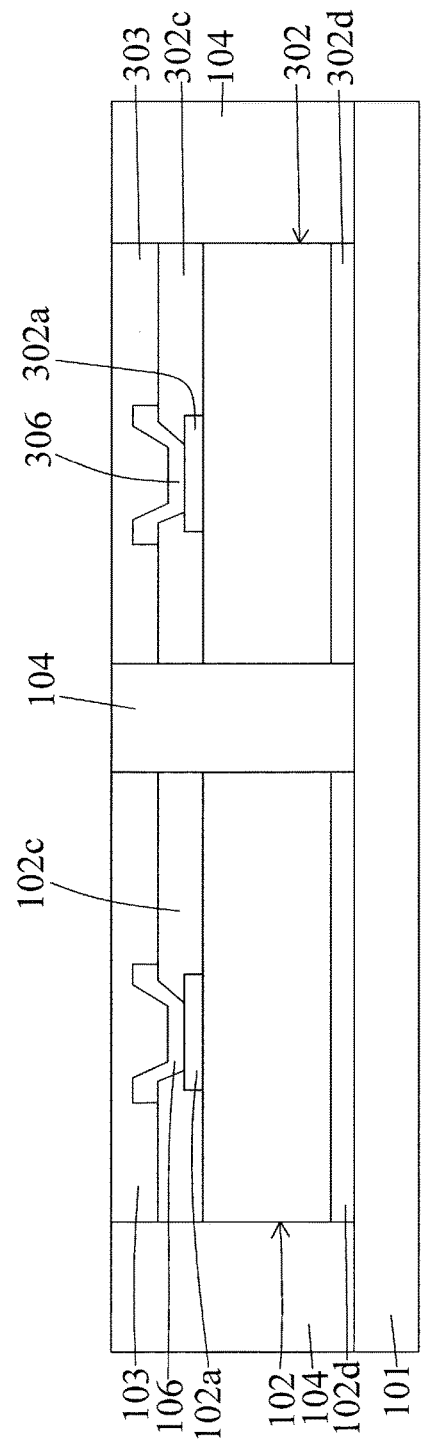

In operation 3001, a substrate 101 is received or provided as shown in FIG. 34A. In some embodiments, the operation 3001 is similar to the operation 1001 or 2001. In operation 3002, a die (a first die 102 or a second die 302) is disposed over the substrate 101 as shown in FIG. 34B. In some embodiments, the operation 3002 is similar to the operation 1002 or 2002. In operation 3003, a via (a first via 106 or a second via 306) is formed over the die (the first die 102 or the second die 302) as shown in FIG. 34C. In some embodiments, the operation 3003 is similar to the operation 1003 or 2003. In operation 3004, a polymeric layer (a first polymeric layer 103 or a second polymeric layer 303) is disposed over the die (the first die 102 or the second die 302) as shown in FIG. 34D. In some embodiments, the operation 3004 is similar to the operation 1004 or 2004. In operation 3005, a molding 104 is disposed over the substrate 101 as shown in FIG. 34E. In some embodiments, the operation 3005 is similar to the operation 1005 or 2005.

Figure 34F:
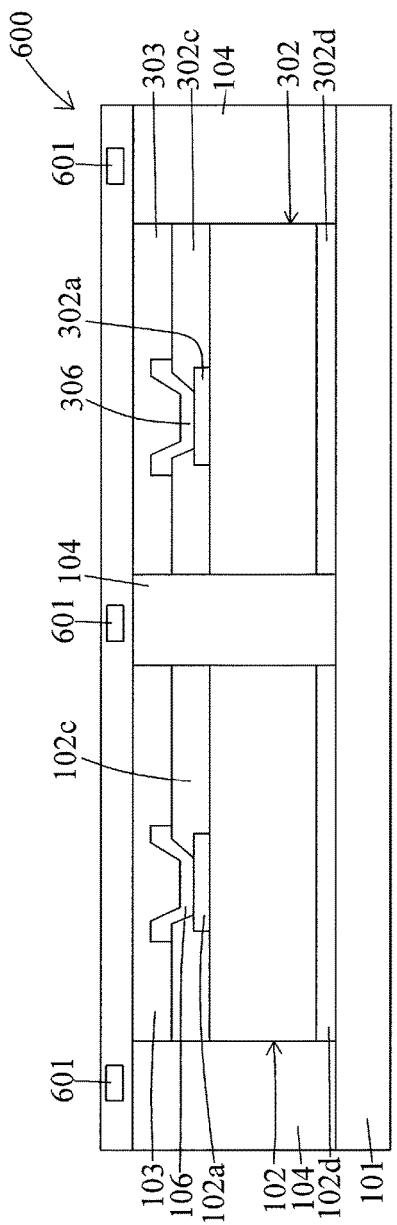
Figure 34G:
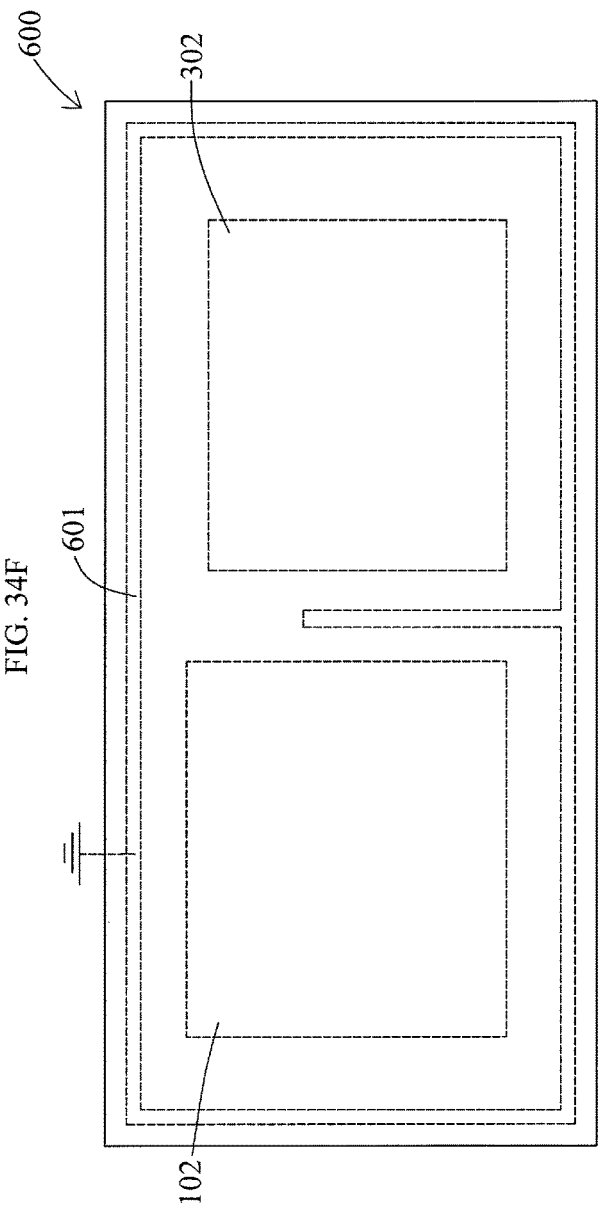

In operation 3006, a package RDL 601 is formed as shown in FIGS. 34F and 34G. The package RDL 601 is disposed over the molding 104. In some embodiments, the package RDL 601 is disposed within a dielectric layer and is extended along a periphery of a semiconductor structure 600. In some embodiments, the package RDL 601 at least partially surrounds the first die 102 and the second die 302. In some embodiments, the package RDL 601 is disposed between the first die 102 and the second die 302. In some embodiments, the package RDL 601 includes conductive material such as copper, aluminum, silver, etc. In some embodiments, the package RDL 601 is formed by any suitable operations such as sputtering, electroplating, etc. In some embodiments, the package RDL 601 is configured for grounding or is connectable to ground. In some embodiments, the package RDL 601 is connected to ground (as illustrated in FIG. 34G which is a top view of FIG. 34F). Thus, the package RDL 601 can electrically isolate the first die 102 from the second die 302. An electrical or electromagnetic interference between the first die 102 and the second die 302 could be minimized or prevented.

Figure 35:
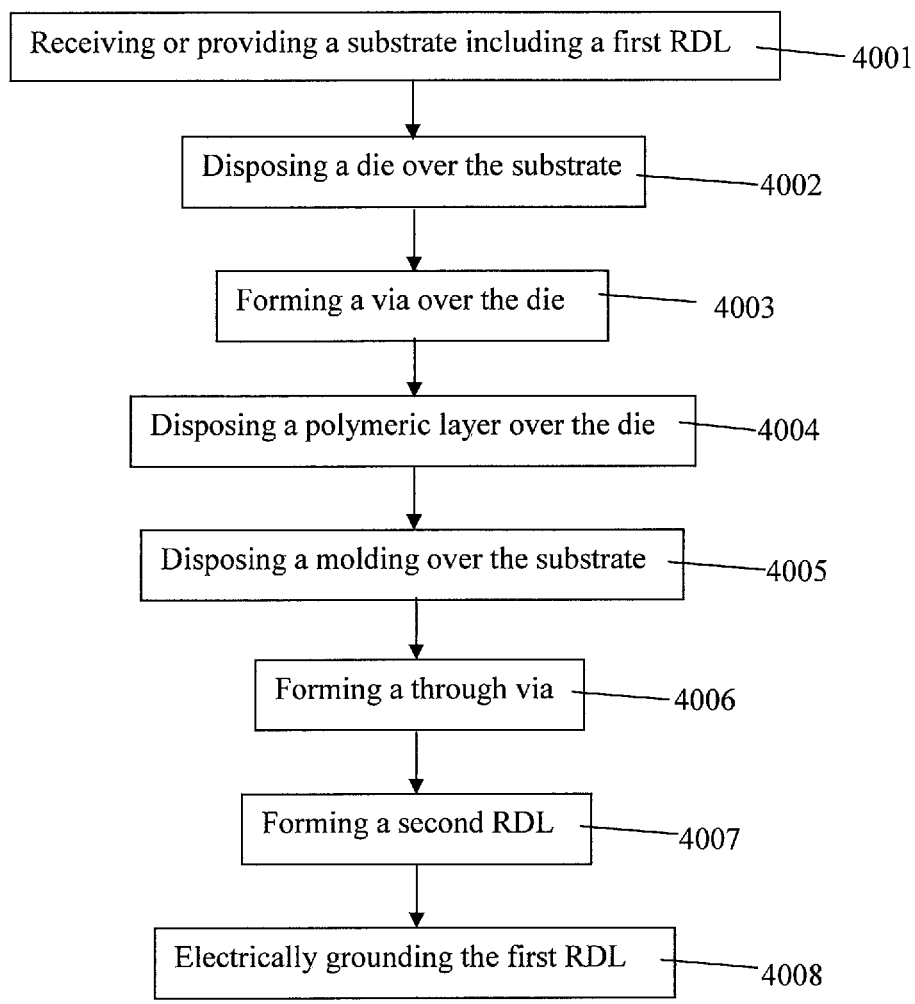
FIG. 35 is a flow diagram of a method of manufacturing a semiconductor structure in accordance with some embodiments of the present disclosure.

In the present disclosure, a method of manufacturing a semiconductor structure 700 is also disclosed. In some embodiments, a semiconductor structure 700 is formed by a method 4000. FIG. 35 is an embodiment of the method 4000 of manufacturing the semiconductor structure 700. The method 4000 includes a number of operations (4001, 4002, 4003, 4004, 4005, 4006, 4007 and 4008). The method 4000 includes a number of operations and the description and illustration are not deemed as a limitation as the sequence of the operations.

Figure 36A:
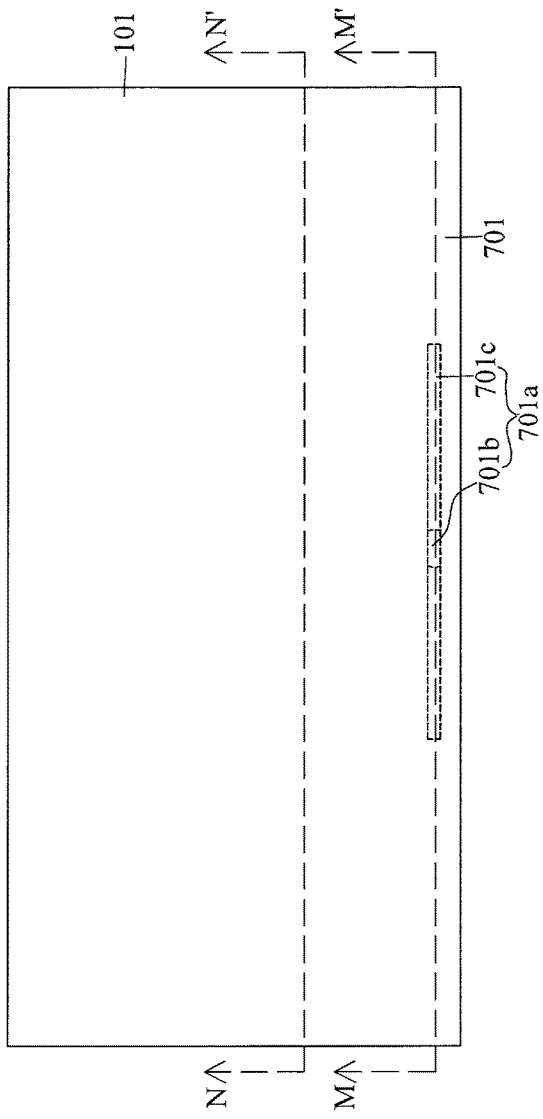
FIGS. 36A-36O are schematic views of manufacturing a semiconductor structure by a method of FIG. 35 in accordance with some embodiments of the present disclosure.
Figure 36B:
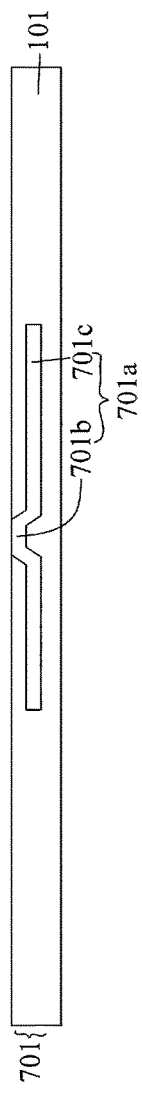
Figure 36C:

In operation 4001, a substrate 101 is received or provided as shown in FIGS. 36A-36C. FIG. 36B is a schematic cross sectional view of FIG. 36A along MM', and FIG. 36C is a schematic cross sectional view of FIG. 36C along NN'. In some embodiments, the substrate 101 includes a first RDL 701. In some embodiments, the first RDL 701 includes a first interconnect structure 701a and a dielectric layer surrounding the first interconnect structure 701a. In some embodiments, the first interconnect structure 701a includes a via portion 701b and a land portion 701c coupled with the via portion 701b. In some embodiments, the land portion 701c is extended along a periphery of the substrate 101. In some embodiments, the via portion 701b is extended through the dielectric layer of the first RDL 701.

Figure 36D:
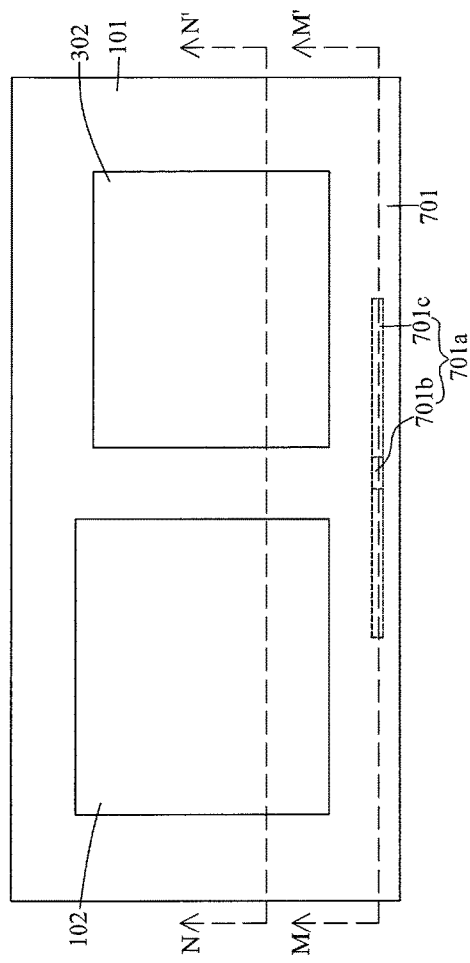
Figure 36E:
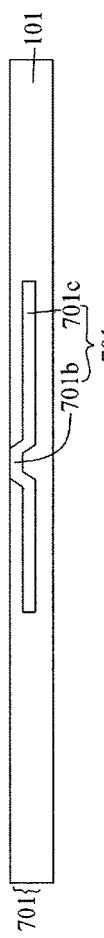
Figure 36F:
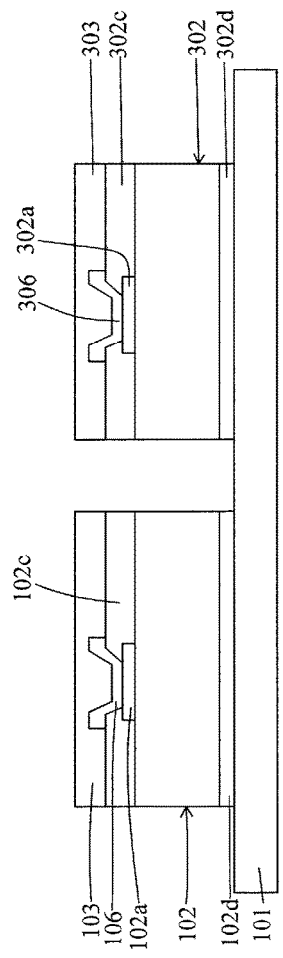
Figure 36G:
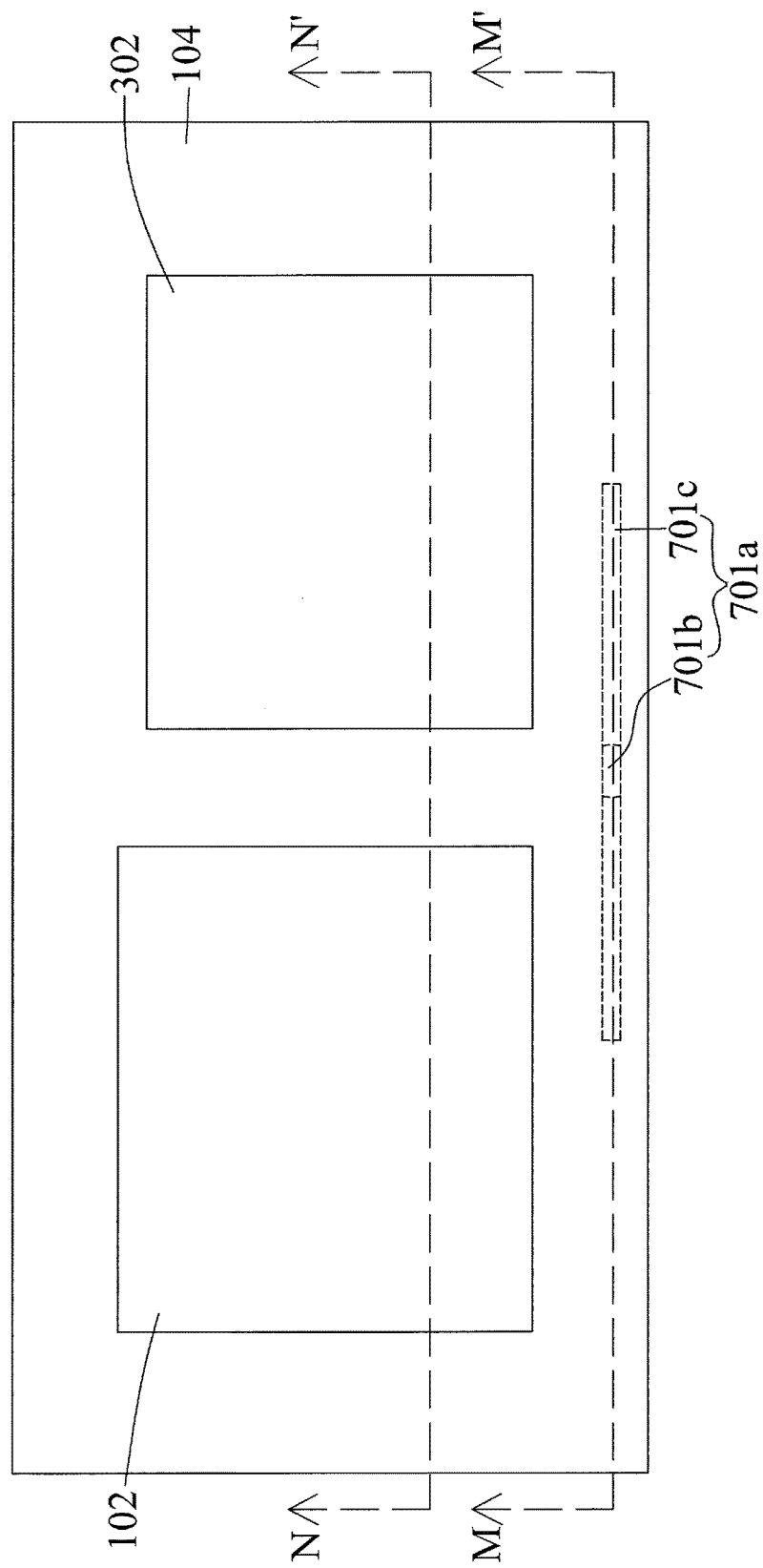
Figure 36H:
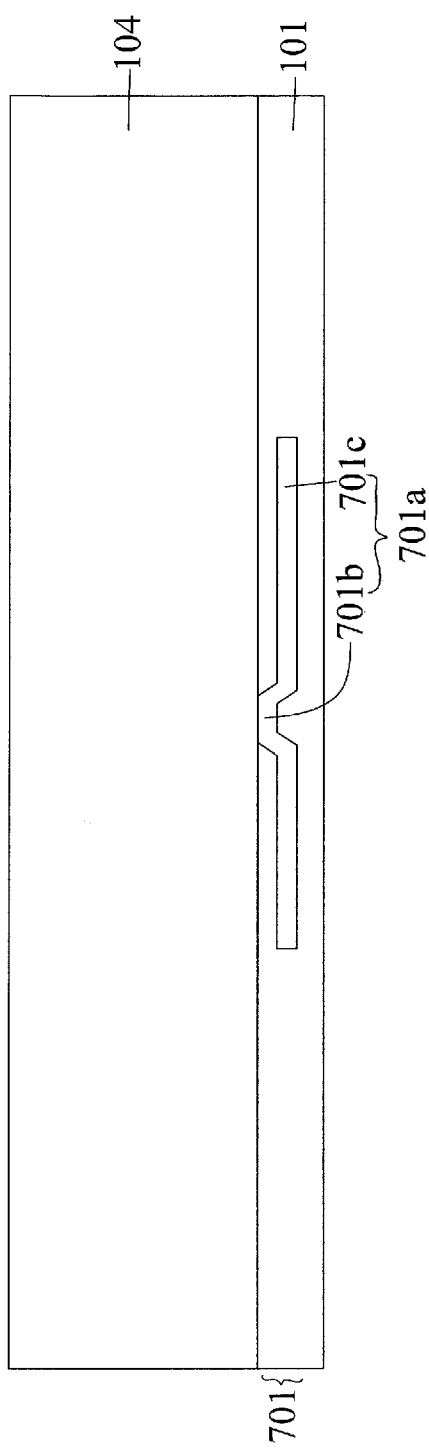
Figure 36I:
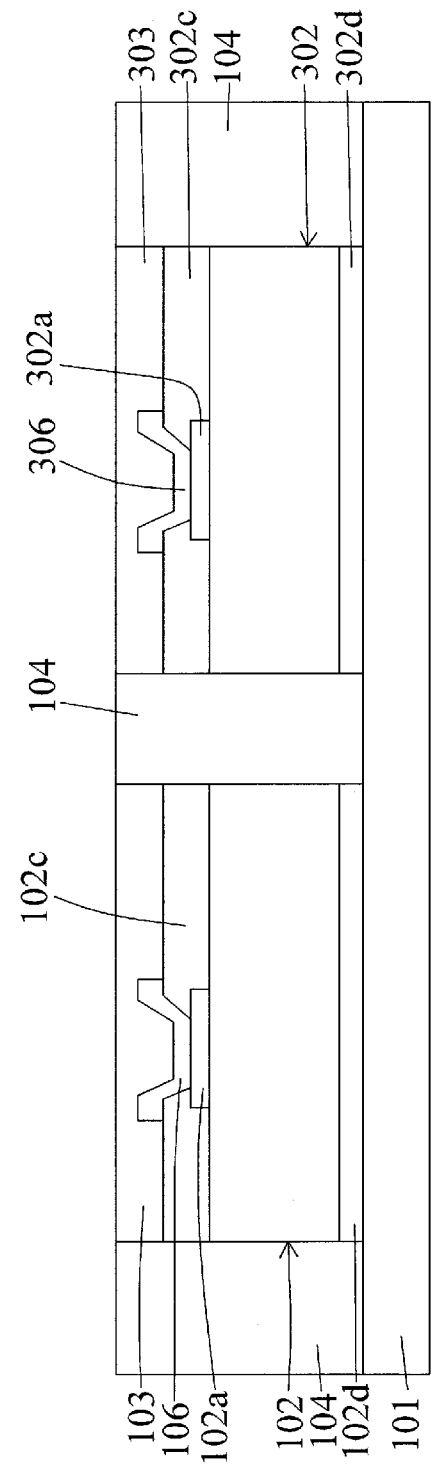

In operation 4002, a die (a first die 102 or a second die 302) is disposed over the substrate 101 as shown in FIGS. 36D-36F. FIG. 36E is a schematic cross sectional view of FIG. 36D along MM', and FIG. 36F is a schematic cross sectional view of FIG. 36D along NN'. In some embodiments, the operation 4002 is similar to the operation 1002, 2002 or 3002. In operation 4003, a via (a first via 106 or a second via 306) is formed over the die (the first die 102 or the second die 302) as shown in FIGS. 36D-36F. In some embodiments, the operation 4003 is similar to the operation 1003, 2003 or 3003. In operation 4004, a polymeric layer (a first polymeric layer 103 or a second polymeric layer 303) is disposed over the die (the first die 102 or the second die 302) as shown in FIGS. 36D-36F. In some embodiments, the operation 4004 is similar to the operation 1004, 2004 or 3004. In operation 4005, a molding 104 is disposed over the substrate 101 as shown in FIGS. 36G-36I. FIG. 36H is a schematic cross sectional view of FIG. 36G along MM', and FIG. 36I is a schematic cross sectional view of FIG. 36G along NN'. In some embodiments, the operation 4005 is similar to the operation 1005, 2005 or 3005.

Figure 36J:
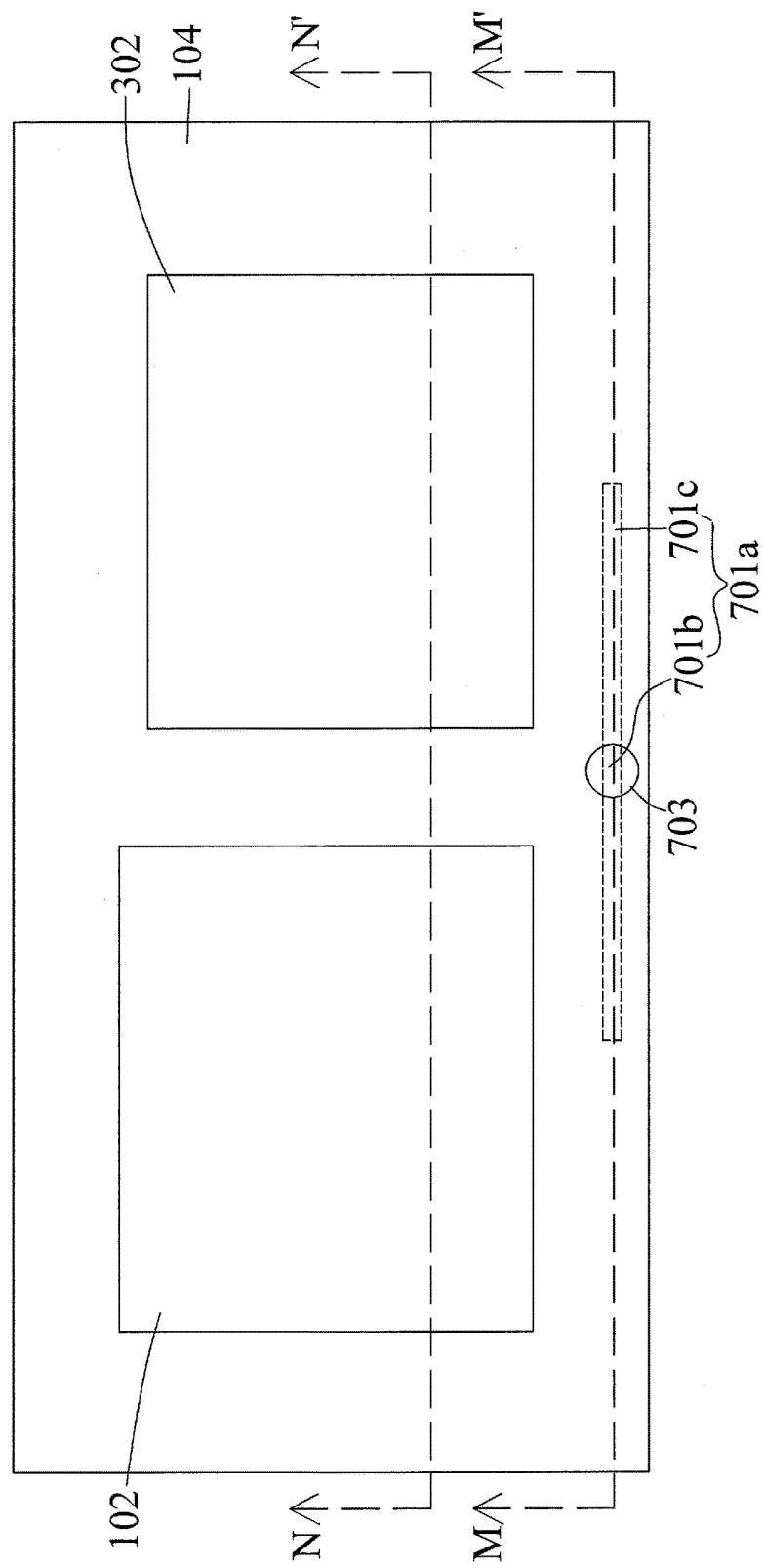
Figure 36K:
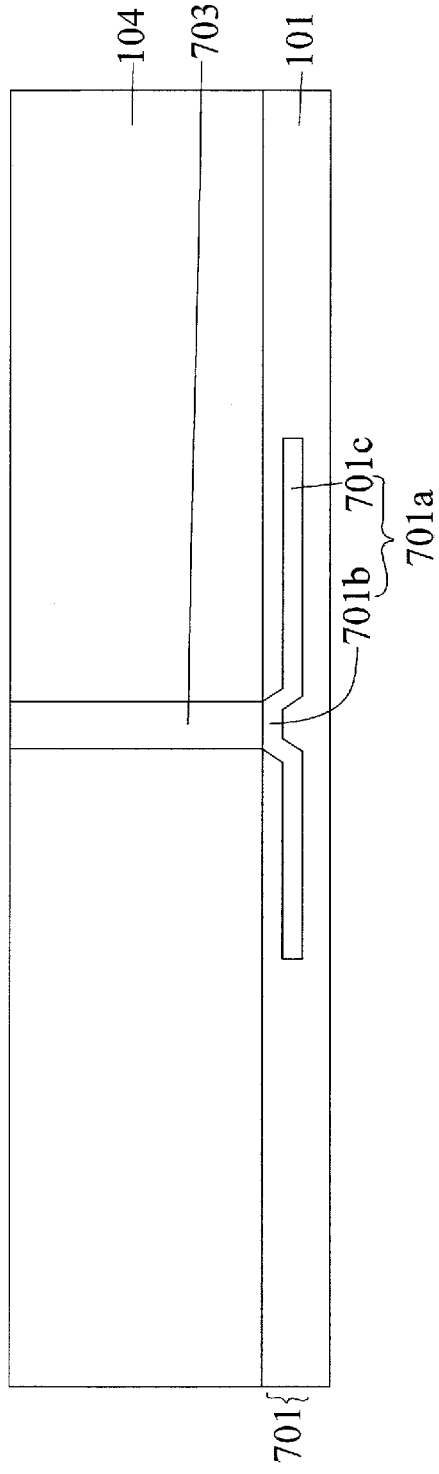
Figure 36L:
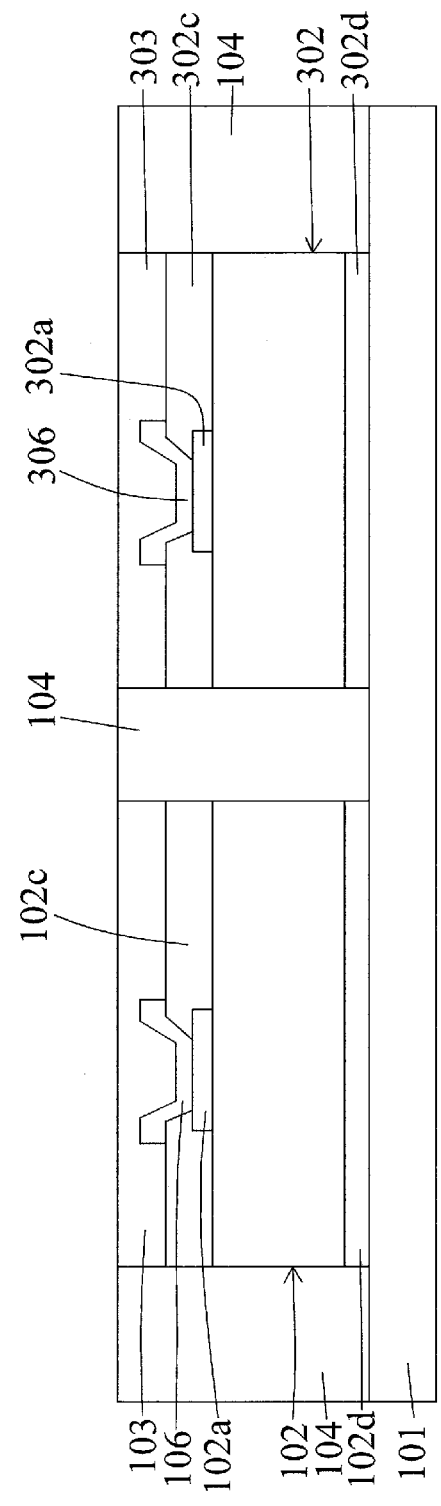

In operation 4006, a through via 703 is formed as shown in FIGS. 36J-36L. FIG. 36K is a schematic cross sectional view of FIG. 36J along MM', and FIG. 36L is a schematic cross sectional view of FIG. 36J along NN'. In some embodiments, the through via 703 is formed by removing a portion of the molding 104 to form an opening and filling a conductive material within the opening In some embodiments, the through via 703 extends from the via portion 701b of the first RDL 701 through the molding 104, so that the first interconnect structure 701a of the first RDL 701 is electrically connected with the through via 703. In some embodiments, the through via 703 is disposed adjacent to the periphery of the substrate 101.

Figure 36M:
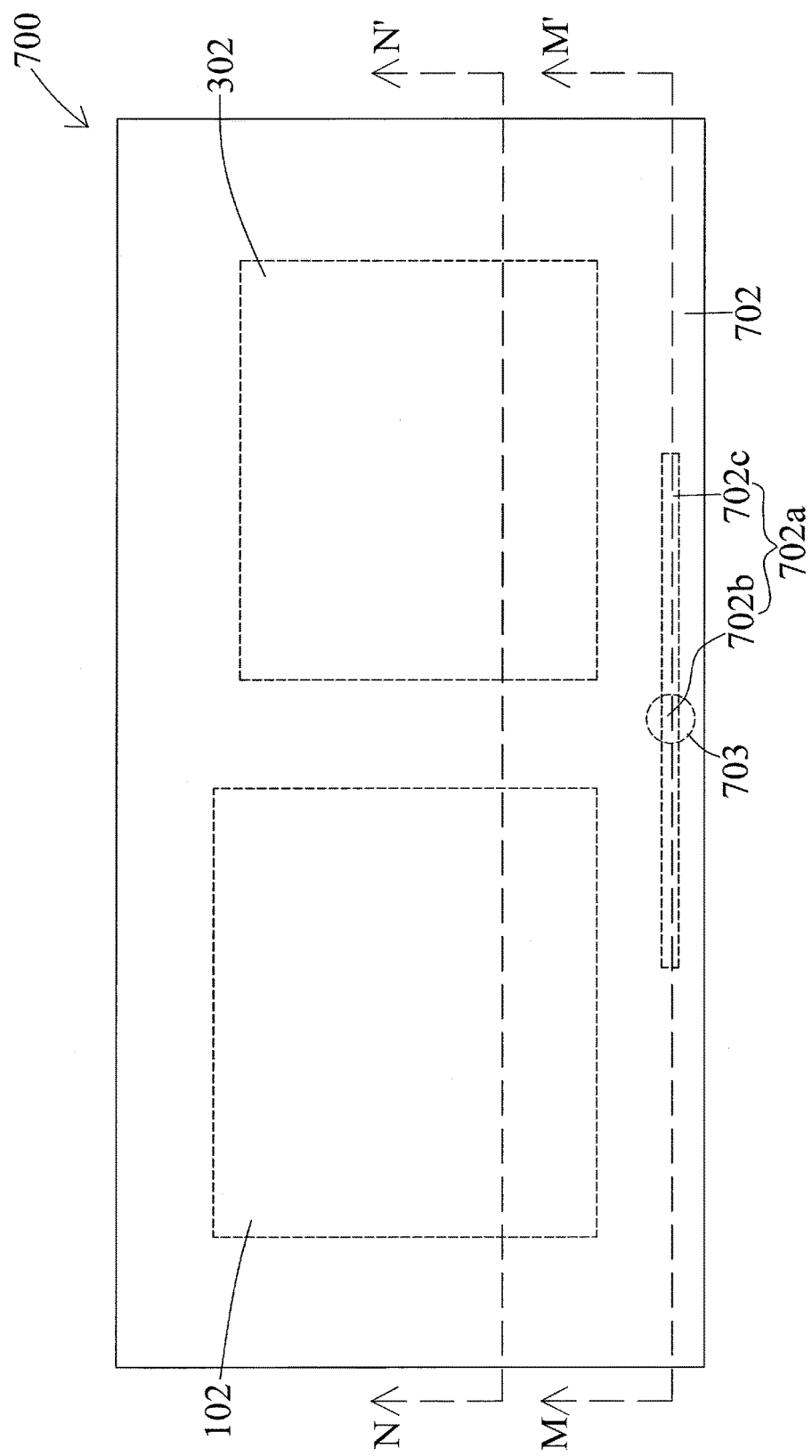
Figure 36N:
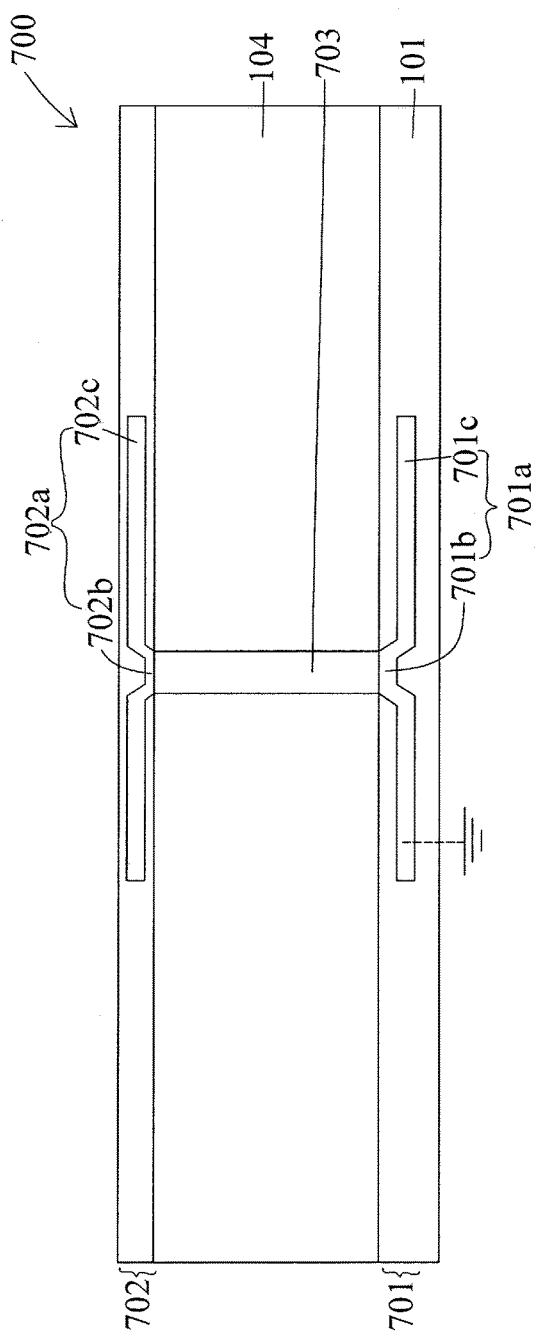
Figure 36O:
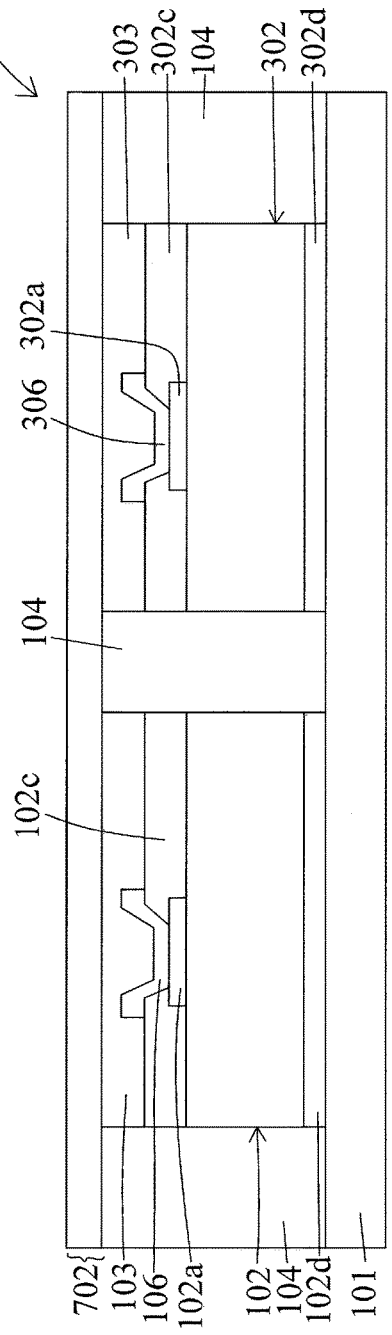

In operation 4007, a second RDL 702 is formed as shown in FIGS. 36M-36O. FIG. 36N is a schematic cross sectional view of FIG. 36M along MM', and FIG. 36O is a schematic cross sectional view of FIG. 36M along NN'. In some embodiments, the second RDL 702 is formed over the molding 104, the first die 102 and the second die 302. In some embodiments, the second RDL 702 includes a second interconnect structure 702a and a dielectric layer surrounding the second interconnect structure 702a. In some embodiments, the second interconnect structure 702a includes a via portion 702b and a land portion 702c coupled with the via portion 702b. In some embodiments, the land portion 702c is extended along the periphery of the substrate 101 or a semiconductor structure 700. In some embodiments, the via portion 702b is extended through the dielectric layer of the second RDL 702 and contacts with the through via 703. As such, the first interconnect structure 701a of the first RDL 701 is electrically connected with the second interconnect structure 702a of the second RDL 702 by the through via 703.

In operation 4008, the first RDL 701 is configured for grounding or is connectable to ground as shown in FIGS. 36M-36O. In some embodiments, the first interconnect structure 701a is electrically grounded or electrically connected to ground. In some embodiments, the through via 703 and the second interconnect structure 702a are electrically connected with the first interconnect structure 701a and thus are also electrically grounded when the first interconnect structure 701a is electrically grounded or is connected to ground. The first interconnect structure 701a of the first RDL 701, the through via 703 and the second interconnect structure 702b of the second RDL 702 are in cooperation to electrically isolate the first die 102 from the second die 302.

An electrical or electromagnetic interference between the first die 102 and the second die 302 could be minimized or prevented.

Figure 37:
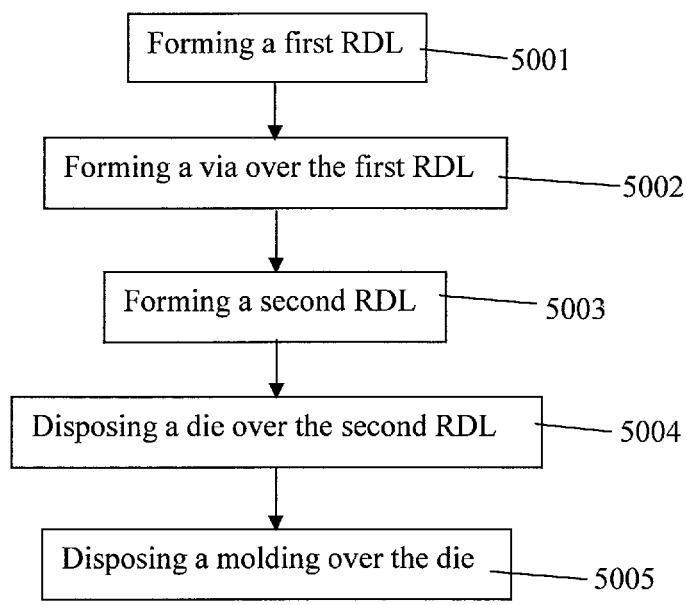
FIG. 37 is a flow diagram of a method of manufacturing a semiconductor structure in accordance with some embodiments of the present disclosure.

In the present disclosure, a method of manufacturing a semiconductor structure (800 or 900) is also disclosed. In some embodiments, a semiconductor structure (800 or 900) is formed by a method 5000. FIG. 37 is an embodiment of the method 5000 of manufacturing the semiconductor structure (800 or 900). The method 5000 includes a number of operations (5001, 5002, 5003, 5004, 5005, 5006, 5007 and 5008). The method 5000 includes a number of operations and the description and illustration are not deemed as a limitation as the sequence of the operations.

In operation 5001, a first RDL 801 is formed as shown in FIGS. 38A-38C. FIG. 38B is a schematic cross sectional view of FIG. 38A along QQ', and FIG. 38C is a schematic cross sectional view of FIG. 38A along RR'. In some embodiments, the first RDL 801 includes a first interconnect structure 801a and a first dielectric layer 801b. In some embodiments, the first interconnect structure 801a is surrounded by the first dielectric layer 801b. In some embodiments, the first interconnect structure 801 includes a via portion 801c and a land portion 801d coupled with the via portion 801c. In some embodiments, the via portion 801c extends from the land portion 801d through the first dielectric layer 801b. In some embodiments, the land portion 801d extends within the first dielectric layer 801b. In some embodiments, the first interconnect structure 801a is in a closed loop shape.

Figure 38D:
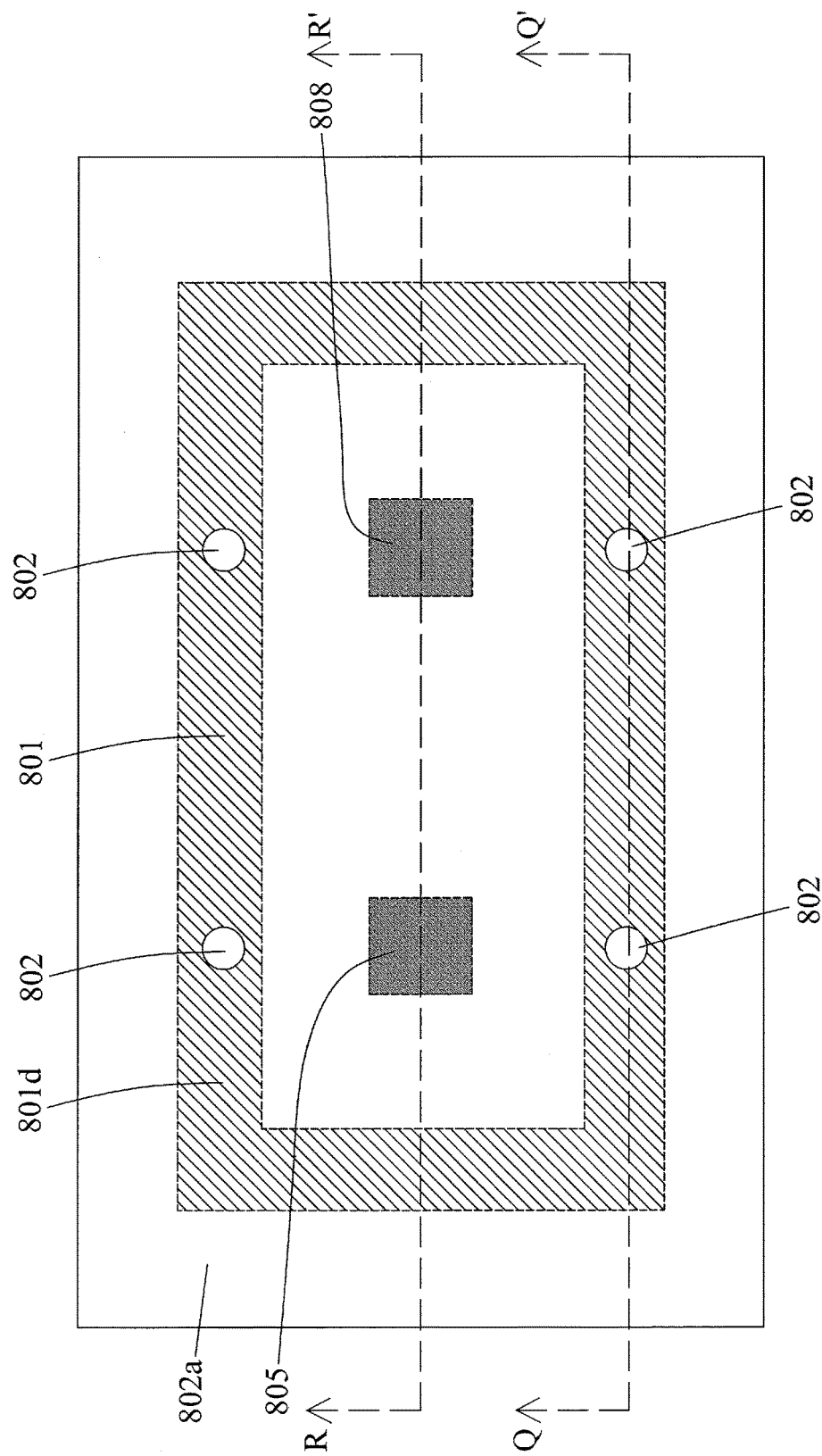
FIGS. 38A-38O are schematic views of manufacturing a semiconductor structure by a method of FIG. 37 in accordance with some embodiments of the present disclosure.
Figure 38E:
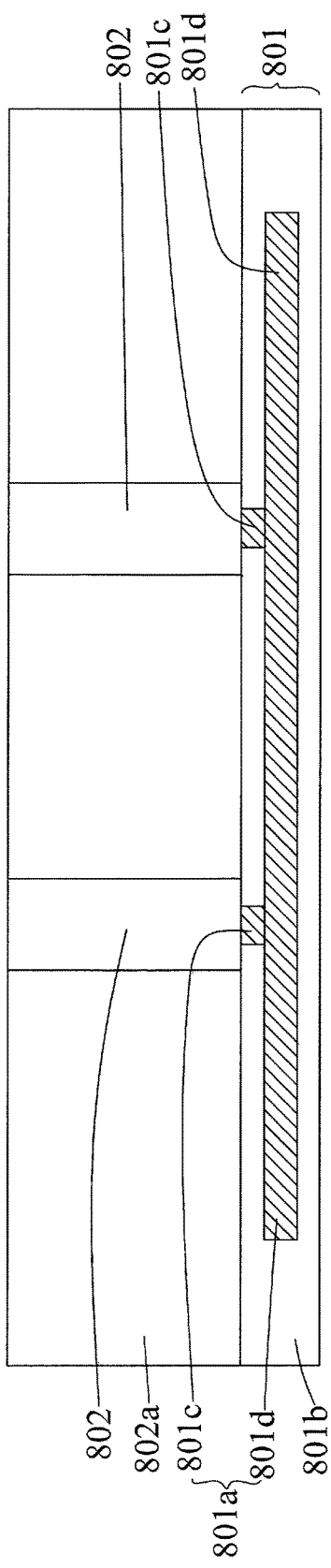
Figure 38F:
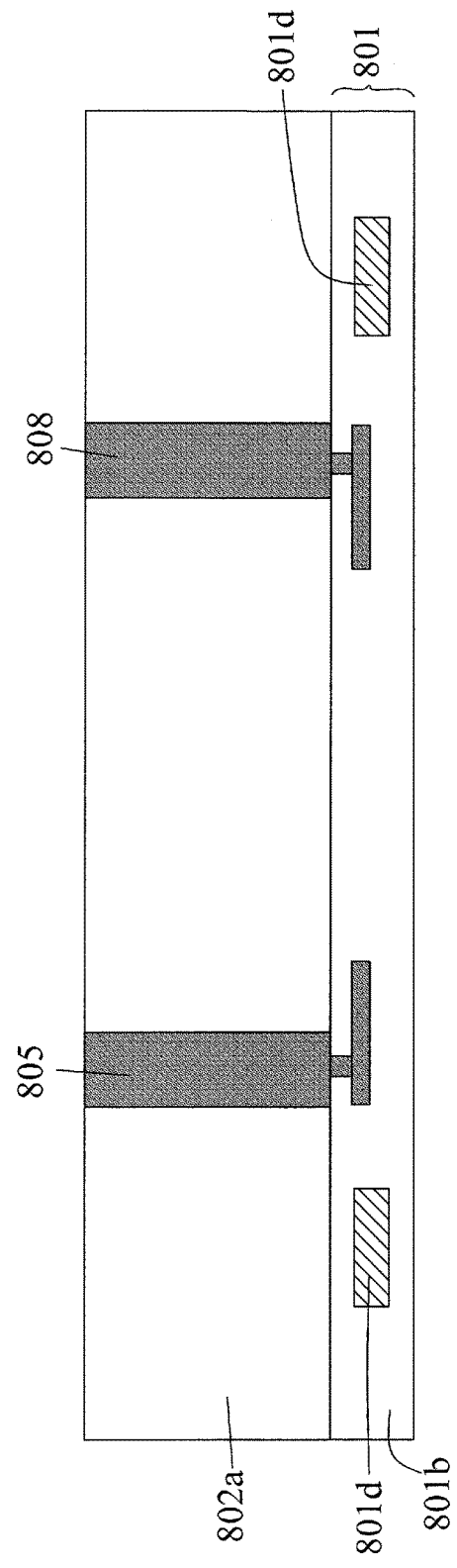

In operation 5002, a via 802 is formed over the first RDL 801 as shown in FIGS. 38D-38F. FIG. 38E is a schematic cross sectional view of FIG. 38D along QQ', and FIG. 38F is a schematic cross sectional view of FIG. 38D along RR'. In some embodiments, the via 802 is disposed over, extended from and electrically connected with the via portion 801c of the first RDL 801. In some embodiments, the via 802 extends through a third dielectric layer 802a disposed over the first RDL 801. In some embodiments, the via 802 electrically connects with the first interconnect structure 801a of the first RDL 801 and extends through the third dielectric layer 802a. In some embodiments, the via 802 is formed by removing a portion of the third dielectric layer 802a to form an opening and filling a conductive material within the opening In some embodiments, a portion of a source 805 and a portion of a component 808 are formed through the third dielectric layer 802a and extended from the first RDL 801.

Figure 38G:
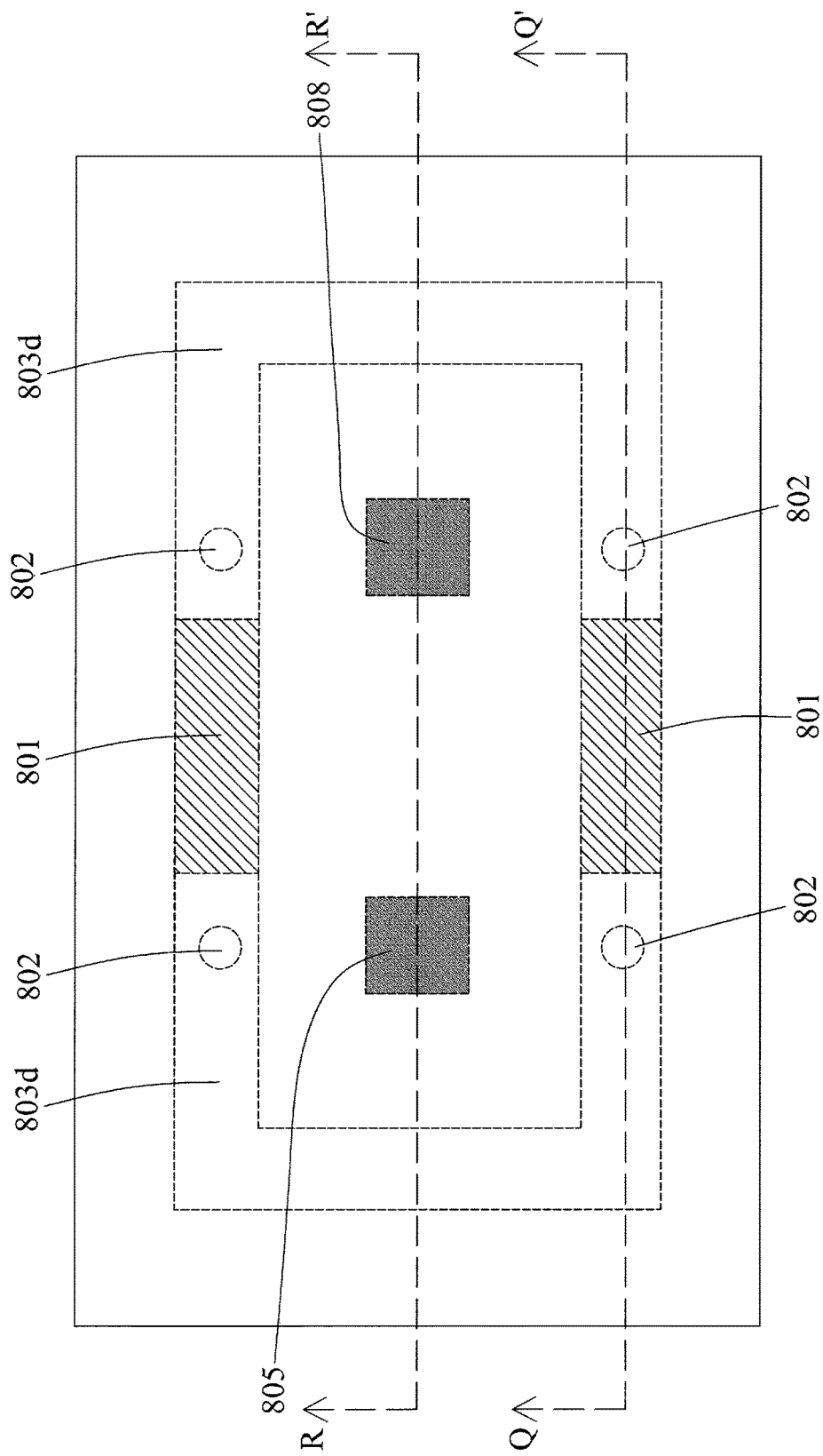
Figure 38H:
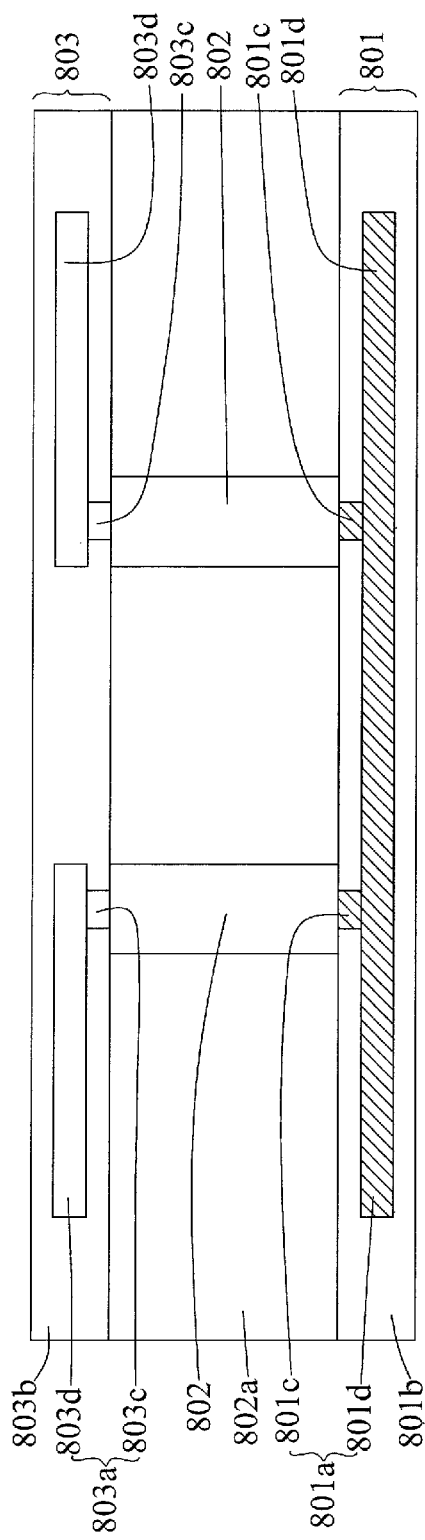
Figure 38I:
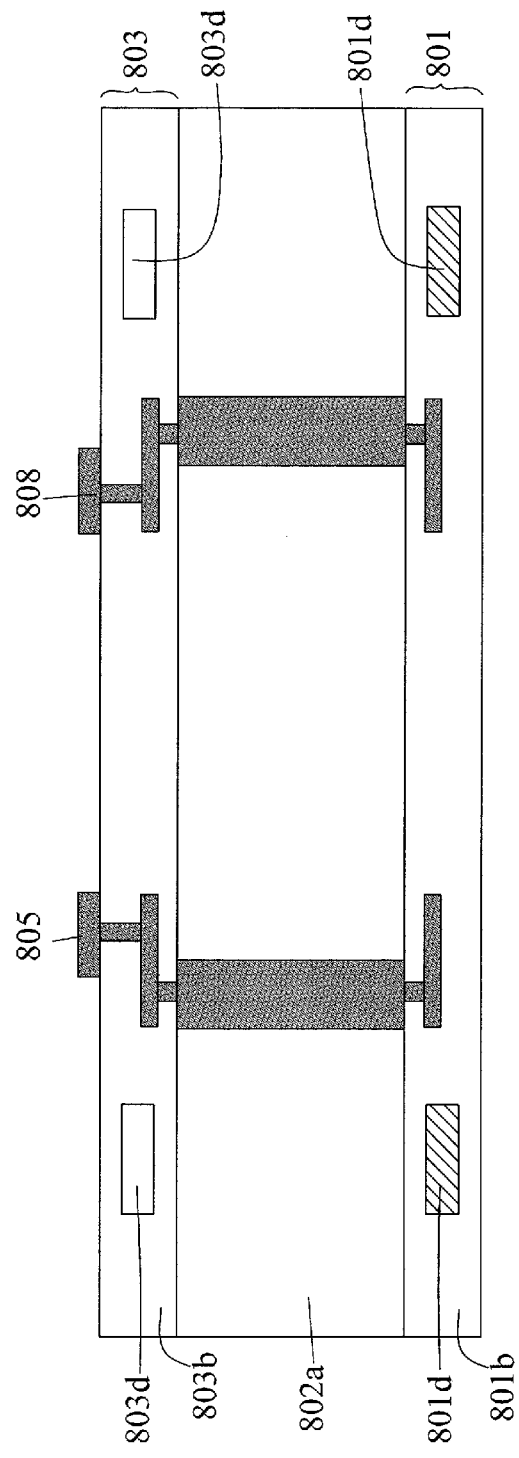

In operation 5003, a second RDL 803 is formed as shown in FIGS. 38G-38I. FIG. 38H is a schematic cross sectional view of FIG. 38G along QQ', and FIG. 38I is a schematic cross sectional view of FIG. 38G along RR'. In some embodiments, the second RDL 803 includes a second interconnect structure 803a and a second dielectric layer 803b. In some embodiments, the second interconnect structure 803a is surrounded by the second dielectric layer 803b. In some embodiments, the second dielectric layer 803b is disposed over the third dielectric layer 802a and the via 802. In some embodiments, the second interconnect structure 803 includes a via portion 803c and a land portion 803d coupled with the via portion 803c. In some embodiments, the via portion 803c extends from the land portion 803d through the second dielectric layer 803b. In some embodiments, the land portion 803d extends within the second dielectric layer 803b. In some embodiments, the second interconnect structure 803a is in a C shape or a flipped C shape. In some embodiments, the first interconnect structure 801a and the second interconnect structure 803a are electrically connected by the via 802. In some embodiments, a portion of the source 805 and a portion of the component 808 are formed through the second dielectric layer 803b and extended from the third dielectric layer 802a.

Figure 38J:
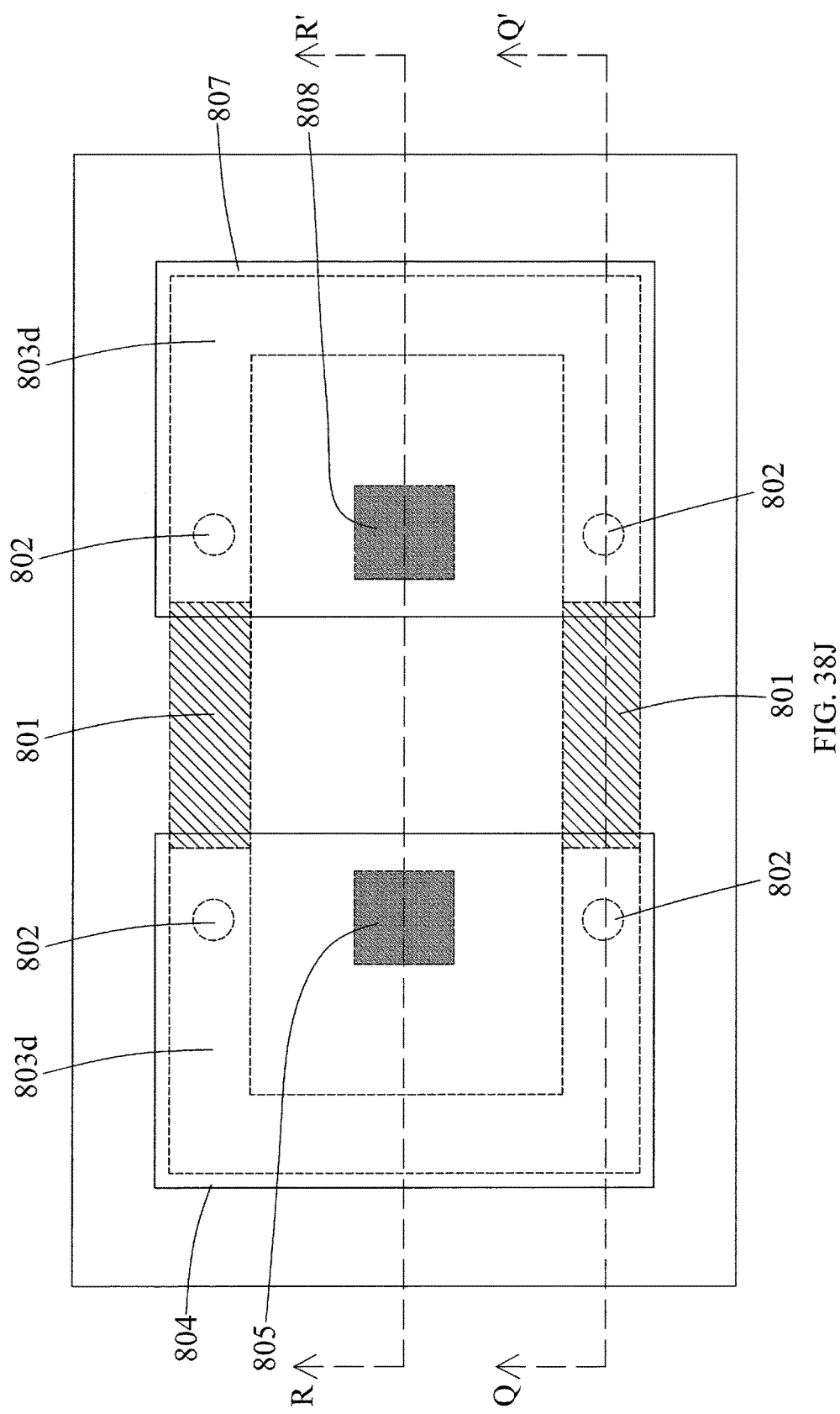
Figure 38K:
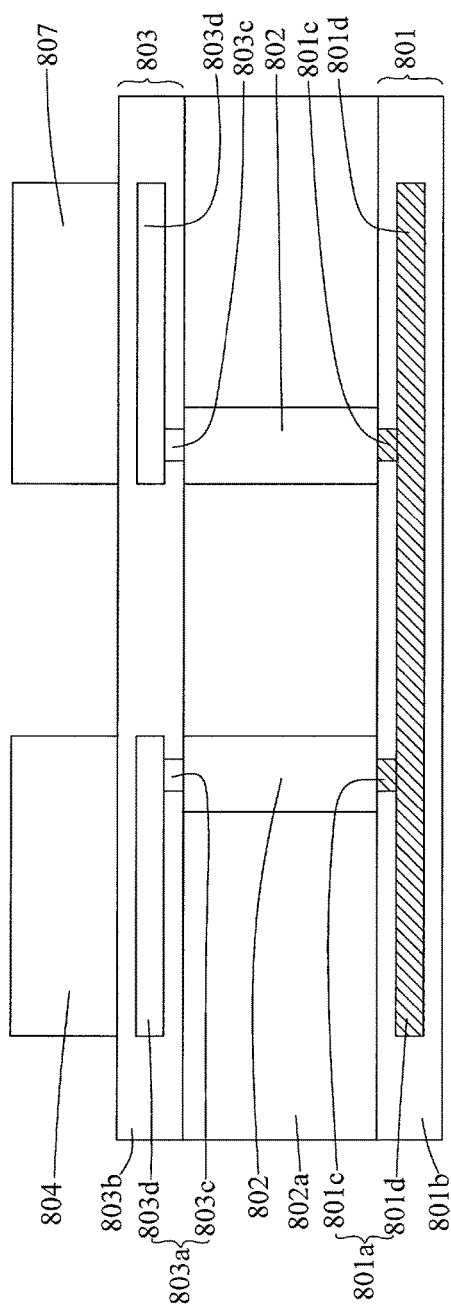
Figure 38L:
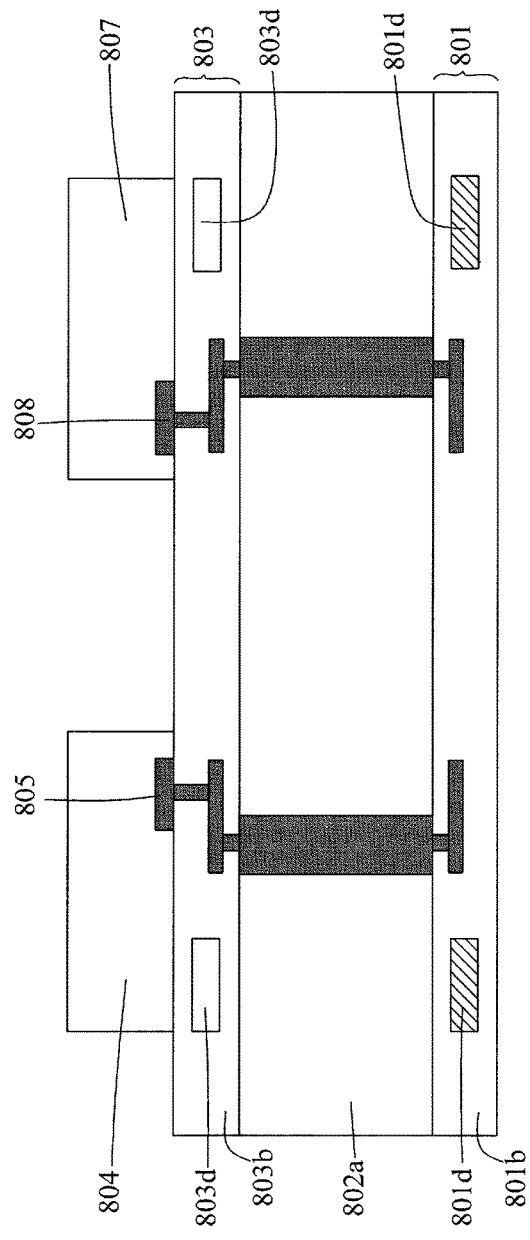

In operation 5004, a die (a first die 804 or a second die 807) is disposed over the second RDL 803 as shown in FIGS. 38J-38L. FIG. 38K is a schematic cross sectional view of FIG. 38J along QQ', and FIG. 38L is a schematic cross sectional view of FIG. 38J along RR'. In some embodiments, the first die 804 is disposed over the source 805. In some embodiments, the second die 807 is disposed over the component 808. In some embodiments, the first die 804 and the second die 807 are disposed over the second RDL 803 simultaneously or one by one. In some embodiments, the first die 804 is electrically connected to the source 805. In some embodiments, the second die 807 is electrically connected to the component 808. In some embodiments, the first interconnect structure 801a and the second interconnect structure 803a are configured to absorb an electromagnetic radiation of a predetermined frequency emitted from the source 805 or the component 808, such that the source 805 or the component 808 would not electrically interfere with each other.

Figure 38M:
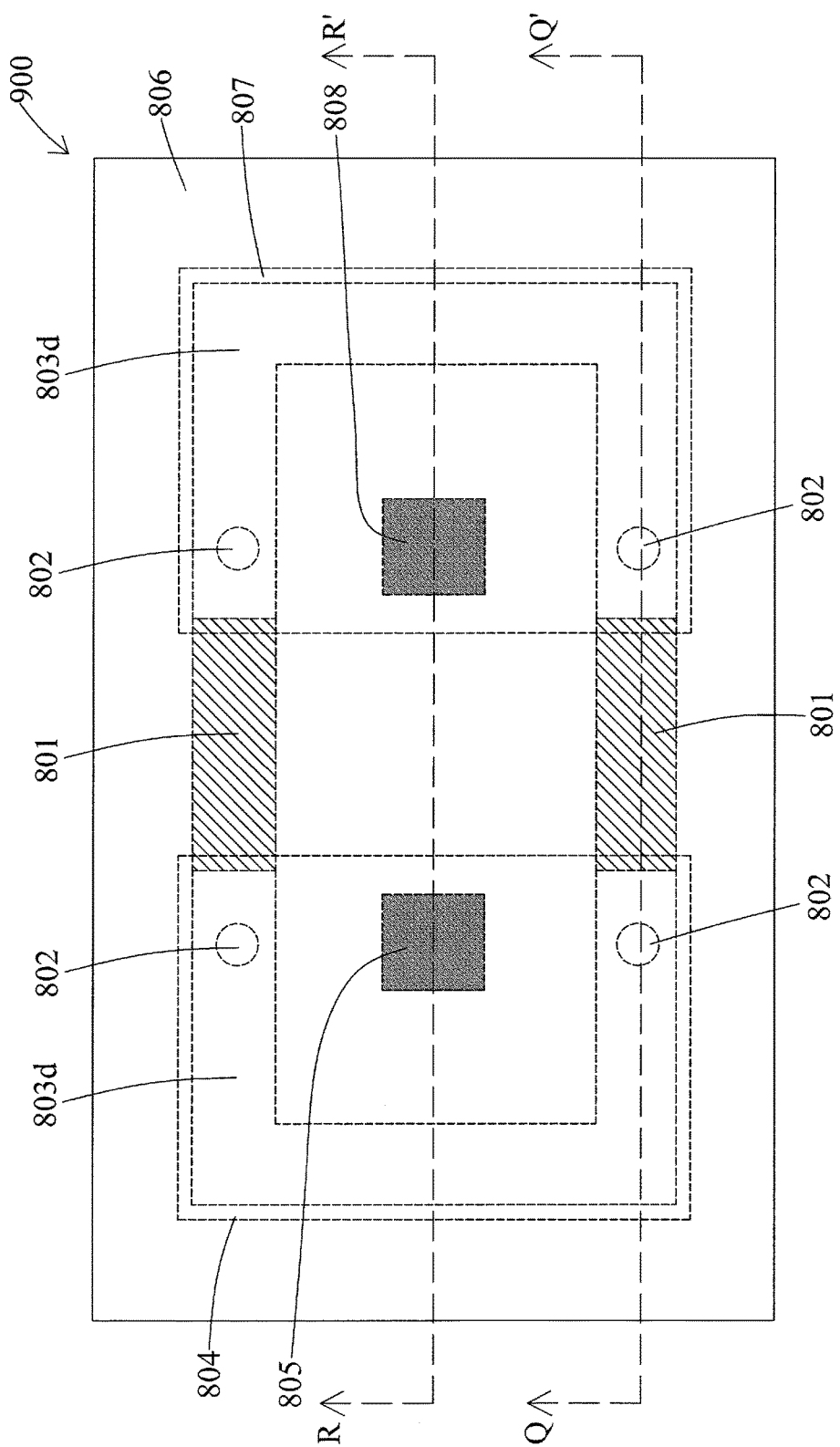
Figure 38N:
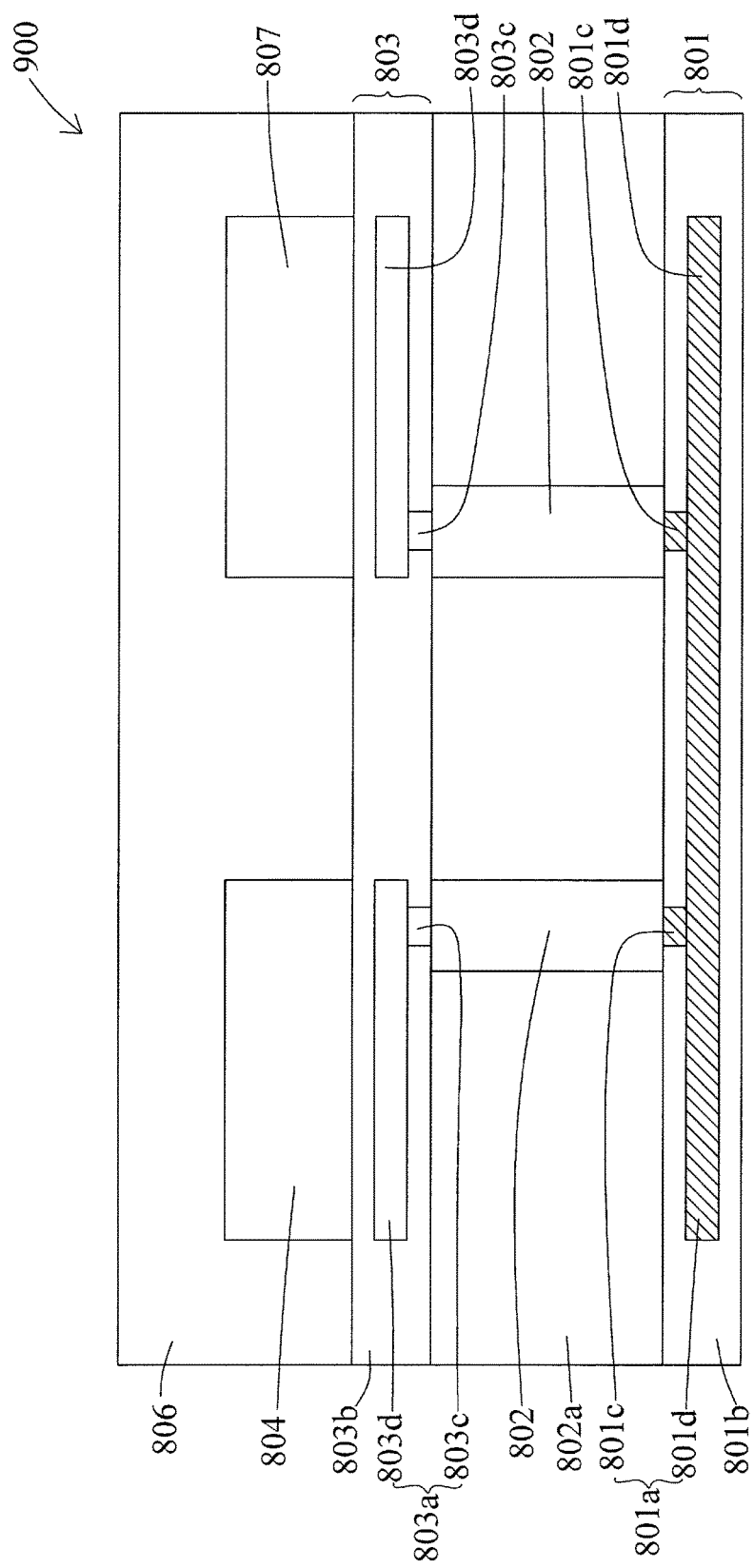
Figure 38O:
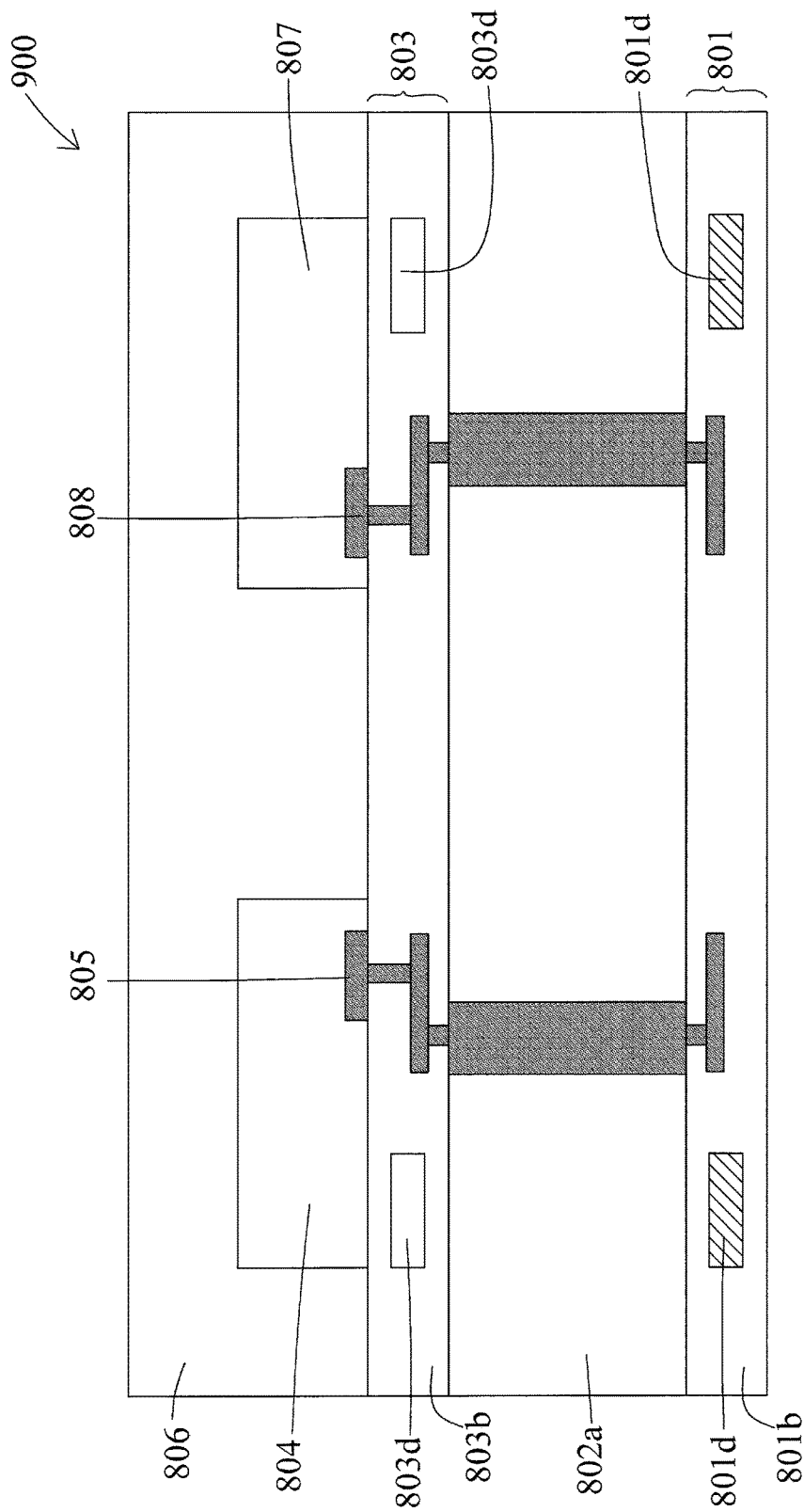

In operation 5005, a molding 806 is disposed over the die (the first die 804 or the second die 807) as shown in FIGS. 38M-38O. FIG. 38N is a schematic cross sectional view of FIG. 38M along QQ', and FIG. 38O is a schematic cross sectional view of FIG. 38M along RR'. In some embodiments, the molding 806 is disposed over the second RDL 803 and covers the die (the first die 804 or the second die 807).

In the present disclosure, an improved semiconductor structure is disclosed. The semiconductor structure includes a die at least partially enclosed by a seal ring or a redistribution layer (RDL). The seal ring or the RDL is configured for grounding or is connectable to ground in order to isolate the die from other components. Further, the semiconductor structure includes a source emitting an electromagnetic radiation such as a radio wave in a radio frequency (RF), and a RDL configured to absorb the electromagnetic radiation from the source. The RDL can be configured to selectively absorb the electromagnetic radiation in a predetermined radio frequency. The RDL could isolate the source from other components and reduce electromagnetic interference between the electromagnetic radiation from the source and electromagnetic radiation from other components.

In some embodiments, a semiconductor structure includes a substrate, a die disposed over the substrate, and including a die pad disposed over the die and a seal ring disposed at a periphery of the die and electrically connected with the die pad, a polymeric layer disposed over the die, a via extending through the polymeric layer and electrically connected with the die pad, and a molding disposed over the substrate and surrounding the die and the polymeric layer, wherein the seal ring is configured for grounding.

In some embodiments, the seal ring extends along the periphery of the die to at least partially enclose a central portion of the die. In some embodiments, the seal ring is connectable to ground. In some embodiments, the via is disposed over the die pad and surrounded by the polymeric layer. In some embodiments, the semiconductor structure further includes a redistribution layer (RDL) disposed over the die and the molding, and including an interconnect structure electrically connecting with the via, the die pad and the seal ring. In some embodiments, the interconnect structure of the RDL is configured for grounding or is connectable to ground.

In some embodiments, a semiconductor structure includes a first redistribution layer (RDL) including a first interconnect structure, a dielectric layer disposed over the first RDL, a via electrically connected with the first interconnect structure and extending through the dielectric layer, a second redistribution layer (RDL) disposed over the dielectric layer and the via, and including a second interconnect structure electrically connected with the first interconnect structure by the via, a die disposed over the second RDL, and a source electrically connected with the die, configured to emit an electromagnetic radiation, and disposed between the die and the first RDL, wherein the first interconnect structure of the first RDL and the second interconnect structure of the second RDL are configured to absorb the electromagnetic radiation of a predetermined frequency.

In some embodiments, the first interconnect structure surrounds a first portion of the source, or the second interconnect structure partially surrounds a second portion of the source. In some embodiments, the via extends between the first RDL and the second RDL and electrically connects the first interconnect structure with the second interconnect structure. In some embodiments, the second interconnect structure is in a C shape, or the first interconnect structure is in an annular or a closed loop shape. In some embodiments, the source extends from the die to the first RDL or the second RDL. In some embodiments, the first interconnect structure and the second interconnect structure are aligned and disposed opposite to each other. In some embodiments, the first interconnect structure and the second interconnect structure are configured in substantially same dimension and shape. In some embodiments, the semiconductor structure further includes a molding disposed over the second RDL and covering the die.

In some embodiments, a method of manufacturing a semiconductor structure includes receiving a substrate, disposing a die over the substrate, wherein the die includes a die pad disposed over the substrate and a seal ring formed at a periphery of the die and electrically connected with the die pad, forming a via over the die pad of the die, disposing a polymeric layer over the die, disposing a molding over the substrate and surrounding the die and the polymeric layer, wherein the seal ring is configured for grounding.

In some embodiments, the seal ring is electrically connected with the via through the die pad. In some embodiments, the via and the die pad are electrically grounded by grounding the seal ring. In some embodiments, forming the via includes disposing a conductive material over the die pad. In some embodiments, the method further includes forming a redistribution layer (RDL) over the polymeric layer, wherein the RDL includes an interconnect structure disposed within the RDL, electrically connected with the via, the die pad and the seal ring, and configured for grounding. In some embodiments, the interconnect structure of the RDL extends along the periphery of the die or extends over a central portion of the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a die disposed over the substrate, and including
   a die pad disposed over the die and
   a seal ring embeddedly arranged within the die at an upper periphery region thereof and electrically connected with the die pad;
a polymeric layer disposed over the die;
a via extending through the polymeric layer and electrically connected with the die pad; and
a molding disposed over the substrate and surrounding the die and the polymeric layer,
wherein the seal ring is configured for grounding.

2. The semiconductor structure of claim 1, wherein the seal ring extends along the periphery of the die to at least partially enclose a central portion of the die.

3. The semiconductor structure of claim 1, wherein the seal ring is connectable to ground.

4. The semiconductor structure of claim 1, wherein the via is disposed over the die pad and surrounded by the polymeric layer.

5. The semiconductor structure of claim 1, further comprising a redistribution layer (RDL) disposed over the die and the molding and including an interconnect structure electrically connecting with the via, the die pad and the seal ring.

6. The semiconductor structure of claim 5, wherein the interconnect structure of the RDL is configured for grounding or is connectable to ground.

7. A semiconductor structure, comprising:
a first redistribution layer (RDL) including a first interconnect structure;
a dielectric layer disposed over the first RDL;
a via electrically connected with the first interconnect structure and extending through the dielectric layer;
a second redistribution layer (RDL) disposed over the dielectric layer and the via, and including a second interconnect structure electrically connected with the first interconnect structure by the via;
a die disposed over the second RDL; and
a source electrically connected with the die, configured to emit an electromagnetic radiation, at least partially disposed within the die and disposed between the die and the first RDL,
wherein the first interconnect structure of the first RDL and the second interconnect structure of the second RDL are configured to absorb the electromagnetic radiation of a predetermined frequency.

8. The semiconductor structure of claim 7, wherein the first interconnect structure surrounds a first portion of the source, or the second interconnect structure partially surrounds a second portion of the source.

9. The semiconductor structure of claim 7, wherein the via extends between the first RDL and the second RDL and electrically connects the first interconnect structure with the second interconnect structure.

10. The semiconductor structure of claim 7, wherein the second interconnect structure is in a C shape, or the first interconnect structure is in an annular or a closed loop shape.

11. The semiconductor structure of claim 7, wherein the source extends from the die to the first RDL or the second RDL.

12. The semiconductor structure of claim 7, wherein the first interconnect structure and the second interconnect structure are aligned and disposed opposite to each other.

13. The semiconductor structure of claim 7, wherein the first interconnect structure and the second interconnect structure are configured in substantially same dimension and shape.

14. The semiconductor structure of claim 7, further comprising a molding disposed over the second RDL and covering the die.

15. A method of manufacturing a semiconductor structure, comprising:
receiving a substrate;
disposing a die over the substrate, wherein the die includes a die pad disposed over the substrate and a seal ring embeddedly arranged within the die at an upper periphery region thereof and electrically connected with the die pad;
forming a via over the die pad of the die;
disposing a polymeric layer over the die;
disposing a molding over the substrate and surrounding the die and the polymeric layer,
wherein the seal ring is configured for grounding.

16. The method of claim 15, wherein the seal ring is electrically connected with the via through the die pad.

17. The method of claim 15, wherein the via and the die pad are electrically grounded by grounding the seal ring.

18. The method of claim 15, wherein forming the via includes disposing a conductive material over the die pad.

19. The method of claim 15, further comprising:
forming a redistribution layer (RDL) over the polymeric layer, wherein the RDL includes an interconnect structure disposed within the RDL, electrically connected with the via, the die pad and the seal ring, and configured for grounding.

20. The method of claim 19, wherein the interconnect structure of the RDL extends along the periphery of the die or extends over a central portion of the die.

* * * * *